US009466615B2

(12) United States Patent
Miyairi et al.

(10) Patent No.: US 9,466,615 B2
(45) Date of Patent: Oct. 11, 2016

(54) SEMICONDUCTOR DEVICE

(71) Applicant: Semiconductor Energy Laboratory Co., Ltd., Atsugi-shi, Kanagawa-ken (JP)

(72) Inventors: Hidekazu Miyairi, Kanagawa (JP); Shinya Sasagawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/578,683

(22) Filed: Dec. 22, 2014

(65) Prior Publication Data

US 2015/0187814 A1     Jul. 2, 2015

(30) Foreign Application Priority Data

Dec. 26, 2013    (JP) ................. 2013-269701

(51) Int. Cl.
| | | |
|---|---|---|
| *H01L 27/12* | (2006.01) | |
| *H01L 27/088* | (2006.01) | |
| *H01L 29/26* | (2006.01) | |

(Continued)

(52) U.S. Cl.
CPC ..... *H01L 27/1207* (2013.01); *H01L 27/10811* (2013.01); *H01L 27/10855* (2013.01); *H01L 27/10873* (2013.01); *H01L 29/16* (2013.01); *H01L 29/26* (2013.01);

(Continued)

(58) Field of Classification Search
CPC ................... H01L 27/1207; H01L 27/10802; H01L 27/10855; H01L 27/10811; H01L 27/10873; H01L 29/16; H01L 29/26; H01L 29/7869; H01L 23/3157

USPC ........... 257/43, 57, 66, 67, 72, 532, E27.01, 257/E27.026, E27.062, E29.296, E23.01, 257/E21.476, E21.614; 324/110; 365/203; 438/104, 149, 151, 199
See application file for complete search history.

(56) References Cited

U.S. PATENT DOCUMENTS

| 5,731,856 A | 3/1998 | Kim et al. |
|---|---|---|
| 5,744,864 A | 4/1998 | Cillessen et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Dao H Nguyen
(74) *Attorney, Agent, or Firm* — Fish & Richardson P.C.

(57) ABSTRACT

A semiconductor device that is suitable for miniaturization is provided. A semiconductor device including a first element, a first insulator over the first element, a first barrier film over the first insulator, a first conductor over the first barrier film, a second barrier film over the first conductor, a second insulator over the second barrier film, and a semiconductor over the second insulator is provided. The first conductor is surrounded by the first barrier film and the second barrier film.

18 Claims, 37 Drawing Sheets

(51) Int. Cl.
*H01L 29/786* (2006.01)
*H01L 29/16* (2006.01)
*H01L 27/108* (2006.01)
*H01L 23/31* (2006.01)

(52) U.S. Cl.
CPC ...... *H01L 29/7869* (2013.01); *H01L 23/3157* (2013.01); *H01L 2924/0002* (2013.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,741,644 | B2 * | 6/2010 | Lyu et al. ................... 257/67 |
| 7,795,651 | B2 * | 9/2010 | Jeong et al. ................ 257/278 |
| 8,941,113 | B2 * | 1/2015 | Takeuchi ................... 257/57 |
| 8,946,702 | B2 | 2/2015 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0237875 | A1 | 10/2008 | Yamazaki et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0089417 | A1 | 4/2011 | Yamazaki et al. |
| 2011/0101351 | A1 | 5/2011 | Yamazaki |
| 2011/0114945 | A1 | 5/2011 | Yamazaki et al. |
| 2011/0176355 | A1 | 7/2011 | Furutani et al. |
| 2012/0292615 | A1 | 11/2012 | Saito |
| 2013/0256665 | A1 | 10/2013 | Takeuchi et al. |
| 2013/0270552 | A1 | 10/2013 | Yamazaki et al. |
| 2013/0270563 | A1 | 10/2013 | Yamazaki |
| 2013/0277676 | A1 * | 10/2013 | Yamazaki ................... 257/57 |
| 2013/0299818 | A1 * | 11/2013 | Tanaka ...................... 257/43 |
| 2013/0314074 | A1 * | 11/2013 | Takahashi et al. .......... 324/110 |
| 2014/0326992 | A1 | 11/2014 | Hongo et al. |
| 2014/0332800 | A1 | 11/2014 | Hanaoka |
| 2015/0108470 | A1 | 4/2015 | Yamazaki et al. |
| 2015/0187775 | A1 * | 7/2015 | Yamamoto et al. .......... 257/43 |
| 2015/0348997 | A1 | 12/2015 | Sasagawa et al. |
| 2015/0349127 | A1 | 12/2015 | Kurata et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2009-135350 A | 6/2009 |
| JP | 2012-256877 | 12/2012 |

(56) References Cited

FOREIGN PATENT DOCUMENTS

| JP | 2013-229587 A | 11/2013 |
|---|---|---|
| JP | 2013-229588 A | 11/2013 |
| JP | 2013-236068 | 11/2013 |
| JP | 2013-236072 A | 11/2013 |
| TW | 201349508 | 12/2013 |
| WO | WO-2004/114391 | 12/2004 |
| WO | WO-2013/154195 | 10/2013 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs with a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-378.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2014/066898) Dated Apr. 7, 2015.

Written Opinion (Application No. PCT/IB2014/066898) Dated Apr. 7, 2015.

* cited by examiner

FIG. 15A
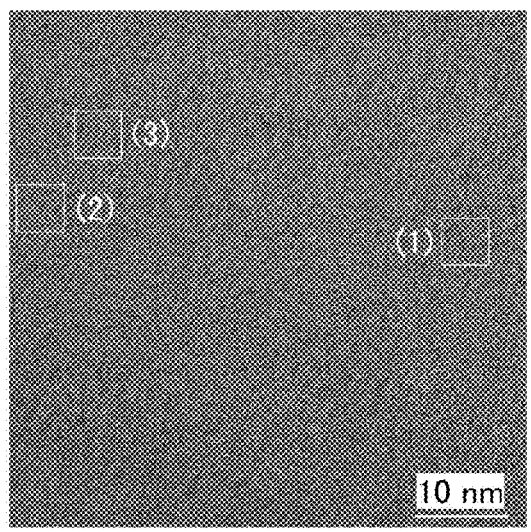
FIG. 15B  FIG. 15C  FIG. 15D
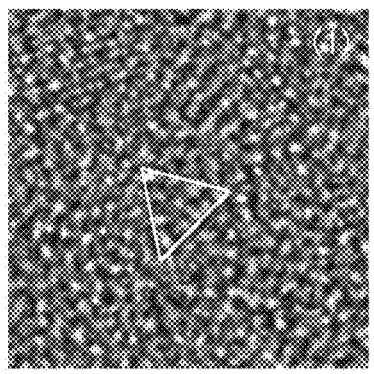 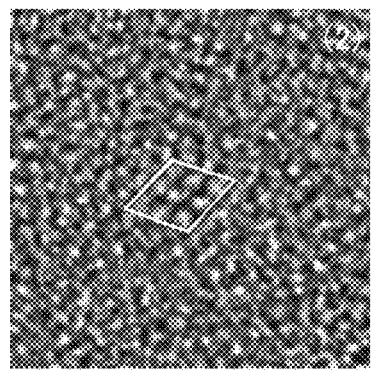 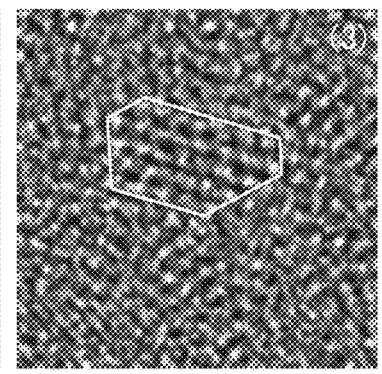

FIG. 16A Out-of-plane method CAAC-OS
FIG. 16B In-plane method φ scan CAAC-OS
FIG. 16C In-plane method φ scan Single crystal OS
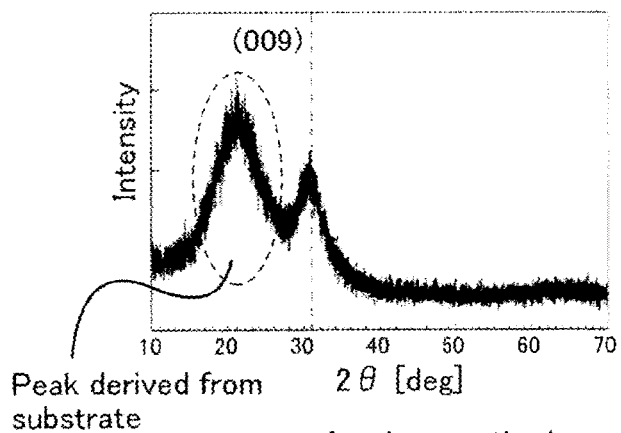
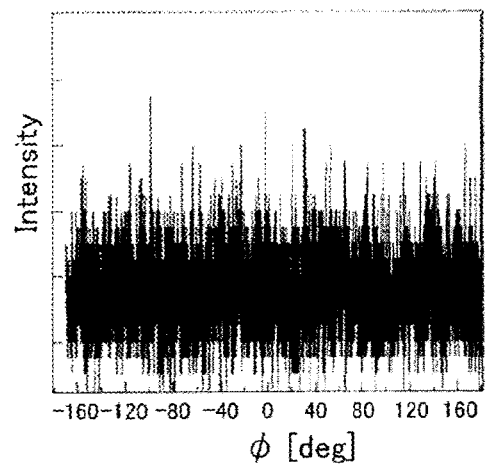
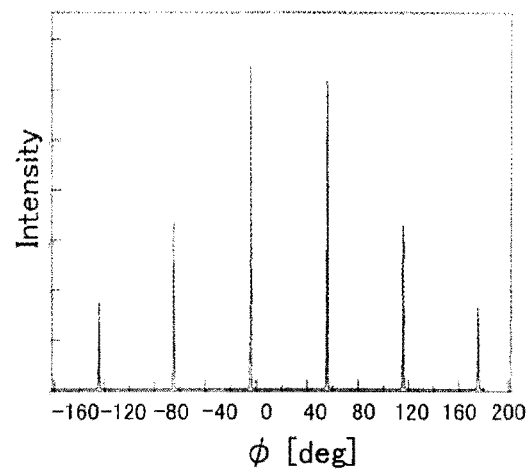

An electron beam incident in a direction parallel to sample surface

An electron beam incident in a direction perpendicular to sample surface

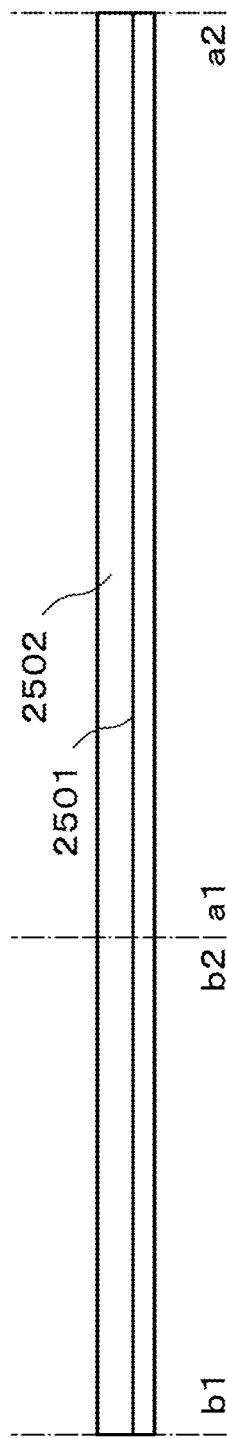
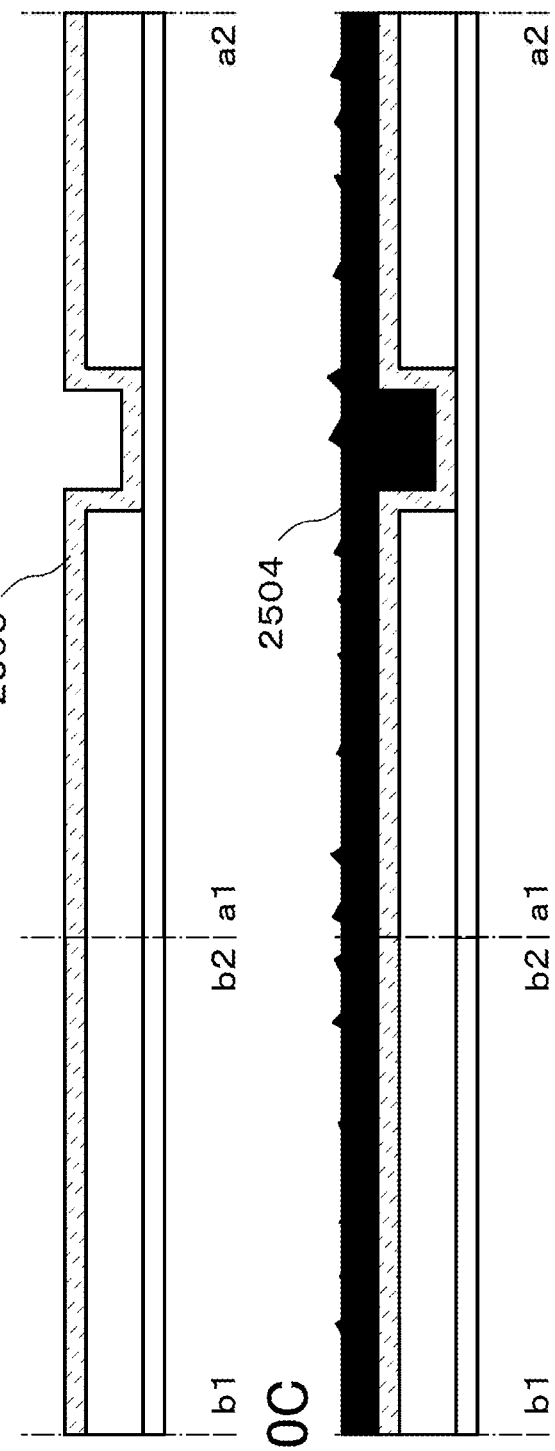

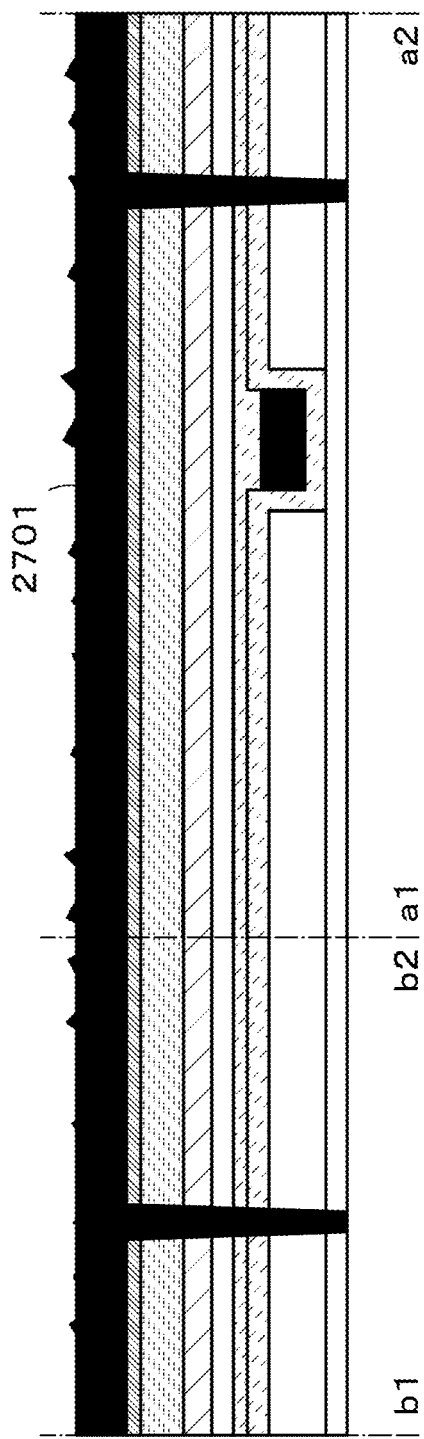
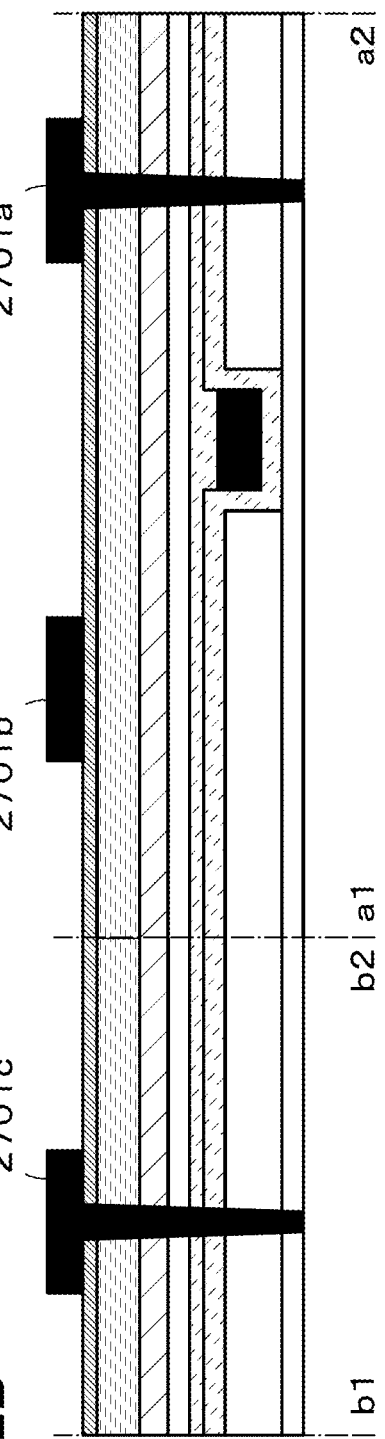
FIG. 32A
FIG. 32B

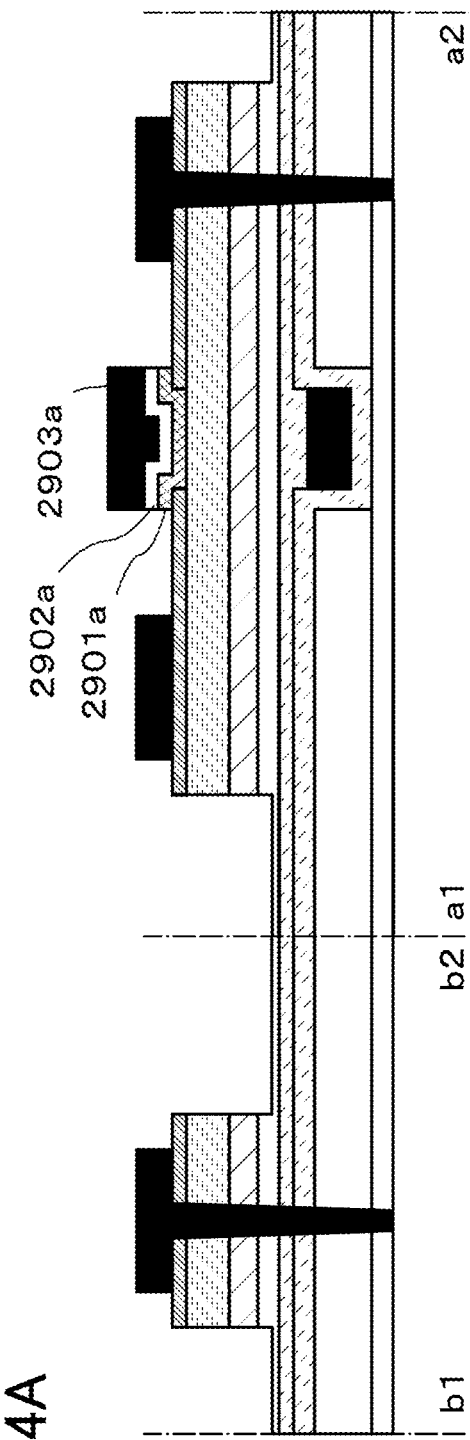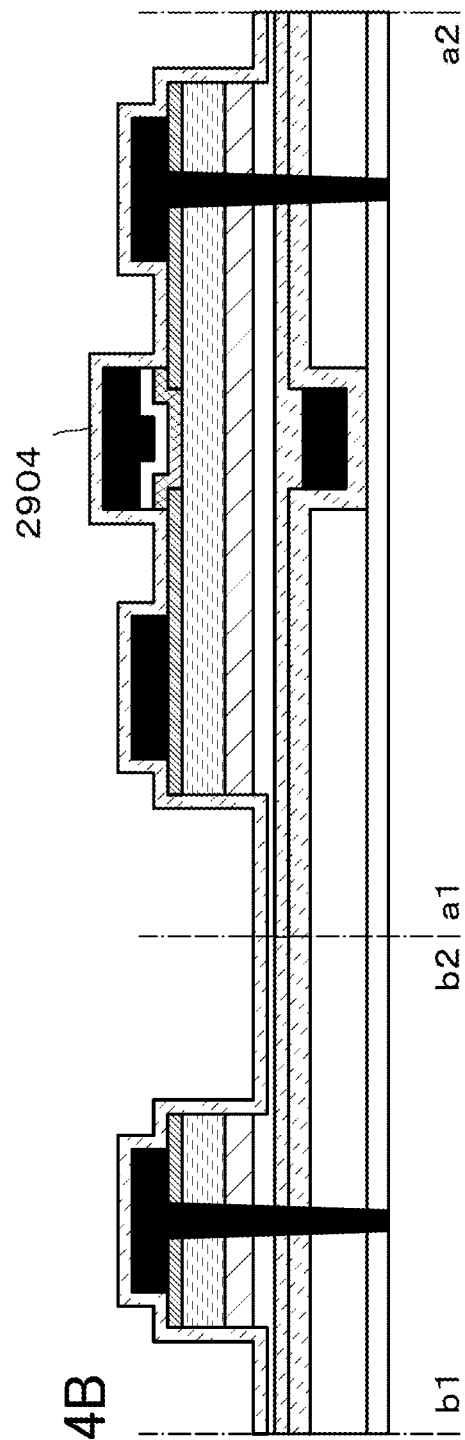

SEMICONDUCTOR DEVICE

TECHNICAL FIELD

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A transistor and a semiconductor circuit are embodiments of semiconductor devices. An arithmetic device, a memory device, an imaging device, an electro-optical device, a power generation device (e.g., a thin film solar cell and an organic thin film solar cell), and an electronic appliance each may include a semiconductor device.

BACKGROUND ART

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, a technique for formation of a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic appliances.

REFERENCE

Patent Document

[Patent Document 1] Japanese Published Patent Application No. 2007-123861
[Patent Document 2] Japanese Published Patent Application No. 2007-096055

DISCLOSURE OF INVENTION

An object of one embodiment of the present invention is to provide a high-integrated semiconductor device.

An object of another embodiment of the present invention is to provide a highly reliable semiconductor device.

Another object of one embodiment of the present invention is to provide a semiconductor device with favorable electrical characteristics. Another object of the present invention is to provide a highly reliable semiconductor device. Another object is to provide a semiconductor device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems

One embodiment of the present invention is a semiconductor device including a first element, a first insulator over the first element, a first barrier film over the first insulator, a first conductor over the first barrier film, a second barrier film over the first conductor, a second insulator over the second barrier film, and a semiconductor over the second insulator. The first conductor is surrounded by the first barrier film and the second barrier film.

Another embodiment of the present invention is a semiconductor device including a first element, a first insulator over the first element, a first barrier film over the first insulator, a first conductor over the first barrier film, a second barrier film over the first conductor, a second insulator over the second barrier film, and a semiconductor over the second insulator. The first insulator includes a groove or opening, at least part of the first conductor is provided in the groove or opening, and the first conductor is surrounded by the first barrier film and the second barrier film.

Another embodiment of the present invention is a semiconductor device including a semiconductor, a first conductor over and in contact with the semiconductor, and a second conductor provided in an opening formed in the semiconductor and the first conductor.

Another embodiment of the present invention is a semiconductor device including a first element, a first insulator over the first element, a first barrier film over the first insulator, a first conductor over the first barrier film, a second barrier film over the first conductor, a second insulator over the second barrier film, a semiconductor over the second insulator, a second conductor over and in contact with the semiconductor, and a third conductor that is provided in an opening formed in the semiconductor and the second conductor and is electrically connected to the first element.

Another embodiment of the present invention is a semiconductor device including a first element, a first insulator over the first element, a first barrier film over the first insulator, a first conductor over the first barrier film, a second barrier film over the first conductor, a second insulator over the second barrier film, a semiconductor over the second insulator, a second conductor over and in contact with the semiconductor, a third insulator over the semiconductor and the second conductor, and a third conductor overlapping the semiconductor with the third insulator positioned between the third conductor and the semiconductor. The first insulator includes a groove or opening, at least part of the first conductor is provided in the groove or opening, the first conductor is surrounded by the first barrier film and the second barrier film, and a fourth conductor that is provided in an opening provided in the semiconductor and the second conductor and electrically connected to the first element is included.

Another embodiment of the present invention is a semiconductor device including a first element, a first insulator over the first element, a first barrier film over the first insulator, a first conductor over the first barrier film, a second barrier film over the first conductor, a second insulator over the second barrier film, a semiconductor over the second insulator, a second conductor over and in contact with the semiconductor, a third insulator over the semiconductor and the second conductor, a third conductor overlapping the semiconductor with the third insulator positioned between the third conductor and the semiconductor, a third barrier film over the third conductor, and a second element over the third barrier film. The first conductor is surrounded by the first barrier film and the second barrier film, and a fourth conductor that is provided in an opening provided in the semiconductor and the second conductor and electrically connected to the first element and the second element is included.

Another embodiment of the present invention is a semiconductor device including a first element, a first insulator over the first element, a first barrier film over the first insulator, a first conductor over the first barrier film, a second barrier film over the first conductor, a second insulator over the second barrier film, a semiconductor over the second insulator, a second conductor over and in contact with the semiconductor, a third insulator over the semiconductor and the second conductor, a third conductor overlapping the semiconductor with the third insulator positioned between the third conductor and the semiconductor, a third barrier film over the third conductor, and a second element over the third barrier film. The first insulator includes a groove or opening, at least part of the first conductor is provided in the groove or opening, the first conductor is surrounded by the first barrier film and the second barrier film, and a fourth conductor that is provided in an opening provided in the semiconductor and the second conductor and electrically connected to the first element and the second element is included.

Furthermore, it is preferable that the first, second, and third barrier films each include at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

As the second barrier film, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a metal nitride film (e.g., InN or ZnN), or the like can be used, and a stack formed using at least one or more of the above materials may be used.

Furthermore, it is preferable that the semiconductor device further include an insulating film including oxide between the first barrier film and the semiconductor, and that the insulating film include a region containing oxygen in excess of the stoichiometric composition.

The insulating film including oxide preferably includes a region having a hydrogen concentration of lower than $5 \times 10^{18}$ atoms/cm$^3$.

The semiconductor preferably includes a region having a hydrogen concentration of lower than $5 \times 10^{18}$ atoms/cm$^3$.

It is preferable that the second element be a transistor and the third insulator be a gate insulating film of the transistor. The gate insulating film preferably has a region with a hydrogen concentration of lower than $5 \times 10^{18}$ atoms/cm$^3$.

It is preferable that the subthreshold swing value of the transistor be greater than or equal to 60 mV/dec. and less than or equal to 100 mV/dec.

According to one embodiment of the present invention, a semiconductor device that is suitable for miniaturization can be provided.

A semiconductor device with favorable electrical characteristics can be provided. Furthermore, a highly reliable semiconductor device can be provided. A semiconductor device or the like with a novel structure can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 15A to 15D are Cs-corrected high-resolution TEM images of a plane of a CAAC-OS.

FIGS. 16A to 16C show structural analysis of a CAAC-OS and a single crystal oxide semiconductor by XRD.

FIGS. 30A to 30C illustrate an example of a method for manufacturing a semiconductor device of an embodiment.

FIGS. 32A and 32B illustrate an example of a method for manufacturing a semiconductor device of an embodiment.

FIGS. 34A and 34B illustrate an example of a method for manufacturing a semiconductor device of an embodiment.

BEST MODE FOR CARRYING OUT THE INVENTION

Figure 1:
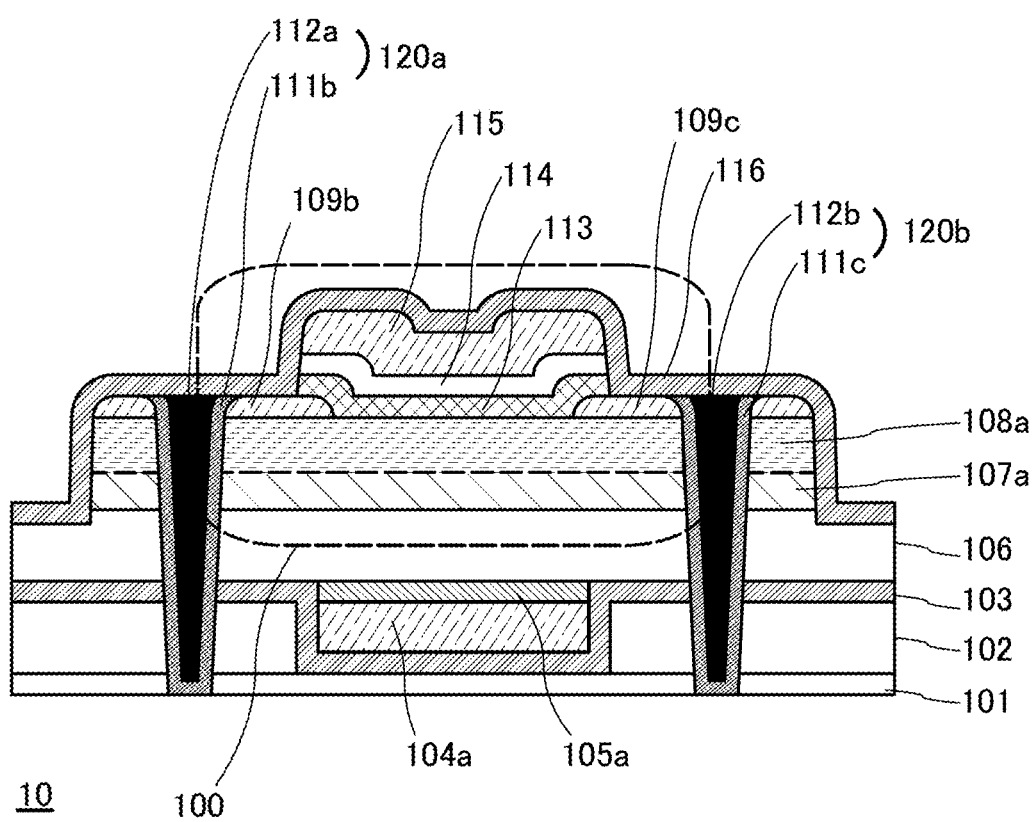
FIG. 1 illustrates a structure example of a semiconductor device of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Note that in this specification and the like, an electrode and a wiring electrically connected to the electrode may be a single component. In other words, there are cases where a portion of a wiring functions as an electrode and where a portion of an electrode functions as a wiring.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines ranges from 80° to 100°, and accordingly includes the case where the angle ranges from 85° to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

Structure Example of Stacked-Layer Structure

An example of a stack 10 including a transistor 100 that is applicable to a semiconductor device of one embodiment of the present invention is described below. FIG. 1 is a schematic cross-sectional view of the stack 10 described below.

Figure 2:
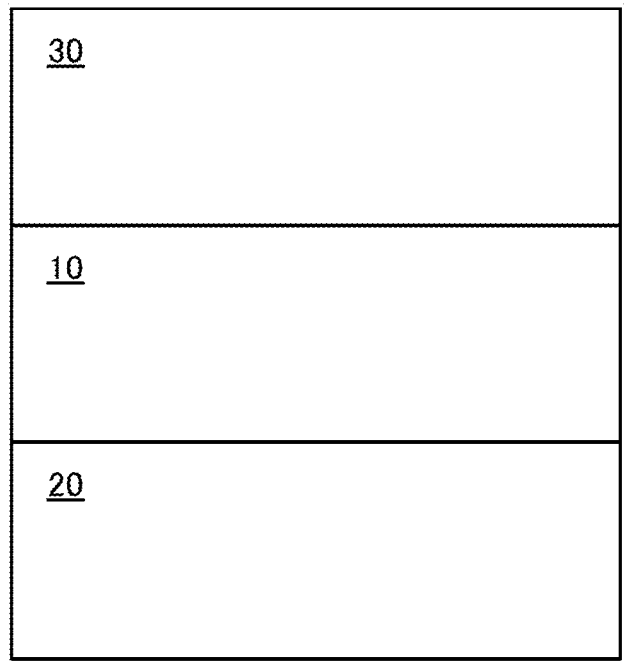
FIG. 2 illustrates a stacked-layer structure included in a semiconductor device of an embodiment.

A variety of elements can be formed to be stacked over or below the stack 10. FIG. 2 illustrates an example in which the stack 10 is stacked over a stack 20, and a stack 30 is stacked over the stack 10. For example, it is possible to employ a structure that is formed in such a manner that the stack 20 is formed using a single crystal silicon semiconductor, the stack 10 is formed thereover, and an element such as a capacitor is formed as the stack 30 thereover.

The stack 10 includes an insulator 102 that is in contact with the top surface of an insulator 101; a groove or opening that is formed in the insulator 102; a barrier film 103 that is in contact with the inside of the groove or opening and the top surface of the insulator 102; a conductor 104a that is provided in the groove or opening of the insulator 102 with the barrier film 103 positioned therebetween; a barrier film 105a that is in contact with the top surface of the conductor 104a; an insulator 106 that is in contact with the top surface of the barrier film 103 and the top surface of the barrier film 105a; a semiconductor 107a that is in contact with the top surface of the insulator 106; a semiconductor 108a that is in contact with the top surface of the semiconductor 107a; a conductor 109b and a conductor 109c that are in contact with the top surface of the semiconductor 108a and separated from each other in a region overlapping the semiconductor 108a; a plurality of plugs 120a and 120b that are provided in openings formed in at least the conductor 109b, the conductor 109c, the semiconductor 108a, and the semiconductor 107a; a semiconductor 113 that is in contact with the top surface of the semiconductor 108a; an insulator 114 that is in contact with the top surface of the semiconductor 113; a conductor 115 that is in contact with the top surface of the insulator 114; and a barrier film 116 that covers at least the semiconductor 107a, the semiconductor 108a, and the semiconductor 113.

The semiconductor 108a overlaps the conductor 104a and the barrier film 105a. The conductor 104a functions as a second gate electrode.

Furthermore, since the conductor 104a is surrounded by the barrier film 103 and the barrier film 105a, oxidation of the conductor 104a can be prevented.

One of the conductors 109b and 109c functions as a source electrode and the other functions as a drain electrode. Since at least the side surfaces of the plugs 120a and 120b are in contact with the semiconductor 108a, one of the plugs 120a and 120b functions as a source electrode and the other functions as a drain electrode. Note that the plug 120a is formed of conductors 111b and 112a, and the plug 120b is formed of conductors 111c and 112b.

Furthermore, the plugs 120a and 120b are formed in the openings provided in the conductors 109b and 109c, the semiconductor 108a, and the semiconductor 107a; as a result, the size of the semiconductor device can be reduced.

The insulator 114 is provided between the semiconductor 108a and the conductor 115, and functions as a gate insulating film.

The conductor 115 overlaps the semiconductor 108a and functions as a first gate electrode.

Note that the transistor 100 includes at least the semiconductor 108a, the insulator 114, the conductor 115, and the like.

An approximately 50-nm-thick silicon nitride is preferably used as the insulator 101. An approximately 150-nm-thick silicon oxide deposited using tetra-ethyl-ortho-silicate (TEOS) is preferably used as the insulator 102.

Any material can be used for the insulator 102 as long as the etching rate of the insulator 102 is different from that of the insulator 101. Each of the insulator 101 and the insulator 102 can be formed with a single layer or stacked layers using, for example, silicon oxide, silicon oxynitride, silicon nitride oxide, silicon nitride, aluminum oxide, aluminum oxynitride, aluminum nitride oxide, aluminum nitride, or the like.

The insulator 102 functions as a planarization film for eliminating a level difference caused by a structure or the like underlying the insulator 102. A top surface of the insulator 102 may be planarized by a chemical mechanical polishing (CMP) method or the like to increase the planarity of the top surface.

Examples of materials that can be used for the barrier film 103 and the barrier film 116 are silicon nitride, silicon nitride oxide, aluminum oxide, aluminum oxynitride, gallium oxide, gallium oxynitride, yttrium oxide, yttrium oxynitride, hafnium oxide, and hafnium oxynitride. Aluminum oxide is particularly preferable because of its excellent barrier property against water or hydrogen.

The barrier film 103 and the barrier film 116 each may be a stack of a layer of a material relatively impermeable to water or hydrogen and a layer containing an insulating material. The barrier film 103 and the barrier film 116 each may be, for example, a stack of a layer containing silicon oxide or silicon oxynitride, a layer containing a metal oxide, and the like.

It is preferable that hydrogen, water, or the like in the layers under the barrier film 103 be reduced as much as possible or degasification be inhibited. Hydrogen or water might become a factor that causes changes in the electrical characteristics of an oxide semiconductor. Hydrogen or water diffusing from the layers under the barrier film 103 to the layers over the barrier film 103 can be inhibited owing to the barrier film 103.

In order to reduce hydrogen or water contained in the layers under the barrier film 103 as much as possible or to inhibit degasification, heat treatment for removing the hydrogen or the water is preferably performed before the formation of the barrier film 103 or immediately after the formation of openings for forming the plugs 120a and 120b in the barrier film 103. The heat treatment is preferably performed at as high a temperature as possible within the range that does not adversely affect the heat resistance of the conductive films and the like in the semiconductor device and the electrical characteristics of the transistor. Specifically, the temperature may be, for example, higher than or equal to 450° C., preferably higher than or equal to 490° C., further preferably higher than or equal to 530° C., or may be higher than or equal to 650° C. It is preferable that the heat treatment be performed in an inert gas atmosphere or a reduced pressure atmosphere for 1 hour or longer, preferably 5 hours or longer, further preferably 10 hours or longer. In addition, the temperature of the heat treatment may be determined in consideration of the heat resistance, a material of a wiring, an electrode, or a plug included in the semiconductor device; in the case where the heat resistance of the material is low, the heat treatment may be performed at lower than or equal to 550° C., lower than or equal to 600° C., lower than or equal to 650° C., or lower than or equal to 800° C. Such heat treatment may be performed at least once but is preferably performed more than once.

For the barrier film 103 and the barrier film 116, a material relatively impermeable to oxygen is preferably used. The material has excellent barrier properties against oxygen as well as hydrogen and water. Use of such a material can prevent oxygen that is released at the time of heating the insulator 106 from diffusing into layers below the barrier film 103 and layers over the barrier film 116. As a result, the amount of oxygen which is released from the insulator 106 to be supplied to the semiconductor 107a, the semiconductor 108a, and the semiconductor 113 can be increased.

In this manner, with the barrier film 103, the concentration of hydrogen or water contained in each layer provided below the barrier film 103 is reduced or the hydrogen or water is removed, and diffusion of hydrogen or water into the semiconductor 107a, the semiconductor 108a, and the semiconductor 113 is prevented. Therefore, the hydrogen or water content of each of the semiconductor 107a, the semiconductor 108a, and the semiconductor 113 can be extremely low. For example, the hydrogen concentration of the semiconductor 107a, the semiconductor 108a, the semiconductor 113, or the insulator 114 can be reduced to lower than $5 \times 10^{18}$ atoms/cm$^3$, preferably lower than $1 \times 10^{18}$ atoms/cm$^3$, further preferably lower than $3 \times 10^{17}$ atoms/cm$^3$.

It is preferable that the conductor 104a be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented.

The conductor 104a can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

For example, the conductor 104a can have a stacked-layer structure of three layers. A stacked-layer structure formed of titanium as a first layer, titanium nitride as a second layer over the first layer, and tungsten as a third layer over the second layer may be employed.

As the barrier film 105a, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like can be used. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride semiconductor film, a nitrogen-containing In—Ga—Zn-based oxynitride semiconductor film having a higher nitrogen concentration than at least the semiconductor 107a, specifically having a nitrogen concentration of higher than or equal to 7 at. %, is used.

For the barrier film 105a, a material to which oxygen is not easily diffused is preferably used. Thus, oxidation of the conductor 104a can be prevented. An increase in the resistance value of the conductor 104a can be prevented.

An oxide material from which oxygen is partly released due to heating is preferably used for the insulator 106.

As the oxide material from which oxygen is released due to heating, oxide containing oxygen in excess of the stoichiometric composition is preferably used. Part of oxygen is released due to heating from an oxide film containing oxygen in excess of the stoichiometric composition. The oxide film containing oxygen in excess of the stoichiometric composition is an oxide film of which the amount of released oxygen converted into oxygen atoms is greater than or equal to $1.0 \times 10^{18}$ atoms/cm$^3$, and preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Examples of the metal oxide include aluminum oxide, aluminum oxynitride, gallium oxide, gallium oxynitride, yttrium oxide, yttrium oxynitride, hafnium oxide, and hafnium oxynitride. Note that in this specification, "silicon oxynitride" refers to a material that contains oxygen at a higher proportion than nitrogen, and "silicon nitride oxide" refers to a material that contains nitrogen at a higher proportion than oxygen. In the case where an oxide semiconductor is used as a semiconductor material, oxygen released from the insulator 106 is supplied to the oxide semiconductor, so that oxygen vacancy in the oxide semiconductor can be reduced. Consequently, changes in the electrical characteristics of the transistor can be reduced and the reliability of the transistor can be improved.

When the difference in level between the top surface of the barrier film 103 and the top surface of the barrier film 105a does not exist before formation of the insulator 106, the insulator 106 can be formed thin.

The semiconductor 108a may include a semiconductor such as a silicon-based semiconductor in a region where a channel is formed. It is particularly preferable that the semiconductor 108a include a semiconductor having a wider band gap than silicon. The semiconductor 108a preferably includes an oxide semiconductor. A semiconductor material having a wider band gap and a lower carrier density than silicon is preferably used because off-state leakage current of the transistor can be reduced.

For example, the semiconductor preferably includes at least indium (In) or zinc (Zn) as the oxide semiconductor. It is further preferable that the semiconductor include an In-M-Zn-based oxide (M is a metal such as Al, Ti, Ga, Ge, Y, Zr, Sn, La, Ce, or Hf).

As the semiconductor, it is particularly preferable to use an oxide semiconductor film including a plurality of crystal parts whose c-axes are aligned perpendicular to a surface on which the semiconductor is formed or the top surface of the semiconductor and in which the adjacent crystal parts have no grain boundary.

The use of such a material for the semiconductor makes it possible to provide a highly reliable transistor in which a change in the electrical characteristics is inhibited.

Note that details of a preferable mode and a formation method of an oxide semiconductor that can be used for the semiconductor are described later in an embodiment described below.

A semiconductor device of one embodiment of the present invention preferably includes an oxide layer, which contains as its constituent element at least one of the metal elements constituting an oxide semiconductor, between the oxide semiconductor and an insulator that overlaps the oxide semiconductor. In this way, a trap state is prevented from being formed at the interface between the oxide semiconductor and the insulator that overlaps the oxide semiconductor.

That is, one embodiment of the present invention preferably has a structure in which each of the top surface and the bottom surface of at least the channel formation region of the oxide semiconductor is in contact with an oxide layer that functions as a barrier film for preventing formation of an interface state of the oxide semiconductor. With this structure, formation of oxygen vacancy and entry of impurities which cause formation of carriers in the oxide semiconductor and the interface can be prevented. Thus, a highly purified intrinsic oxide semiconductor can be obtained. The highly purified intrinsic oxide semiconductor refers to an intrinsic or substantially intrinsic oxide semiconductor. It is thus possible to reduce variation in the electrical characteristics of a transistor including the oxide semiconductor and to provide a highly reliable semiconductor device.

Note that in this specification and the like, in the case of the substantially purified oxide semiconductor, the carrier density thereof is lower than $1 \times 10^{17}$/cm$^3$, lower than $1 \times 10^{15}$/cm$^3$, or lower than $1 \times 10^{13}$/cm$^3$. With a highly purified intrinsic oxide semiconductor, the transistor can have stable electrical characteristics.

The semiconductor 107a is provided between the insulator 106 and the semiconductor 108a.

The semiconductor 113 is provided between the semiconductor 108a and the insulator 114 functioning as a gate insulating film.

It is preferable that the semiconductor 107a and the semiconductor 113 each contain an oxide containing one or more kinds of metal elements which are the same as those of the semiconductor 108a.

Note that the boundary between the semiconductor 108a and the semiconductor 107a and the boundary between the semiconductor 108a and the semiconductor 113 might be unclear.

For example, the semiconductors 107a and 113 contain In or Ga; typically, a material such as In—Ga-based oxide, In—Zn-based oxide, or In-M-Zn-based oxide (M is Al, Ti, Ga, Y, Zr, La, Ce, Nd, or Hf) that has energy of the bottom of the conduction band closer to the vacuum level than that of the semiconductor 108a is used. Typically, the difference in energy at the bottom of the conduction band between the semiconductor 107a or 113 and the semiconductor 108a is preferably 0.05 eV or more, 0.07 eV or more, 0.1 eV or more, or 0.15 eV or more and 2 eV or less, 1 eV or less, 0.5 eV or less, or 0.4 eV or less. Gallium oxide or the like can be used for the semiconductor 113. Note that the semiconductor 113 might function as part of the gate insulating film depending on circumstances.

For each of the semiconductors 107a and 113 between which the semiconductor 108a is provided, an oxide that contains a larger amount of Ga serving as a stabilizer than the semiconductor 108a is used, which can inhibit release of oxygen from the semiconductor 108a.

For example, when an In—Ga—Zn-based oxide having an atomic ratio of In:Ga:Zn=1:1:1, or 3:1:2 is used for the semiconductor 108a, an In—Ga—Zn-based oxide having an atomic ratio of In:Ga:Zn=1:3:2, 1:3:4, 1:3:6, 1:6:4, 1:6:8, 1:6:10, 1:9:6, or the like can be used for the semiconductors 107a and 113. In each of the semiconductors 108a, 107a, and 113, the proportions of the atoms in the above atomic ratio vary within a range of ±20% as an error. For the semiconductors 107a and 113, materials with the same composition ratio or materials with different composition ratios may be used.

Furthermore, when an In-M-Zn-based oxide is used for the semiconductor 108a, an oxide containing metal elements in the atomic ratio satisfying the following conditions is preferably used for a target for forming a semiconductor film to be the semiconductor 108a. Given that the atomic ratio of the metal elements in the oxide is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In-M-Zn-based oxide is used for the semiconductors 107a and 113, an oxide containing metal elements in the following atomic ratio is preferably used for a target for forming oxide films to be the semiconductors 107a and 113. Given that the atomic ratio of the metal elements in the target is In:M:Zn=$x_2$:$y_2$:$z_2$, it is preferable that $x_2/y_2$ be less than $x_1/y_1$, and $z_2/y_2$ be greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, 1:3:6, 1:3:8, or the like.

By using a material whose energy level of the bottom of the conduction band is closer to the vacuum level than that of the semiconductor 108a is used for the semiconductors 107a and 113, a channel is mainly formed in the semiconductor 108a, so that the semiconductor 108a serves as a main current path. In this manner, when the semiconductor 108a in which a channel is formed is provided between the semiconductors 107a and 113 that contain the same metal elements, formation of interface states between these films is inhibited, and thus the reliability of the electrical characteristics of the transistor is improved.

Note that, without limitation to those described above, a material with an appropriate composition may be used depending on required semiconductor characteristics and electrical characteristics (e.g., field-effect mobility and threshold voltage) of a transistor. Furthermore, in order to obtain required semiconductor characteristics of the transistor, it is preferable that the carrier density, the impurity concentration, the defect density, the atomic ratio of a metal element to oxygen, the interatomic distance, the density, and the like of the semiconductors 108a, 107a, and 113 be set to appropriate values.

Here, a region (mixed region) where the semiconductor 107a and the semiconductor 108a are mixed might be provided between the semiconductor 107a and the semiconductor 108a. A mixed region of the semiconductor 108a and the semiconductor 113 might be provided between the semiconductor 108a and the semiconductor 113. The mixed region has a low density of interface states. For that reason, the stack of the semiconductor 107a, the semiconductor 108a, and the semiconductor 113 has a band structure where energy at each interface is changed continuously (continuous junction).

Figure 29A:
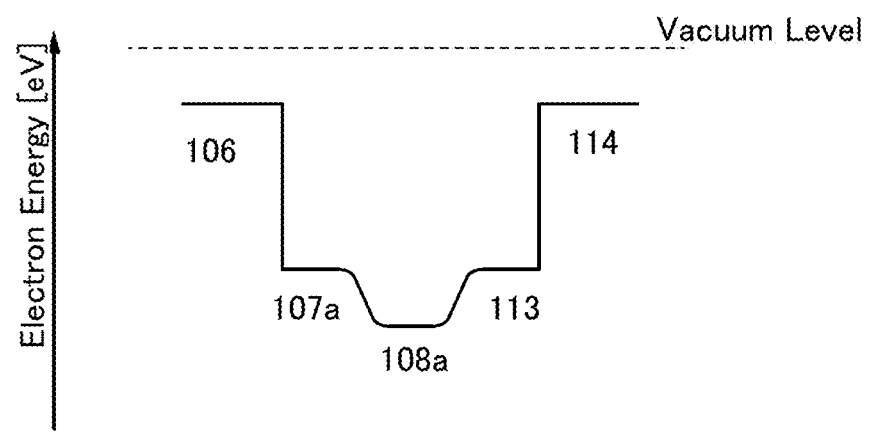
FIGS. 29A and 29B each illustrate a band structure of an embodiment.
Figure 29B:
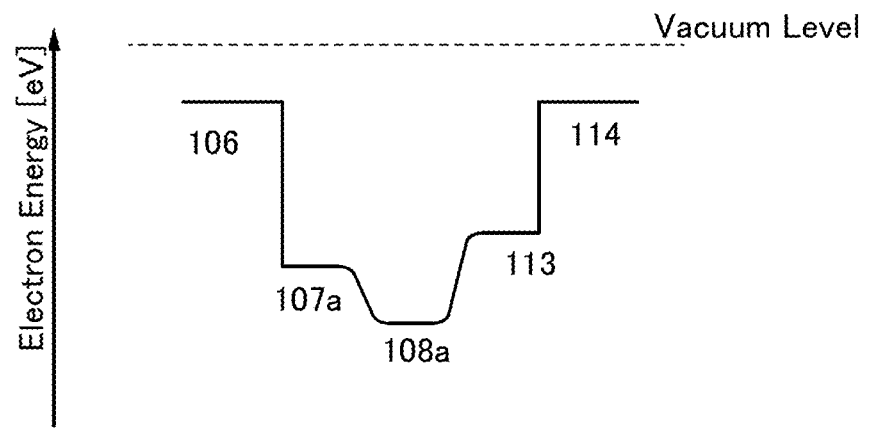

Here, the band structure is described (FIGS. 29A and 29B). For easy understanding, the band structure is illustrated with the energy (Ec) at the bottom of the conduction band of each of the insulator 106, the semiconductor 107a, the semiconductor 108a, the semiconductor 113, and the insulator 114 functioning as a gate insulating film.

As illustrated in FIGS. 29A and 29B, the energy of the bottom of the conduction band changes continuously in the semiconductor 107a, the semiconductor 108a, and the semiconductor 113. This can be understood also from the fact that the constituent elements are common among the semiconductors 107a, 108a, and 113 and oxygen is easily diffused among the semiconductors 107a, 108a, and 113. Thus, the semiconductor 107a, 108a, and 113 have a continuous physical property although they are a stack of layers having different compositions.

The oxide semiconductors that are stacked and contain the same main components have not only a simple stacked-layer structure of the layers but also a continuous energy band (here, in particular, a well structure having a U shape in which the conduction band minimum continuously varies among the layers (U-shape well)). In other words, the stacked-layer structure is formed such that there exists no impurities that form a defect level such as a trap center or a recombination center at each interface. If impurities exist between the stacked layers in the multilayer film, the continuity of the energy band is lost and carriers disappear by a trap or recombination at the interface.

Note that FIG. 29A illustrates the case where the Ec of the semiconductor 107a are equal to the Ec of the semiconductor 113; however, they may be different from each other. For example, part of the band structure in the case where the Ec of the semiconductor 113 is higher than the Ec of the semiconductor 107a is illustrated in FIG. 29B.

According to FIGS. 29A and 29B, the semiconductor 108a serves as a well, and a channel is formed in the semiconductor 108a. Note that since the energies at the bottoms of the conduction bands are changed continuously, the semiconductor 107a, the semiconductor 108a, and the semiconductor 113 can also be referred to as a U-shaped well. Furthermore, a channel formed to have such a structure can also be referred to as a buried channel.

Note that trap states resulting from impurities or defects might be formed in the vicinity of the interfaces between the insulating film such as a silicon oxide film and each of the semiconductor 107a and the semiconductor 113. Owing to the semiconductor 107a and the semiconductor 113, the semiconductor 108a can be separated from the trap states. However, when the energy difference in Ec between the semiconductor 108a and the semiconductor 107a or the semiconductor 113 is small, an electron in the semiconductor 108a might reach the trap state by passing over the energy difference. Since the electron is trapped at the trap state, a negative fixed charge is generated at the interface with the insulating film, causing the threshold voltage of the transistor to be shifted in the positive direction.

Thus, to reduce a change in the threshold voltage of the transistor, an energy difference between the Ec of the semiconductor 108a and the Ec of each of the semiconductors 107a and 113 is necessary. Each of the energy differences is preferably greater than or equal to 0.1 eV, further preferably greater than or equal to 0.15 eV.

The semiconductor 107a, 108a, and 113 preferably include crystal parts. In particular, when a crystal in which c-axes are aligned is used, the transistor can have stable electrical characteristics.

In the band structure illustrated in FIG. 29B, instead of the semiconductor 113, an In—Ga-based oxide (e.g., with an atomic ratio of In:Ga=7:93) may be provided between the semiconductor 108a and the insulator 114 functioning as a gate insulating film.

An oxide which has a higher electron affinity than those of the semiconductor 107a and the semiconductor 113 is used for the semiconductor 108a. For example, as the semiconductor 108a, an oxide having an electron affinity higher than those of the semiconductor 107a and the semiconductor 113 by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy difference between the vacuum level and the bottom of the conduction band.

Here, it is preferable that the thickness of the semiconductor 108a be at least larger than that of the semiconductor 107a. The thicker the semiconductor 108a is, the larger the on-state current of the transistor is. The thickness of the semiconductor 107a may be set as appropriate as long as formation of an interface state at the interface with the semiconductor 108a is inhibited. For example, the thickness of the semiconductor 108a is larger than that of the semiconductor 107a, preferably 2 times or more, further preferably 4 times or more, still further preferably 6 times or more as large as that of the semiconductor 107a. Note that the above does not apply in the case where the on-state current of the transistor need not be increased, and the thickness of the semiconductor 107a may be equal to or greater than that of the semiconductor 108a.

The thickness of the semiconductor 113 may be set as appropriate, in a manner similar to that of the semiconductor 107a, as long as formation of an interface state at the interface with the semiconductor 108a is inhibited. For example, the thickness of the semiconductor 113 may be set smaller than or equal to that of the semiconductor 107a. If the semiconductor 113 is thick, it may become difficult for the electric field from the conductor 115 functioning as a gate electrode to reach the semiconductor 108a. Therefore, it is preferable that the semiconductor 113 be thin; for example, thinner than the semiconductor 108a. Note that the thickness of the semiconductor 113 is not limited to the above, and may be set as appropriate depending on a driving voltage of the transistor in consideration of the withstand voltage of the insulator 114 functioning as a gate insulating film.

Here, in the case where the semiconductor 108a is in contact with an insulator including a different constituent element (e.g., an insulator including a silicon oxide film), an interface state might be formed at the interface of the two layers and the interface state forms a channel. At this time, another transistor having a different threshold voltage appears, so that an apparent threshold voltage of the transistor is varied. However, in the transistor of this structure, the semiconductor 107a contains one or more kinds of metal elements that constitute the semiconductor 108a. Therefore, an interface state is not easily formed at the interface between the semiconductor 107a and the semiconductor 108a. Thus, providing the semiconductor 107a makes it possible to reduce variations or changes in electrical characteristics of the transistor, such as threshold voltage.

When a channel is formed at the interface between the insulator 114 functioning as a gate insulating film and the semiconductor 108a, interface scattering occurs at the interface and the field-effect mobility of the transistor is reduced in some cases. In the transistor of this structure, however, the semiconductor 113 contains one or more kinds of metal elements that constitute the semiconductor 108a. Therefore, scattering of carriers is less likely to occur at the interface between the semiconductor 108a and the semiconductor 113, and thus the field-effect mobility of the transistor can be increased.

The conductors 109b and 109c are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The insulator 114 may be formed to have a single layer or stacked layers using, for example, silicon oxide, silicon oxynitride, silicon nitride oxide, aluminum oxide, hafnium oxide, gallium oxide, Ga—Zn-based metal oxide, silicon nitride, and the like.

The insulator 114 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide.

For example, the insulator 114 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these.

As the insulator 114, like the insulator 106, an oxide insulating film that contains oxygen in excess of the stoichiometric composition is preferably used.

When the specific material is used for the gate insulating film, electrons are trapped in the gate insulating film under the specific conditions and the threshold voltage can be increased. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor layer to the gate electrode, and some of the electrons are trapped by the electron trap states.

In the transistor in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, after packaging, or the like. In either case, it is preferable that the transistor be not exposed to temperatures of 125° C. or higher for one hour or more after the process for trapping electrons.

The conductor 115 can be formed using, for example, a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Alternatively, a semiconductor typified by polycrystalline silicon doped with an impurity element such as phosphorus, or a silicide such as nickel silicide may be used. Furthermore, the conductor 115 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium may be used.

The conductor 115 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Examples of a material for adjusting a work function which can be used for the conductor 115 include titanium nitride, tantalum nitride, tungsten, tungsten nitride, ruthenium, n-type polycrystalline silicon, and p-type polycrystalline silicon. For example, to obtain the transistor 100 that is normally off, a material with a high work function is preferably used. Examples of the material with a high work function include tungsten, tungsten nitride, and ruthenium.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, or a film of a metal nitride (e.g., InN or ZnN), or the like may be provided between the conductor 115 and the insulator 114. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least a semiconductor 108a, specifically an In—Ga—Zn-based oxynitride semiconductor film having a nitrogen concentration higher than or equal to 7 at. %, is used.

The above is the description of a structural example.

Note that part or the whole of this embodiment can be freely combined with, applied to, or replaced with part or the whole of another embodiment.

Embodiment 2

Example of Manufacturing Method

An example of a method for manufacturing the semiconductor device described in the above structure example is described below with reference to FIGS. 3A to 3D, FIGS. 4A to 4D, FIGS. 5A to 5C, and FIGS. 6A to 6C.

The insulator 102 is formed over the insulator 101. An approximately 50-nm-thick silicon nitride is preferably used as the insulator 101. Alternatively, an approximately 150-nm-thick silicon oxide formed using TEOS is preferably used as the insulator 102.

The insulator 101 and the insulator 102 each can be formed to have a single layer or stacked layers using, for example, silicon oxide, silicon oxynitride, silicon nitride oxide, silicon nitride, aluminum oxide, aluminum oxynitride, aluminum nitride oxide, aluminum nitride, and the like.

The insulator 101 and the insulator 102 each may be deposited by a sputtering method, a chemical vapor deposition (CVD) method (including a thermal CVD method, a plasma enhanced CVD (PECVD) method, and the like), a metal organic CVD (MOCVD) method, a molecular beam epitaxy (MBE) method, an atomic layer deposition (ALD) method, a pulsed laser deposition (PLD) method, a high density plasma CVD (HDP-CVD) method, a low pressure CVD (LP-CVD) method, an atmospheric pressure CVD (AP-CVD) method, a collimated sputtering method, a long throw sputtering method, or the like.

In particular, it is preferable that the insulator be formed by a CVD method, further preferably a plasma CVD method because embeddability can be improved. It is preferable to use a thermal CVD method, an MOCVD method, or an ALD method in order to reduce plasma damage.

Next, heat treatment is performed. The heat treatment can be performed, for example, at a temperature higher than or equal to 490° C. and lower than the strain point of the substrate in an inert gas atmosphere such as a rare gas atmosphere or a nitrogen gas atmosphere or in a reduced-pressure atmosphere.

This heat treatment inhibits detachment or degasification of substances from a stack which includes the insulator 102 and layers provided below the insulator. The substances such as hydrogen adversely affect a semiconductor formed over the insulator 102. Note that although the heat treatment is preferably performed, it may be omitted if not particularly needed. Alternatively, the heat treatment may be performed after a step for forming an opening or groove in the insulator, which is described next.

Next, the opening or groove is formed in the insulator 102. To form the opening in the insulator 102, it is preferable to select a combination of materials with which the etching selectivity of the insulator 102 with respect to the insulator 101 is high.

Figure 3A:
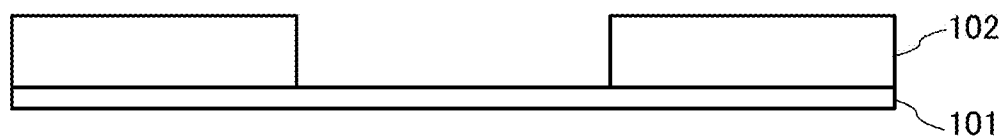
FIGS. 3A to 3D illustrate an example of a method for manufacturing a semiconductor device of an embodiment.

The opening or groove in the insulator 102 can be formed by a photolithography method or the like. A resist mask is formed over the insulator 102 and an unnecessary portion of the insulator 102 is removed. Then, the resist mask is removed; thus, the opening or groove can be formed in the insulator 102 (FIG. 3A).

Here, a method for processing a film is described. In the case of finely processing a film, a variety of fine processing techniques can be used. For example, a method may be used in which a resist mask formed by a photolithography process or the like is subjected to slimming treatment. Alternatively, a method may be used in which a dummy pattern is formed by a photolithography process or the like, the dummy pattern is provided with a sidewall and is then removed, and a film is etched using the remaining sidewall as a mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

An organic resin film having a function of improving adhesion between the film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In a particularly minute process, the organic resin film is preferably formed using a material functioning as an anti-reflection film against light for exposure. Examples of such an organic resin film serving as an anti-reflection film include bottom anti-reflection coating (BARC) film. The organic resin film may be removed at the same time as the removal of the resist mask or after the resist mask is removed.

Figure 3B:
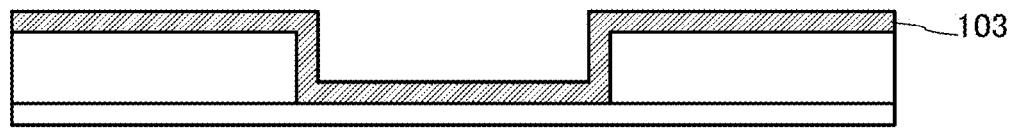

The barrier film 103 is provided over the insulator 102 in which the opening or groove is formed. An approximately 50-nm-thick aluminum oxide is preferably used as the barrier film 103 (FIG. 3B).

It is preferable that the amount of released hydrogen of the stack provided under the barrier film 103, which is measured by thermal desorption spectrometry (TDS) analysis, at a substrate surface temperature of 400° C. be lower than or equal to 130%, preferably lower than or equal to 110% of that at a substrate surface temperature of 300° C. Alternatively, it is preferable that the amount of released hydrogen molecules measured by TDS analysis at a substrate surface temperature of 450° C. be lower than or equal to 130%, preferably lower than or equal to 110% of that at a substrate surface temperature of 350° C.

The barrier film 103 has a function of inhibiting diffusion of water and hydrogen from the layers under the barrier film 103. Note that the barrier film 103 may have an opening or a plug for electrically connecting an electrode or a wiring provided over the barrier film 103 to an electrode or a wiring provided under the barrier film 103.

Examples of a material that can be used for the barrier film 103 include silicon nitride, silicon nitride oxide, aluminum oxide, aluminum oxynitride, gallium oxide, gallium oxynitride, yttrium oxide, yttrium oxynitride, hafnium oxide, and hafnium oxynitride. Aluminum oxide is particularly preferable because of its excellent barrier property against water, hydrogen, or oxygen.

The barrier film 103 may be a stack of a layer of a material relatively impermeable to water or hydrogen and a layer containing an insulating material. The barrier film 103 may be, for example, a stack of a layer containing silicon oxide or silicon oxynitride, a layer containing a metal oxide, and the like.

For the barrier film 103, a material relatively impermeable to oxygen is preferably used. The material given above has excellent barrier properties against oxygen as well as hydrogen and water. The use of any of the materials can suppress diffusion of oxygen released when the insulator 106 formed later is heated to the layers below the barrier film 103. As a result, the amount of oxygen which is released from the insulator 106 to be supplied to a semiconductor 107, a semiconductor 108, and the semiconductor 113 can be increased.

The amount of water and hydrogen contained in the barrier film 103 itself is also preferably low. For example, it is preferable to use, for the barrier film 103, a material having an amount of released hydrogen molecules (M/z=2) measured by TDS of less than $2\times10^{15}/cm^2$, preferably less than $1\times10^{15}/cm^2$, further preferably less than $5\times10^{14}/cm^2$ at a substrate surface temperature ranging from 20° C. to 600° C. Alternatively, it is preferable to use, for the barrier film 103, a material having an amount of released water molecules (mass-to-charge ratio M/z=18) measured by TDS of less than $1\times10^{16}/cm^2$, preferably less than $5\times10^{15}/cm^2$, and further preferably less than $2\times10^{12}/cm^2$ at a substrate surface temperature from 20° C. to 600° C.

Figure 3C:
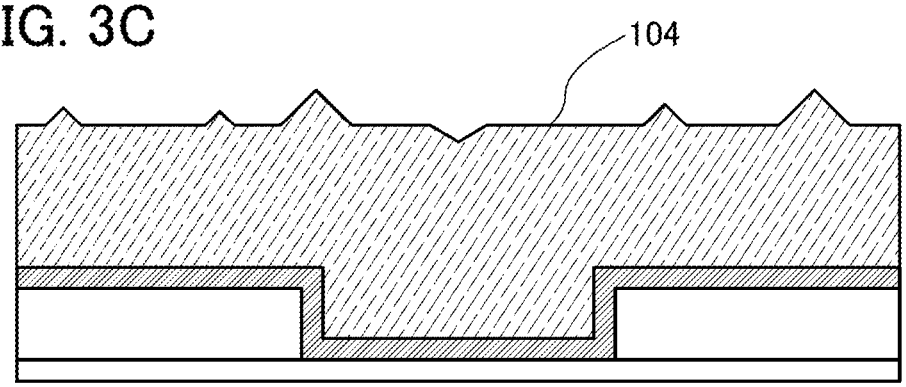

Next, a conductor 104 is provided over the barrier film 103 (FIG. 3C).

It is preferable that the conductor 104 be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented.

The conductor 104 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

The conductor 104 can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, the conductor 104 may be planarized by a chemical mechanical polishing (CMP) method or the like.

At this time, the conductor 104 may be polished by a CMP method until the level of the top surface of the barrier film 103 over a region of the insulator 102 in which the opening or groove is not provided is the same as that of the top surface of the conductor 104, or polishing may be stopped in the middle of the processing.

Figure 3D:
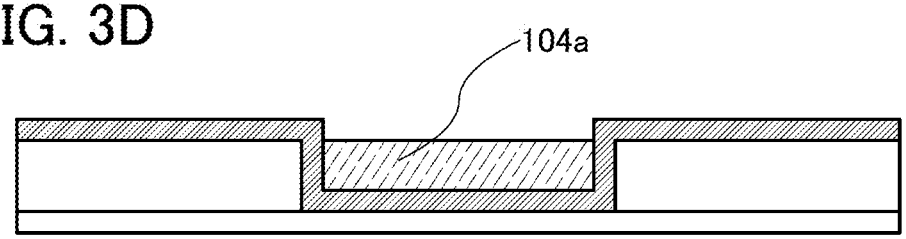

Next, the conductor 104 is etched to obtain the conductor 104a. Here, it is preferable that the level of the top surface of the conductor 104a be lower than that of the top surface of the barrier film 103 over the region of the insulator 102 in which the opening or groove is not provided, in particular, be lower than it by approximately 50 nm (FIG. 3D).

Figure 4A:
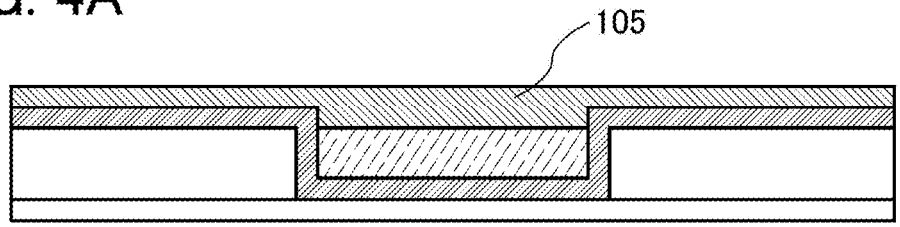
FIGS. 4A to 4D illustrate an example of a method for manufacturing a semiconductor device of an embodiment.

Next, a barrier film 105 is provided over the barrier film 103 and the conductor 104a (FIG. 4A).

An In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a metal nitride (InN, ZnN, or the like) film can be provided as the barrier film 105. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least the semiconductor 108a, specifically an In—Ga—Zn-based oxynitride semiconductor film having a nitrogen concentration higher than or equal to 7 at. %, is used.

For the barrier film 105, a material to which oxygen is not easily diffused is preferably used. Therefore, oxidation of the conductor 104a can be prevented, and an increase in the resistance value of the conductor 104a can be inhibited. The barrier film 105 can be formed using a material, a deposition method, and the like similar to those of the barrier film 103.

Figure 4B:
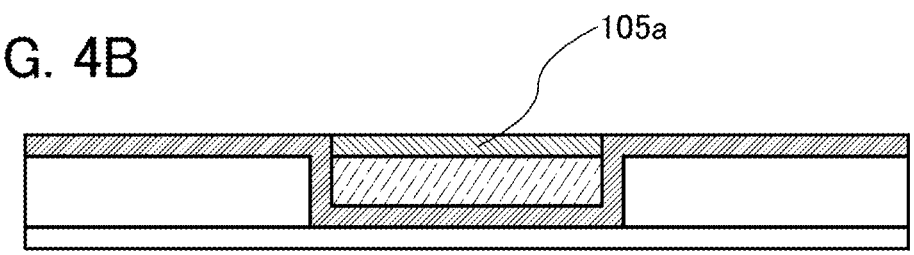

Next, the barrier film 105 is polished by a CMP method until the level of the top surface of the barrier film 103 over the region of the insulator 102 in which the opening or groove is not provided is the same as that of the top surface of the barrier film 105, whereby the barrier film 105a is obtained (FIG. 4B). Although FIG. 4B illustrates the example in which the barrier film 105a is obtained by polishing using a CMP method, the barrier film 105 is not necessarily polished.

Figure 4C:
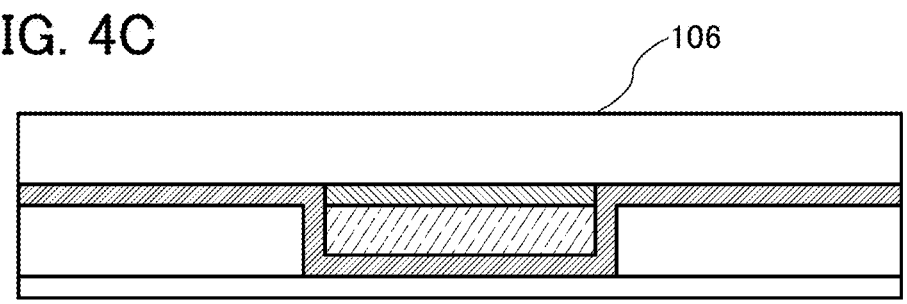

Next, the insulator 106 having a thickness of approximately 100 nm is provided (FIG. 4C).

It is preferable that the insulator 106 be an insulator which releases oxygen by heat treatment or the like in a later step. The released oxygen is used in order to reduce oxygen vacancy in the oxide semiconductor, so that the electrical characteristics and reliability of the transistor can be improved. Meanwhile, in the case where a semiconductor element or the like using single crystal silicon is formed below the stack 10, when released oxygen reaches the single crystal silicon, the electrical characteristics and reliability of the semiconductor element might deteriorate. The aluminum oxide film has a function of preventing oxygen from being mixed into the element positioned below the stack 10. Thus, even if the silicon oxynitride film containing excess oxygen is provided, an element (e.g., a transistor including single crystal silicon) with good electrical characteristics and high reliability can be manufactured.

The insulator 106 can be formed by, for example, a sputtering method, a CVD method (including a thermal CVD method, a PECVD method, and the like), an MOCVD method, an MBE method, an ALD method, a PLD method, or the like. In particular, it is preferable that the insulator be formed by a CVD method, further preferably a plasma CVD method, because coverage can be further improved. It is preferable to use a thermal CVD method, an MOCVD method, or an ALD method in order to reduce plasma damage.

To make the insulator 106 contain excess oxygen, the insulator 106 may be formed in an oxygen atmosphere, for example. Alternatively, a region excessively containing oxygen may be formed by introducing oxygen into the insulator 106 that has been formed. Both the methods may be combined.

For example, oxygen (at least including any of oxygen radicals, oxygen atoms, and oxygen ions) is introduced into the insulator 106 which has been formed, whereby a region excessively containing oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, dinitrogen monoxide, nitrogen dioxide, carbon dioxide, carbon monoxide, and the like can be used. Furthermore, a rare gas and/or hydrogen may be included in the gas containing oxygen for the oxygen introduction treatment. For example, a mixed gas of carbon dioxide, hydrogen, and argon can be used.

After the insulator 106 is formed, the insulator 106 may be subjected to planarization treatment using a CMP method or the like to improve the planarity of the top surface of the insulator 106.

It is preferable that the top surface of the barrier film 103 and the top surface of the barrier film 105a be processed by a CMP method so that a level difference is unlikely to be formed. In other words, the process is performed so that a level difference is not formed on the surface where the insulator 106 is formed, whereby the thickness of the insulator 106 can be small. Here, although the thickness of the insulator 106 is 100 nm, it can be smaller than 100 nm.

Next, the semiconductor 107 and the semiconductor 108 are formed. For example, a 15-nm-thick oxide semiconductor and a 20- to 40-nm-thick oxide semiconductor are used as the semiconductor 107 and the semiconductor 108, respectively. These semiconductors are preferably formed by a sputtering method. At this time, the oxide semiconductor of the semiconductor 107 is formed using a target having an atomic ratio of In:Ga:Zn=1:3:4. The oxide semiconductor of the semiconductor 108 is formed using a target having an atomic ratio of In:Ga:Zn=1:1:1.

The semiconductors 107 and 108 are preferably formed successively without contact with the air.

After the semiconductors 107 and 108 are formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. The heat treatment may be performed just after the formation of the semiconductors or may be performed after the semiconductors are processed into the island-shaped semiconductor. Through the heat treatment, oxygen can be supplied from the insulator 106 or the like to the semiconductors 107 and 108; thus, oxygen vacancy in the semiconductor film can be reduced.

Next, a conductor 109 is provided. Approximately 100-nm-thick tungsten is preferably used as the conductor 109. A sputtering method can be used for depositing the conductor 109.

The conductor 109 can be formed by a CVD method (including a thermal CVD method, an MOCVD method, a PECVD method, and the like), an MBE method, an ALD method, a PLD method, or the like instead of a sputtering method. In particular, it is preferable that the conductor be formed by a CVD method, further preferably a plasma CVD method because coverage can be further improved. It is preferable to use a thermal CVD method, an MOCVD method, or an ALD method in order to reduce plasma damage.

Figure 4D:
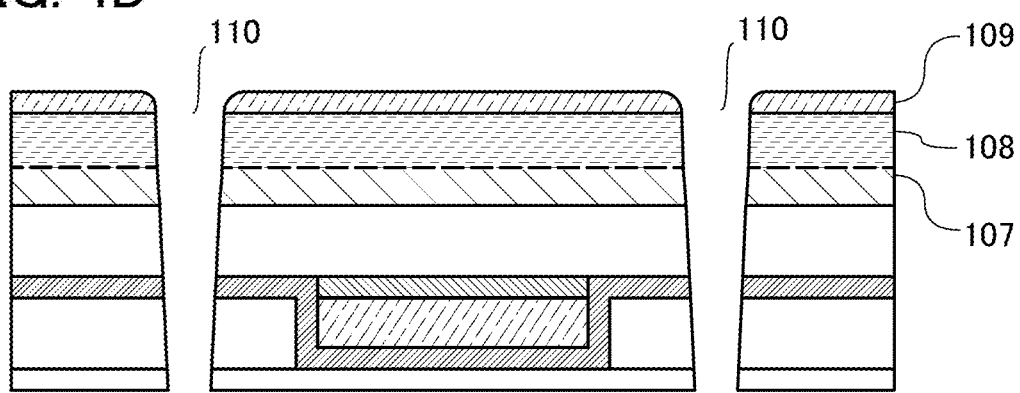

Openings are formed in the conductor 109, the semiconductor 108, the semiconductor 107, the insulator 106, the barrier film 103, the insulator 102, and the insulator 101. A photolithography method or the like can be used at the formation. A resist mask is formed over the conductor 109, and an unnecessary portion of the conductor 109 is removed. After that, the resist mask is removed, and the openings are formed in the semiconductor 108, the semiconductor 107, the insulator 106, and the barrier film 103 using the conductor 109 as a mask. In this manner openings 110 are formed (FIG. 4D).

Figure 5A:
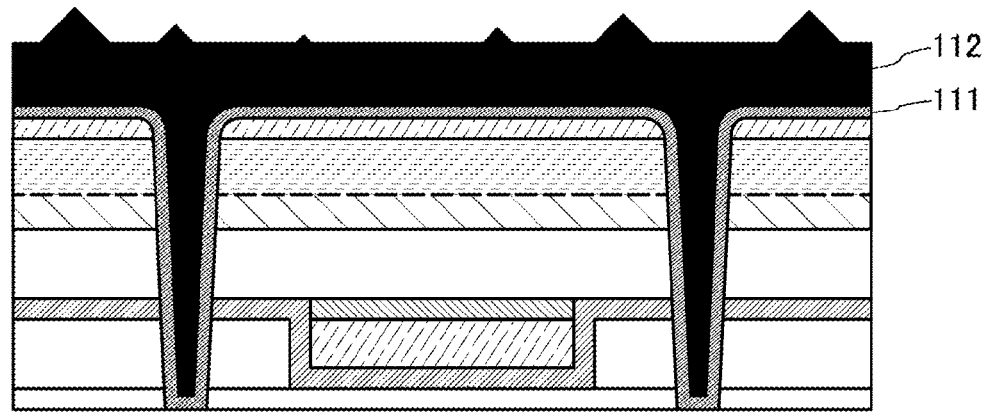
FIGS. 5A to 5C illustrate an example of a method for manufacturing a semiconductor device of an embodiment.

Next, conductors 111 and 112 are formed in the openings 110 and over the conductor 109. The conductors 111 and 112 can be formed by, for example, a sputtering method, a CVD method (including a thermal CVD method, an MOCVD method, a PECVD method, and the like), an MBE method, an ALD method, or a PLD method (FIG. 5A).

It is preferable that the conductors 111 and 112 each be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented.

Figure 5B:
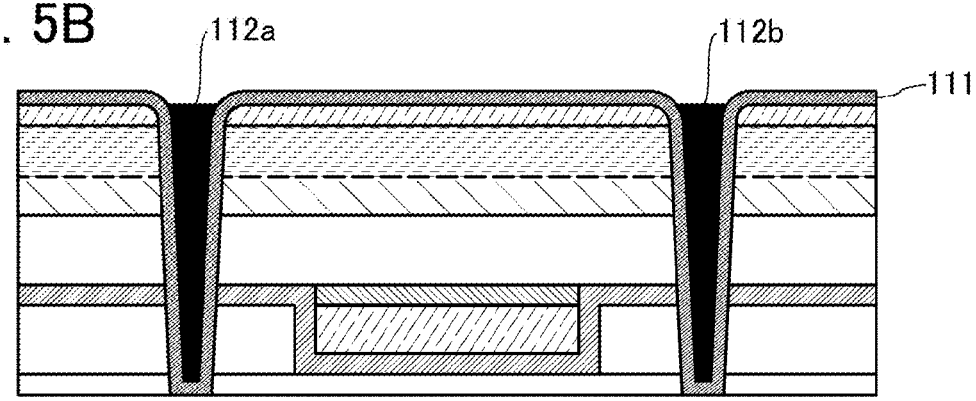

Next, the conductor 112 may be planarized by a CMP method or the like. At this time, the conductor 112 may be polished by a CMP method until the level of the top surface of the conductor 112 is the same as that of the top surface of the conductor 111, or polishing may be stopped in the middle of the processing. Alternatively, the conductor 112 may be etched using a wet etching method or the like. In this manner, the conductors 112a and 112b are obtained (FIG. 5B).

Figure 5C:
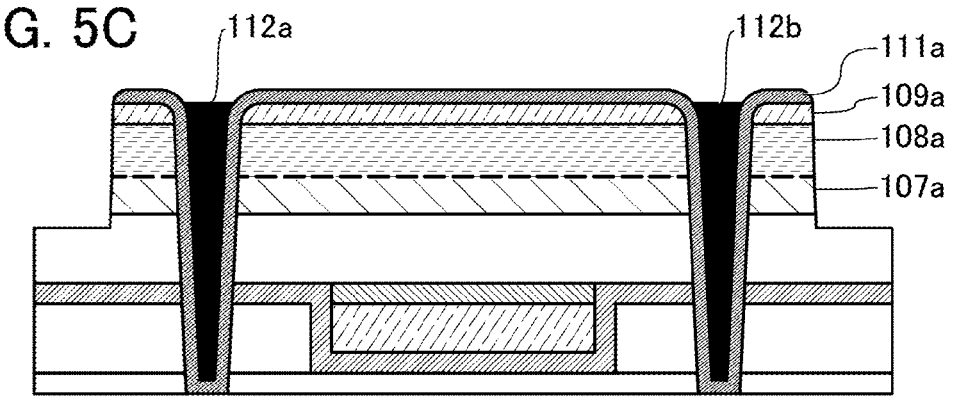

Then, a resist mask is formed over the conductor 111, the conductor 112a, and the conductor 112b by a photolithography method or the like. An unnecessary portion of the conductor 111 is removed using the resist mask to obtain a conductor 111a. After that, the resist mask is removed, and the conductor 109, the semiconductor 108, and the semiconductor 107 are etched using the conductor 111a as a mask. In this manner, a conductor 109a, the semiconductor 108a, and the semiconductor 107a are obtained. Here, part of the insulator 106 might be etched at the time of etching for forming the conductor 109a, the semiconductor 108a, and the semiconductor 107a. Therefore, the insulator 106 is preferably formed thick in advance in consideration of the etching depth (FIG. 5C).

Figure 6A:
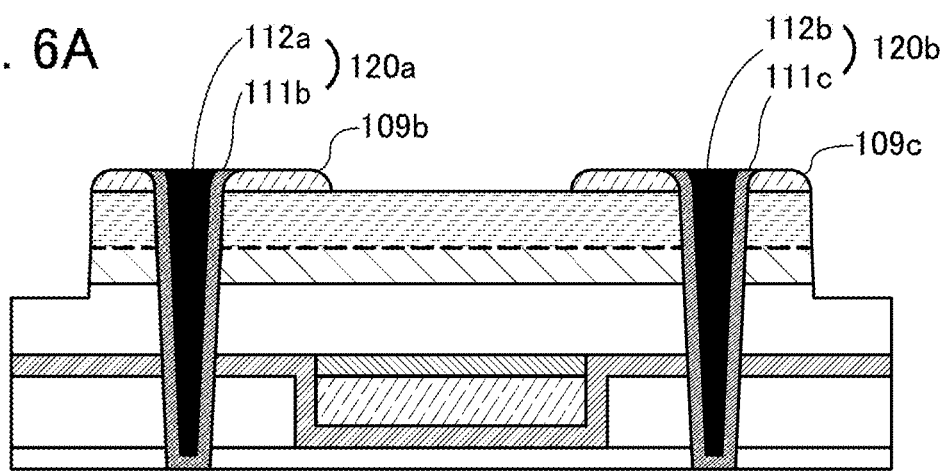
FIGS. 6A to 6C illustrate an example of a method for manufacturing a semiconductor device of an embodiment.

Next, the conductor 111a positioned over the conductor 109a is removed to obtain the conductor 111b and the conductor 111c. At this time, the plugs 120a and 120b are formed. Then, part of the conductor 109a is etched to obtain the conductor 109b and the conductor 109c. At this time, a photolithography method or the like can be used. Here, when the conductor 109b and the conductor 109c are obtained by etching of the conductor 109a, part of the semiconductor 108a might be etched, whereby the thickness of the part of the semiconductor 108a over which neither the conductor 109b nor the conductor 109c is provided might be reduced. For this reason, the semiconductor serving as the semiconductor 108 is preferably formed to have a large thickness in advance in consideration of the etching depth (FIG. 6A).

Since the plugs 120a and 120b are provided in the openings formed in the conductors 109b and 109c overlapping the semiconductor 108a, the size of the element can be reduced.

A wiring may be formed using layers which are the same as the conductors 109b and 109c, the semiconductor 108a, and the semiconductor 107a.

Next, a semiconductor, an insulator, and a conductor are deposited to be stacked in this order. After that, a resist mask is formed over the conductor, and an unnecessary portion of the conductor is removed. After that, the resist mask is removed, whereby the conductor 115 is formed. At this time, the insulator 114 and the semiconductor 113 may be formed in such a manner that the resist mask is not removed and an unnecessary portion of each of the insulator and the semiconductor is removed. Alternatively, the insulator 114 and the semiconductor 113 may be formed in such a manner that the resist mask is removed and then an unnecessary portion of each of the insulator and the semiconductor is removed using the conductor 115 as a mask.

A 5-nm-thick oxide semiconductor is used as the semiconductor 113. A sputtering method is preferably used for depositing the semiconductor 113. In the deposition of the oxide semiconductor, a target having an atomic ratio of In:Ga:Zn=1:3:2 is used.

Figure 6B:
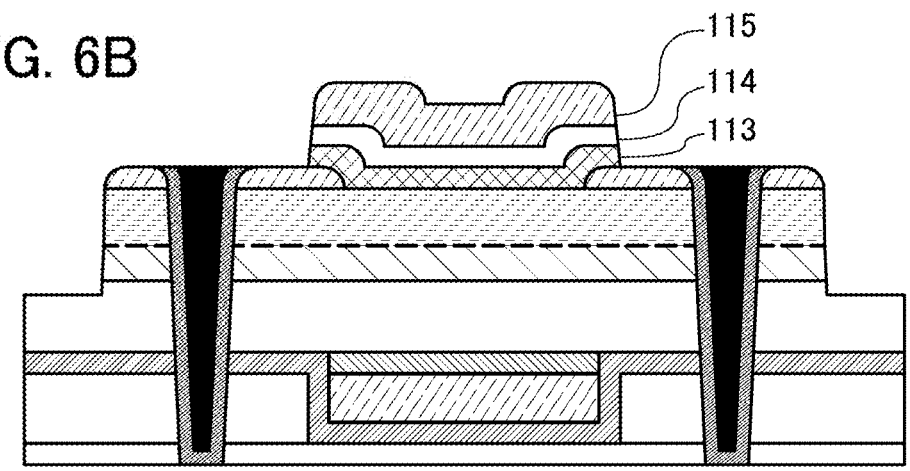

Furthermore, the semiconductor 113, the insulator 114, and the conductor 115 are preferably formed successively without exposure to the air (FIG. 6B).

Figure 6C:
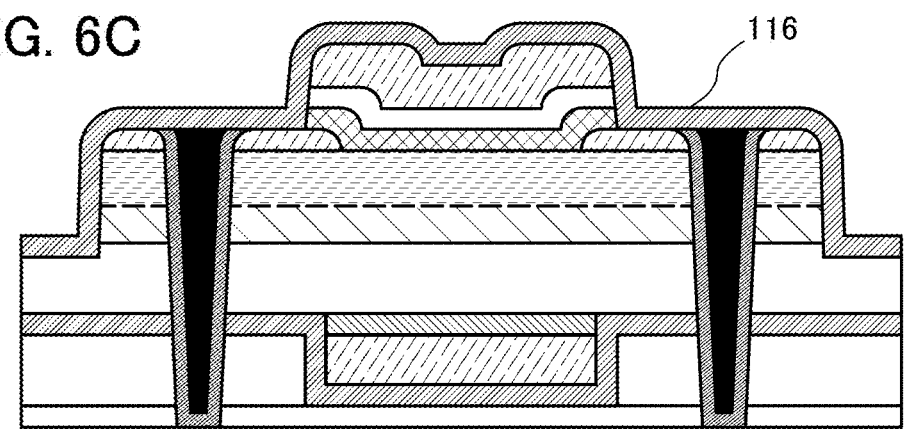

Then, the barrier film 116 is provided. The barrier film 116 can be formed using a material, a deposition method, and the like similar to those of the barrier film 103 (FIG. 6C).

After the barrier film 116 is deposited, heat treatment is preferably performed. By the heat treatment, oxygen is supplied from the insulator 106 or the like to the semiconductors 107a, 108a, and 113; as a result, oxygen vacancy in the semiconductors 107a, 108a, and 113 can be reduced. At this time, oxygen released from the insulator 106 is blocked by the barrier film 103 and the barrier film 116 and does not diffuse into a layer under the barrier film 103 and a layer over the barrier film 116; therefore, oxygen can be effectively confined. Therefore, oxygen can be supplied to the semiconductors 107a, 108a, and 113 without being reduced. Therefore, oxygen vacancy in the semiconductors 107a, 108a, and 113 can be effectively reduced.

In this manner, the stack 10 including the transistor 100 is formed.

Note that part or the whole of this embodiment can be freely combined with, applied to, or replaced with part or the whole of another embodiment.

Embodiment 3

Another example of a structure of a transistor applicable to the transistor 100 included in the stack 10 is described.

Figure 9A:
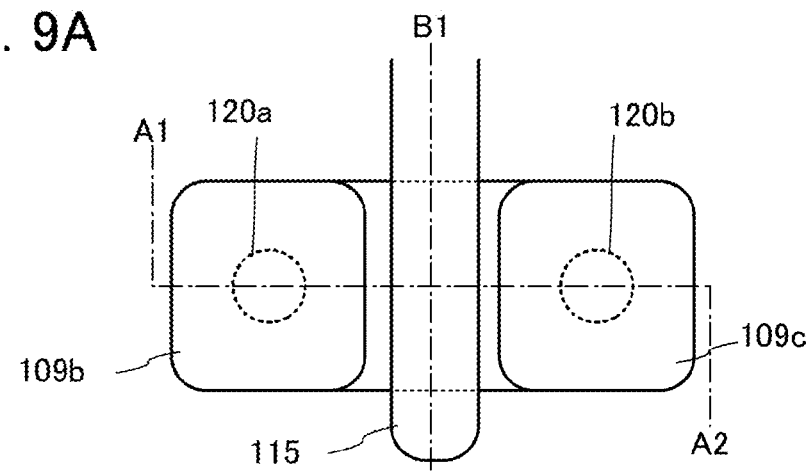
FIGS. 9A to 9C illustrate a structure example of a semiconductor device of an embodiment.
Figure 9B:
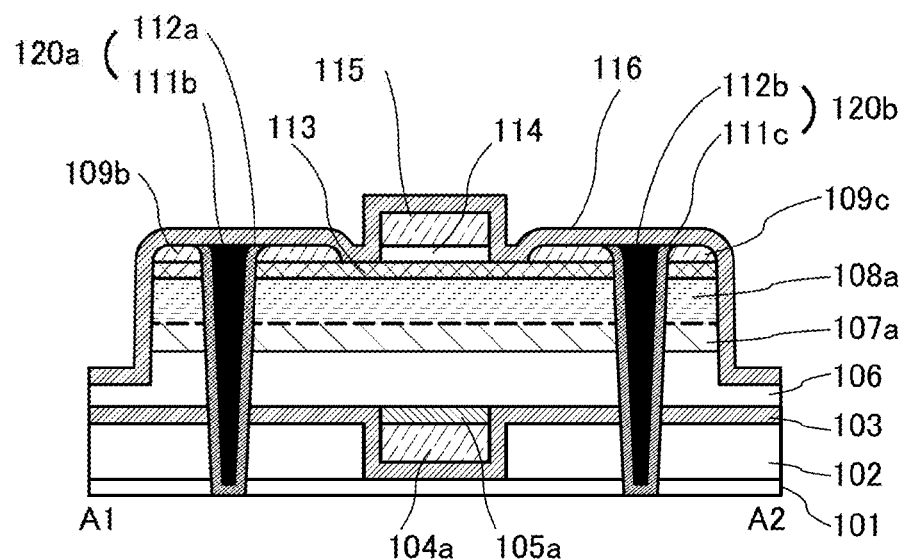
Figure 9C:
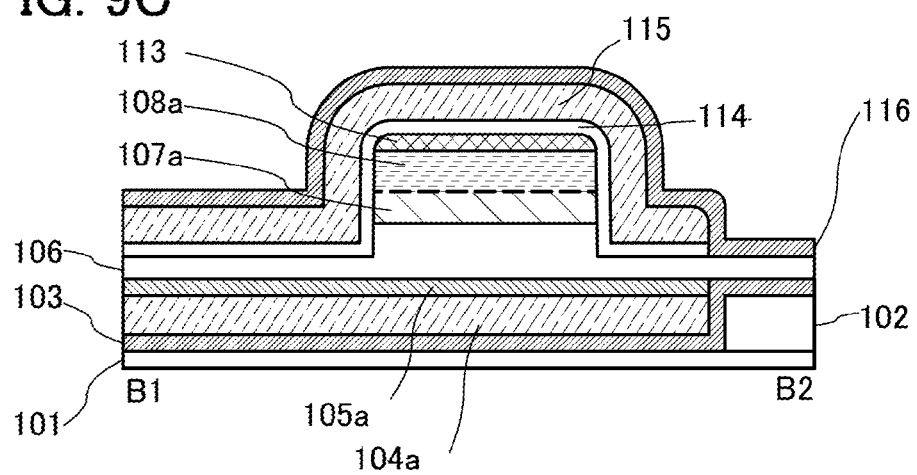

FIG. 9A is a schematic top view of a transistor, and FIGS. 9B and 9C are schematic cross-sectional views taken along section lines A1-A2 and B1-B2, respectively, in FIG. 9A. Note that FIG. 9B corresponds to a cross section of the transistor in the channel length direction, and FIG. 9C corresponds to a cross section of the transistor in the channel width direction.

FIGS. 9A to 9C illustrate an example in which the semiconductor 113 is provided between the conductors 109b and 109c and the semiconductor 108a, and the semiconductor 113 and the semiconductor 108a are processed using the same photomask to have substantially the same top shapes, unlike in the case of the transistor 100 in FIG. 1.

Figure 10A:
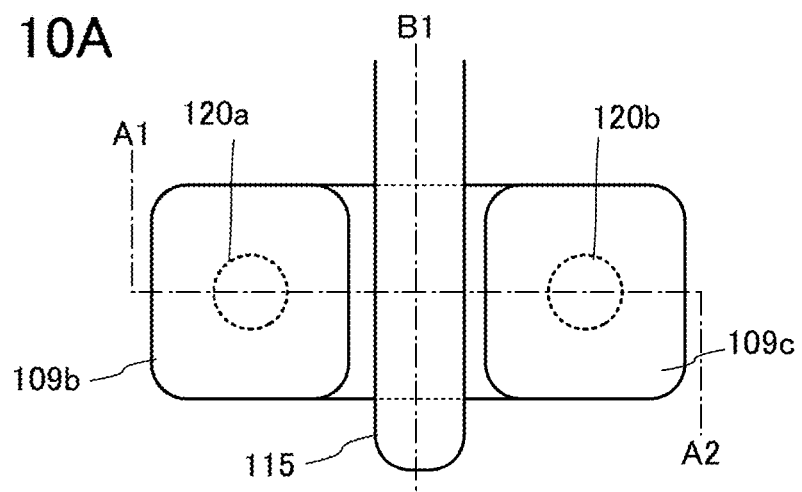
FIGS. 10A to 10C illustrate a structure example of a semiconductor device of an embodiment.
Figure 10B:
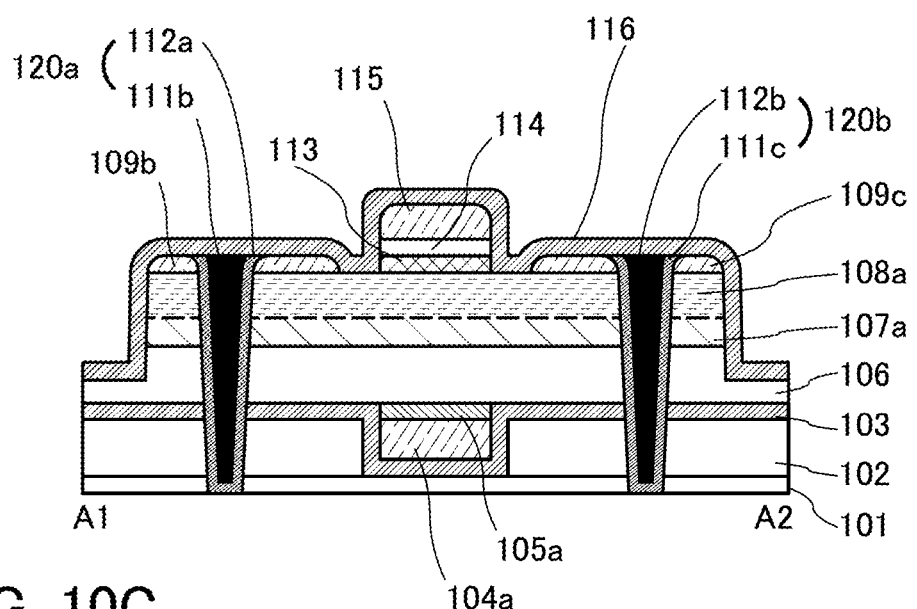
Figure 10C:
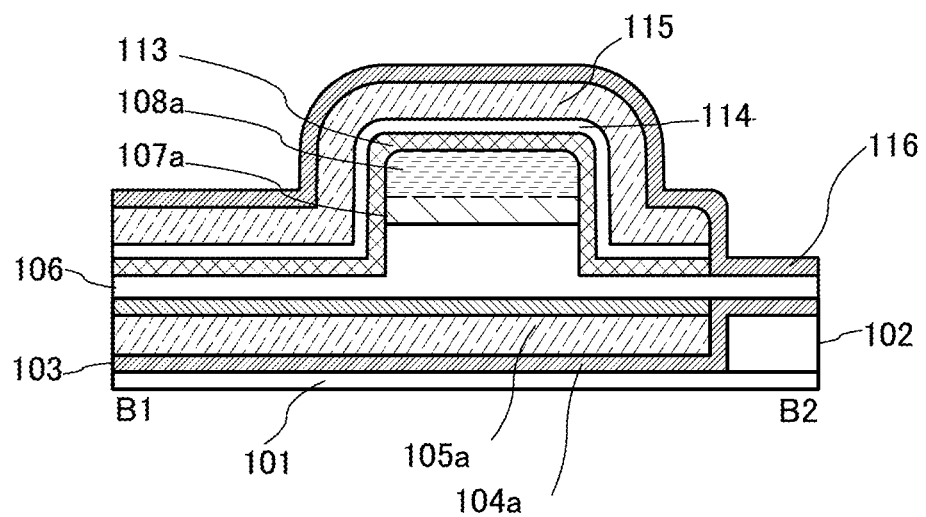

FIG. 10A is a schematic top view of a transistor, and FIGS. 10B and 10C are schematic cross-sectional views taken along section lines A1-A2 and B1-B2, respectively, in FIG. 10A. Note that FIG. 10B corresponds to a cross section of the transistor in the channel length direction, and FIG. 10C corresponds to a cross section of the transistor in the channel width direction.

FIGS. 10A to 10C illustrate an example in which the semiconductor 113, the insulator 114, and the conductor 115 are formed using the same mask to have substantially the same top shapes and not to overlap the conductor 109b and the conductor 109c, unlike in the case of the transistor 100 in FIG. 1.

Figure 11A:
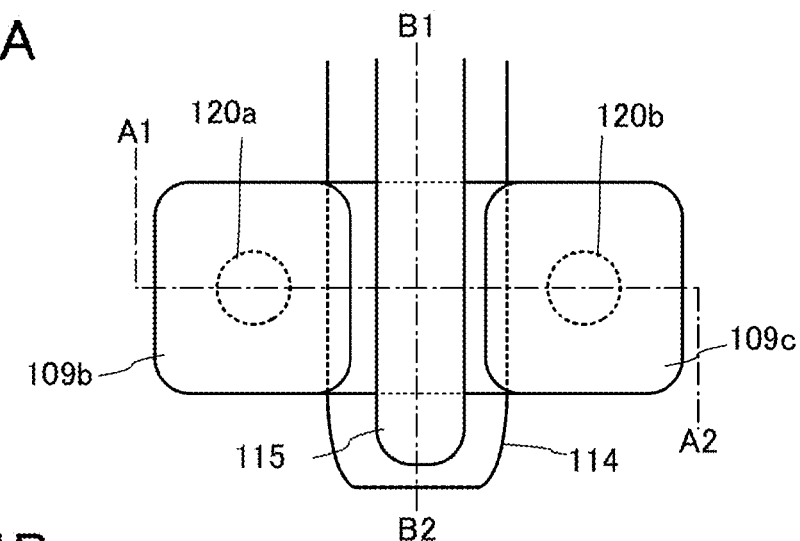
FIGS. 11A to 11C illustrate a structure example of a semiconductor device of an embodiment.
Figure 11B:
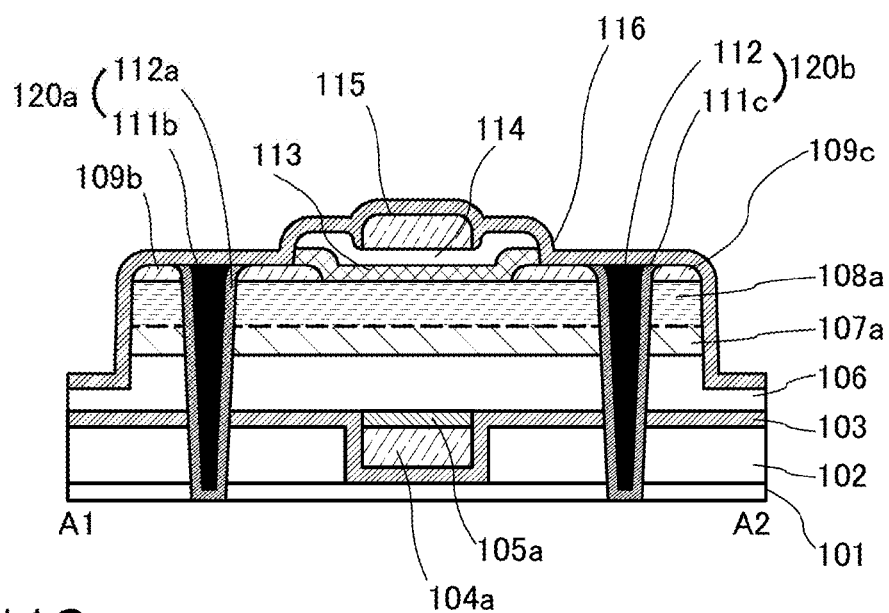
Figure 11C:
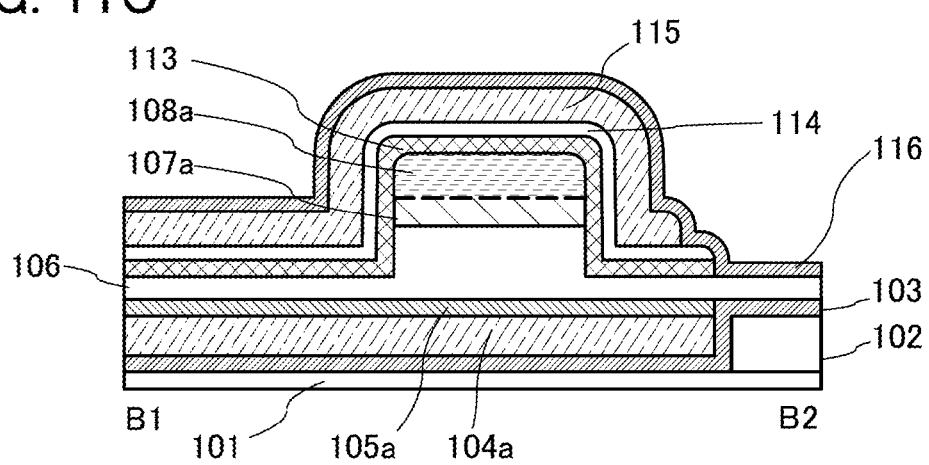

FIG. 11A is a schematic top view of a transistor, and FIGS. 11B and 11C are schematic cross-sectional views taken along section lines A1-A2 and B1-B2, respectively, in FIG. 11A. Note that FIG. 11B corresponds to a cross section of the transistor in the channel length direction, and FIG. 11C corresponds to a cross section of the transistor in the channel width direction.

FIGS. 11A to 11C illustrate an example in which the conductor 115 is formed not to overlap the conductor 109b and the conductor 109c, unlike in the case of the transistor 100 in FIG. 1.

Figure 12A:
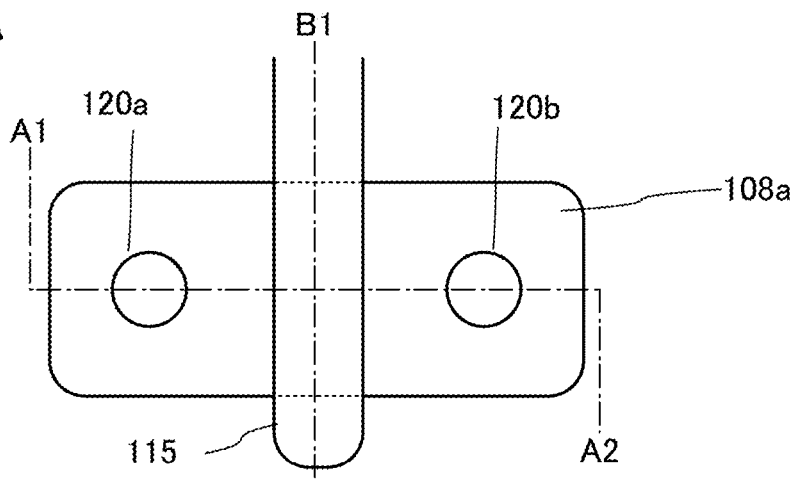
FIGS. 12A to 12C illustrate a structure example of a semiconductor device of an embodiment.
Figure 12B:
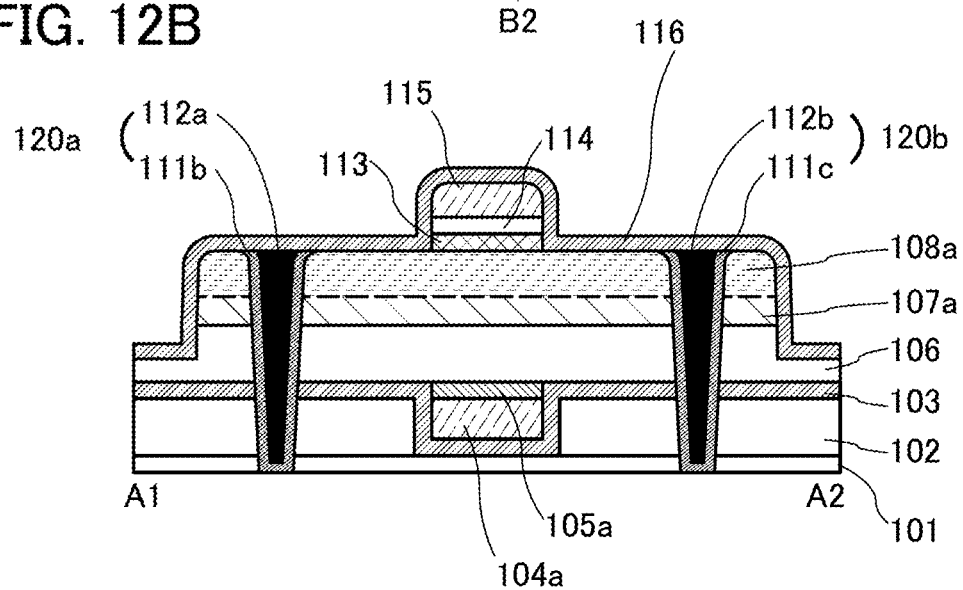
Figure 12C:
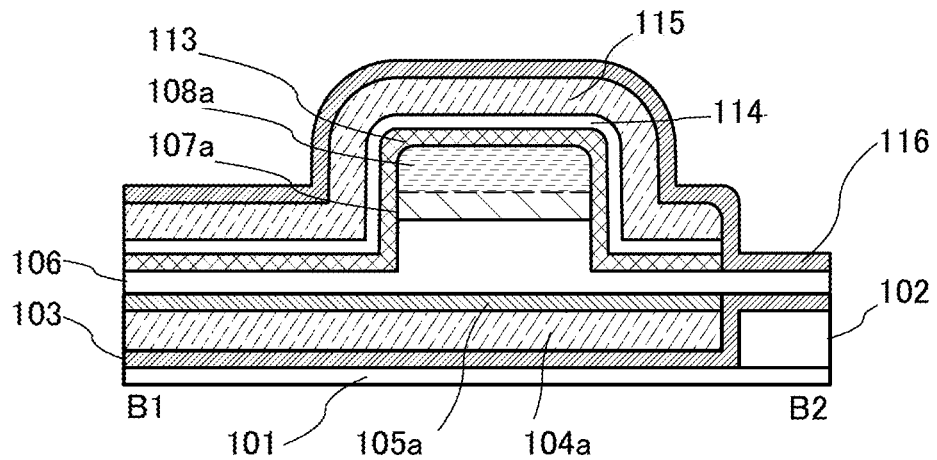

FIG. 12A is a schematic top view of a transistor, and FIGS. 12B and 12C are schematic cross-sectional views taken along section lines A1-A2 and B1-B2, respectively, in FIG. 12A. Note that FIG. 12B corresponds to a cross section of the transistor in the channel length direction, and FIG. 12C corresponds to a cross section of the transistor in the channel width direction.

FIGS. 12A to 12C illustrate an example in which the conductor 109b and the conductor 109c are not provided and the semiconductor 113, the insulator 114, and the conductor 115 are formed using the same photomask to have substantially the same top shapes, unlike in the case of the transistor 100 in FIG. 1.

Figure 13A:
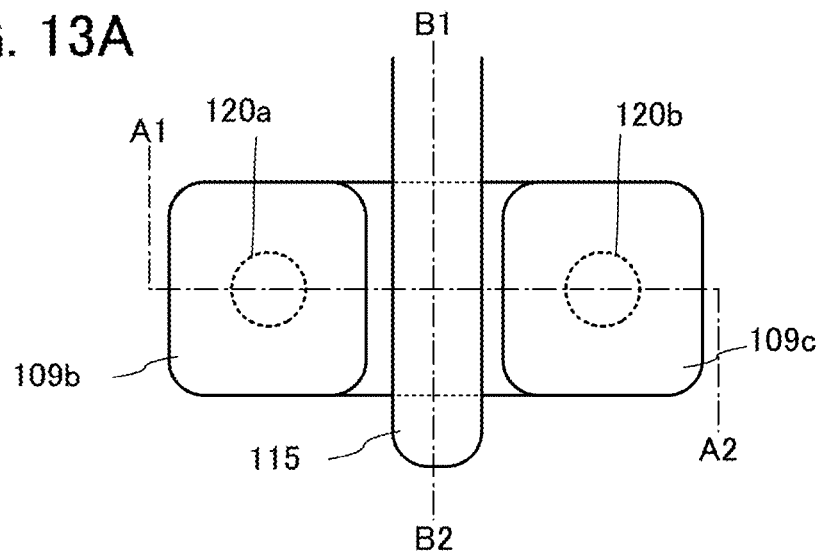
FIGS. 13A to 13C illustrate a structure example of a semiconductor device of an embodiment.
Figure 13B:
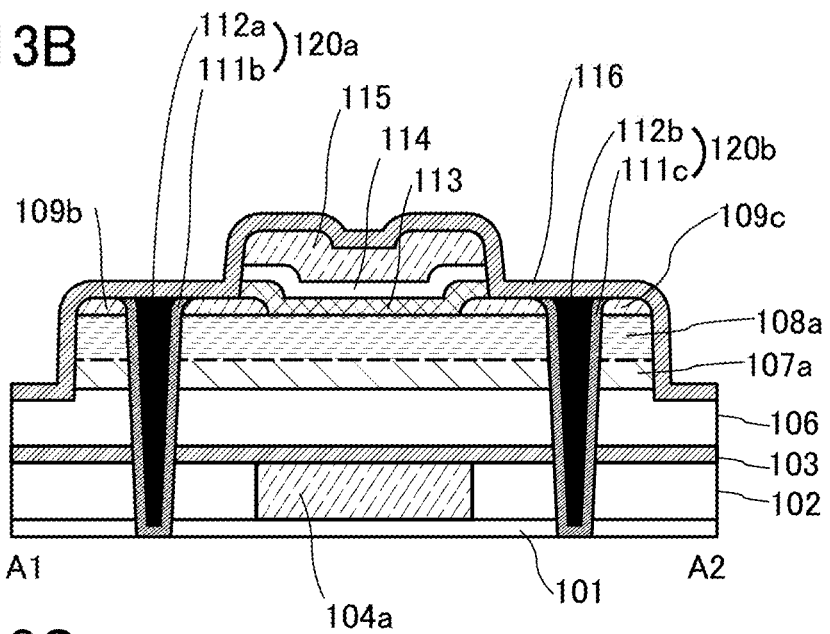
Figure 13C:
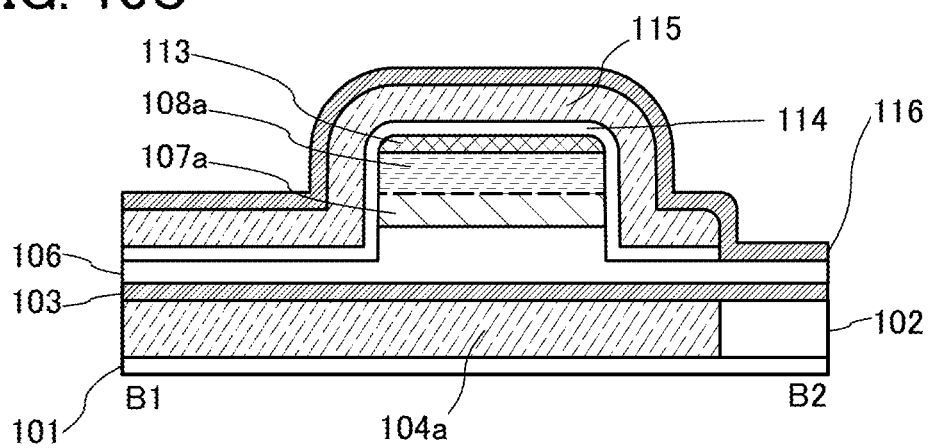

FIG. 13A is a schematic top view of a transistor, and FIGS. 13B and 13C are schematic cross-sectional views taken along section lines A1-A2 and B1-B2, respectively, in FIG. 13A. Note that FIG. 13B corresponds to a cross section of the transistor in the channel length direction, and FIG. 13C corresponds to a cross section of the transistor in the channel width direction.

FIGS. 13A to 13C illustrate an example in which the conductor 104a is in contact with the insulator 101, and the barrier film 103 is provided over the conductor 104a and the insulator 102, unlike in the case of the transistor 100 in FIG. 1.

In FIGS. 13A to 13C, an oxide semiconductor is preferably used for the conductor 104a. In this case, silicon nitride containing hydrogen is preferably used for the insulator 101. Contact of the oxide semiconductor with the silicon nitride containing hydrogen increases the conductivity of the oxide semiconductor layer.

In any of the transistors in FIGS. 9A to 9C, FIGS. 10A to 10C, FIGS. 11A to 11C, and FIGS. 12A to 12C, an impurity is preferably added to regions of the semiconductors 113, 108a, and 107a over which the conductor 115, the conductor 109b, and the conductor 109c are not provided so that the resistances of the regions are reduced. Examples of the impurity added to the semiconductors include argon, phosphorus, boron, nitrogen, aluminum, hydrogen, tungsten, chromium, manganese, vanadium, titanium, magnesium, and calcium. The addition of the impurity to the semiconductors can be performed by plasma treatment, an ion implantation method, or the like.

Note that in this specification and the like, the expression "having substantially the same top shapes" means that at least the outlines of stacked layers partly overlap with each other. For example, the case of patterning or partly patterning an upper layer and a lower layer with the use of the same mask pattern is included in the expression. The expression "having substantially the same top shapes" includes the case where the outlines do not completely overlap with each other; for example, an end portion of an upper layer may be positioned on an inner side than an end portion of a lower layer, or may be positioned on an outer side than the end portion of the lower layer.

As illustrated in FIG. 9C, the conductor 115 functioning as a gate electrode is provided so as to face the top and side surfaces of the semiconductor 108a in the cross section of the transistor in the channel width direction. Thus, a channel is formed not only in the vicinity of the top surface of the semiconductor 108a but also in the vicinity of the side surface of the semiconductor 108a, and the effective channel width is increased, which results in increased current in an on state (i.e., on-state current). In particular, in the case where the width of the semiconductor 108a is extremely small (for example, less than or equal to 50 nm, preferably less than or equal to 30 nm, further preferably less than or equal to 20 nm), a region where the channel is formed spreads inside the semiconductor 108a, so that the on-state current is increased as the transistor is miniaturized.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap each other, or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a top surface of a semiconductor is higher than the proportion of a channel region formed in a side surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that part or the whole of this embodiment can be freely combined with, applied to, or replaced with part or the whole of another embodiment.

Embodiment 4

Structure Example

Figure 7A:
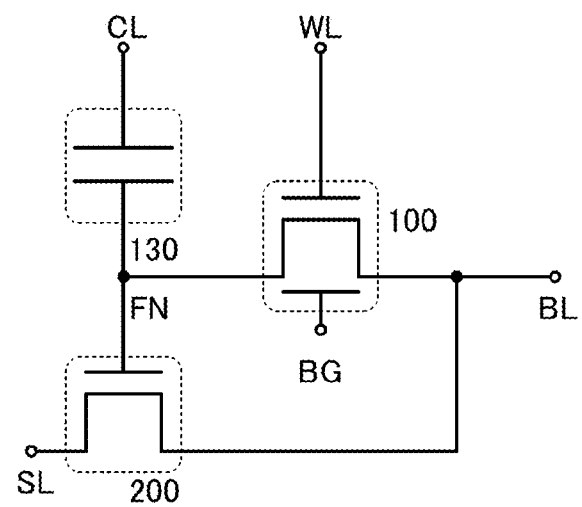
FIG. 7A is a circuit diagram of a semiconductor device of an embodiment and FIG. 7B illustrates a structure example of the semiconductor device.

FIG. 7A illustrates an example of a circuit diagram of a semiconductor device of one embodiment of the present invention. A semiconductor device shown in FIG. 7A includes a transistor 200, the transistor 100, a capacitor 130, a wiring BL, a wiring WL, a wiring CL, and a wiring BG.

In this embodiment, one mode of the stacked-layer structure illustrated in FIG. 2 is described. In this embodiment, a single crystal silicon semiconductor is used as the stack 20, the stack 10 is stacked over the stack 20, and a capacitor as the stack 30 is stacked thereover.

One of a source or a drain of the transistor 200 is electrically connected to the wiring BL, the other is electrically connected to the wiring SL, and a gate of the transistor 200 is electrically connected to one of a source and a drain of the transistor 100 and one electrode of the capacitor 130. The other of the source and the drain of the transistor 100 is electrically connected to the wiring BL, and a gate of the transistor 100 is electrically connected to the wiring WL. The other electrode of the capacitor 130 is electrically connected to the wiring CL. The wiring BG is electrically connected to a second gate of the transistor 100. Note that a node between the gate of the transistor 200, the one of the source and the drain of the transistor 100, and the one electrode of the capacitor 130 is referred to as a node FN.

In the semiconductor device illustrated in FIG. 7A, a potential corresponding to the potential of the wiring BL is supplied to the node FN when the transistor 100 is in an on state (i.e., is on). Meanwhile, in the semiconductor device, the potential of the node FN is retained when the transistor 100 is in an off state (i.e., is off). In other words, the semiconductor device illustrated in FIG. 7A functions as a memory cell of a memory device. Note that the semiconductor device illustrated in FIG. 7A can function as a pixel of a display device in the case where the semiconductor device includes a display element such as a liquid crystal element or an organic electroluminescence (EL) element electrically connected to the node FN.

The on/off state of the transistor 100 can be selected in accordance with the potential supplied to the wiring WL or the wiring BG. The threshold voltage of the transistor 100 can be controlled by a potential supplied to the wiring WL or the wiring BG. When a transistor with a low off-state current is used as the transistor 100, the potential of the node FN at the time when the transistor 100 is in a non-conduction state can be held for a long time. Thus, the refresh rate of the semiconductor device can be reduced, resulting in low power consumption of the semiconductor device. An example of the transistor with small off-state current is a transistor including an oxide semiconductor.

Note that a reference potential, a group potential, or a fixed potential such as an arbitrary fixed potential is supplied to the wiring CL. In that case, the apparent threshold voltage of the transistor 100 varies depending on the potential of the node FN. Conduction and non-conduction states of the transistor 200 change in response to the change in the apparent threshold voltage; thus, data of a potential retained in the node FN can be read as data.

To hold a potential retained in the node FN at 85° C. for 10 years ($3.15 \times 10^8$ seconds), off-state current is preferably lower than 4.3 yA (yoctoamperes, where 1 yA is $10^{-24}$ A) per femtofarad of capacitance and per micrometer of channel width of the transistor. In that case, the allowable potential variation in the node FN is preferably within 0.5 V. Alternatively, the off-state current is preferably lower than 1.5 yA at 95° C. In the semiconductor device of one embodiment of the present invention, the concentration of hydrogen contained in the layers under the barrier film is sufficiently reduced; thus, the transistor including an oxide semiconductor over the barrier film can have such extremely small off-state current.

The subthreshold swing value (S value) of the transistor including an oxide semiconductor is 66 mV/dec. or more, preferably 60 mV/dec. or more, further preferably 50 mV/dec. or more, and 200 mV/dec. or less, preferably 150 mV/dec. or less, further preferably 100 mV/dec. or less, still further preferably 80 mV/dec. As the S value is decreased, the off-state current at a particular voltage at which the transistor is turned off can be decreased.

When the semiconductor devices illustrated in FIG. 7A are arranged in a matrix, a memory device (memory cell array) can be formed.

Figure 7B:
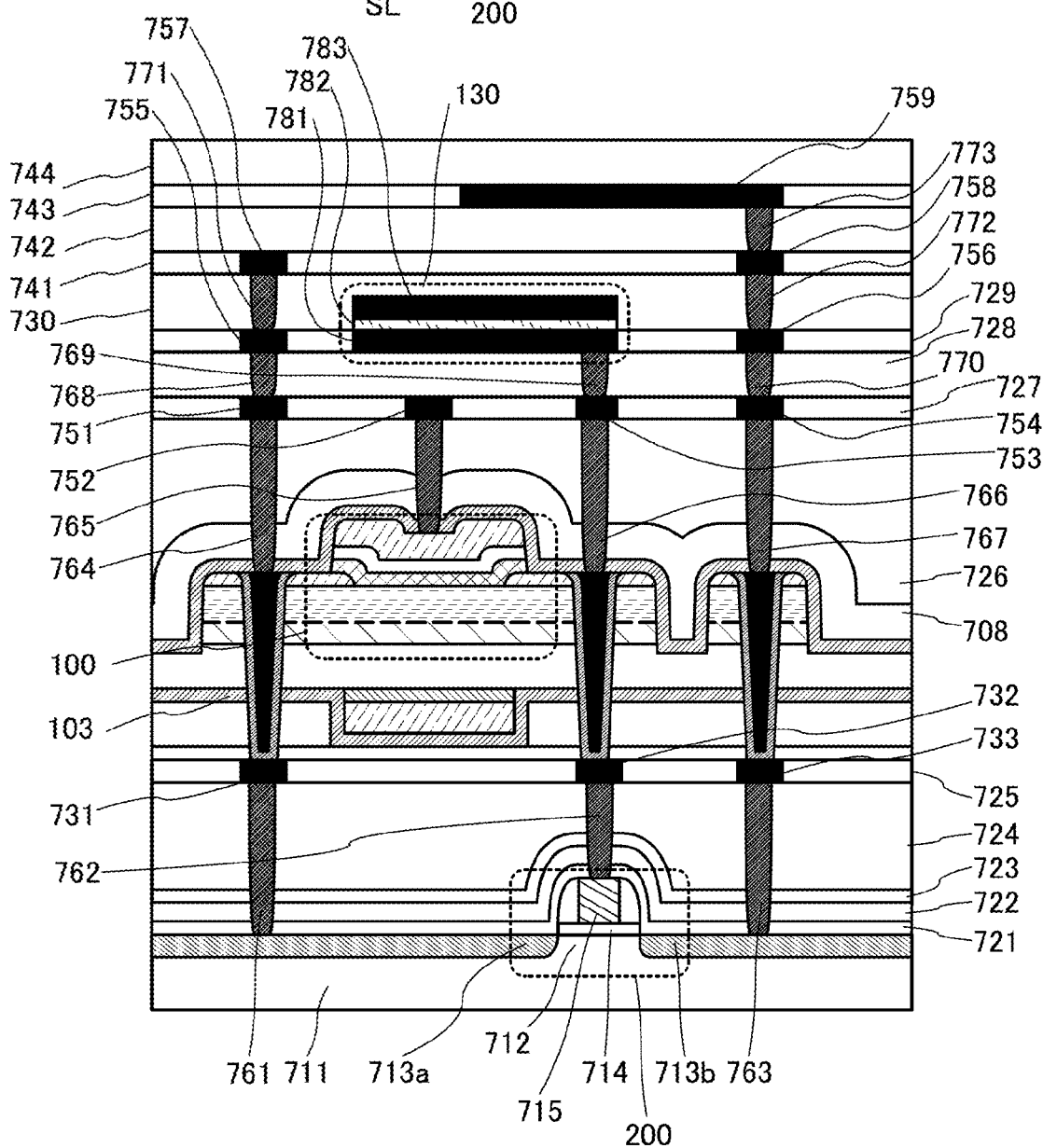

FIG. 7B illustrates an example of a cross-sectional structure of a semiconductor device in which the circuit illustrated in FIG. 7A can be obtained.

The semiconductor device includes the transistor 200, the transistor 100, and the capacitor 130. The transistor 100 is provided over the transistor 200, and the barrier film 103 is provided between the transistor 200 and the transistor 100.

The transistor 200 is provided on a semiconductor substrate 711 and includes a semiconductor 712 which is part of the semiconductor substrate 711, a gate insulating film 714, a gate electrode 715, and low-resistance regions 713a and 713b serving as source and drain regions.

The transistor 200 may be either a p-channel transistor or an n-channel transistor, and an appropriate transistor may be used depending on the circuit configuration or the driving method.

It is preferable that a region of the semiconductor 712 where a channel is formed, a region in the vicinity thereof, the low-resistance regions 713a and 713b serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 200 may be a high-electron-mobility transistor (HEMT) with GaAs and AlGaAs or the like.

The low-resistance regions 713a and 713b contain an element which imparts n-type conductivity, such as phosphorus, or an element which imparts p-type conductivity, such as boron, in addition to a semiconductor material used for the semiconductor 712.

The gate electrode 715 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and it is particularly preferable to use tungsten.

Here, the structure including the transistor 200 corresponds to part of the stack 20 in FIG. 2.

Figure 8:
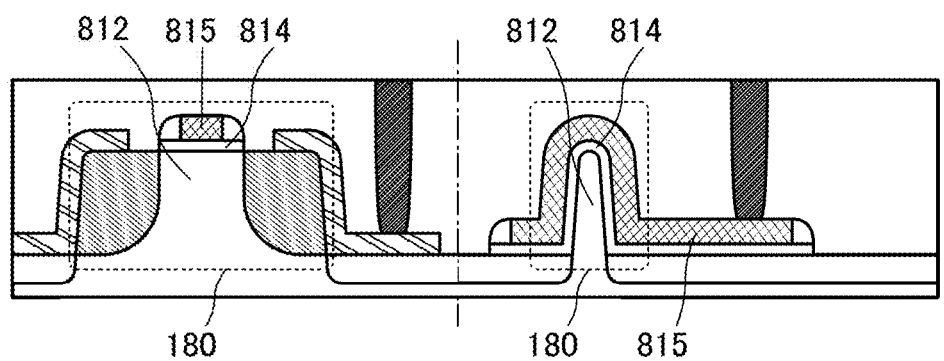
FIG. 8 illustrates a structure example of a semiconductor device of an embodiment.

Here, a transistor 180 illustrated in FIG. 8 may be used instead of the transistor 200. FIG. 8 illustrates a cross section of the transistor 180 in the channel length direction on the left side and a cross section thereof in the channel width direction on the right side. In the transistor 180 illustrated in FIG. 8, a semiconductor film 812 (part of the semiconductor substrate) in which a channel is formed has a protrusion, and a gate insulating film 814, a gate electrode 815 are provided along top and side surfaces of the protrusion. The transistor 180 having such a shape is also referred to as a FIN transistor because it utilizes a protruding portion of the semiconductor substrate. Note that an insulating film serving as a mask for forming the protruding portion may be provided in contact with the top of the protruding portion. Although the case where the protruding portion is formed by processing part of the semiconductor substrate is described here, a semiconductor having a protrusion may be formed by processing an SOI substrate.

An insulator 721, an insulator 722, an insulator 723, and an insulator 724 are stacked in this order to cover the transistor 200.

In a manufacturing process of the semiconductor device, the insulator 721 functions as a protective film to activate an element imparting conductivity that is added to the low-resistance regions 713a and 713b. Note that the insulator 721 is not necessarily provided.

In the case where a silicon-based semiconductor material is used for the semiconductor 712, the insulator 722 preferably contains hydrogen. When the insulator 722 containing hydrogen is provided over the transistor 200 and heat treatment is performed, dangling bonds in the semiconductor 712 are terminated by hydrogen contained in the insulator 722, whereby the reliability of the transistor 200 can be improved.

A silicon nitride film or the like is preferably used as the insulator 723. The insulator 723 also functions as a barrier film for preventing hydrogen that is released from the insulator 722 from diffusing upward.

The insulator 724 functions as a planarization film for eliminating a level difference caused by the transistor 200 or the like underlying the insulator 724. The top surface of the insulator 724 may be planarized by a chemical mechanical polishing (CMP) method or the like in order to increase the planarity.

An undoped silicate glass (USG) film which is formed by a HDP-CVD method, an atmospheric pressure CVD method, or the like may be used as the insulator 724. Alternatively, a borophosphosilicate glass (BPSG) film or a borosilicate glass (BSG) film may be used. For example, a BSG film or a BPSG film may be deposited by a CVD method using a silane gas, a TEOS gas, an ozone gas, an oxygen gas, phosphine, diborane, triethyl borate, trimethyl borate, triethyl phosphate, trimethyl phosphate, trimethyl phosphite, or the like. The planarity of the USG film, the BPSG film, the BSG film, or the like may be improved by reflow using heat treatment or a CMP method.

Plugs 761 and 763 electrically connected to the low-resistance region 713a, the low-resistance 713b, or the like; a plug 762 electrically connected to the gate electrode 715 of the transistor 200; or the like may be embedded in the insulator 721, the insulator 722, the insulator 723, and the insulator 724.

A wiring 731, a wiring 732, a wiring 733, and the like are provided over the insulator 724.

The wiring 731 is electrically connected to the plug 761. The wiring 732 is electrically connected to the plug 762. The wiring 733 is electrically connected to the plug 763.

The wirings 731, 732, 733, and the like can be formed using a conductive material such as a metal material, an alloy material, or a metal oxide material. It is particularly preferable to use a high-melting-point material that has both heat resistance and conductivity, such as tungsten or molybdenum, and it is particularly preferable to use tungsten.

Furthermore, the wiring 731, the wiring 732, the wiring 733, and the like are embedded in an insulator 725, and the respective top surfaces of the insulator 725, the wiring 731, the wiring 732, the wiring 733, and the like are preferably planarized.

The stack 10 is stacked over the stack 20.

The stack 30 is provided over the stack 10. An insulator 726 covering the stack 10 including the transistor 100 functions as a planarization layer which covers an uneven surface shape of an underlying layer. An insulator 708 may function as a protective film at the time of forming the insulator 726. The insulator 708 is not necessarily provided if not needed.

A plug 764 electrically connected to the conductor 109b, a plug 765 electrically connected to the conductor 115, a plug 766 electrically connected to the gate electrode 715 and the conductor 109c, a plug 767 electrically connected to the low-resistance region 713b of the transistor 200, and the like are embedded in the barrier film 116, the insulator 708, and the insulator 726.

A wiring 751 electrically connected to the plug 764, a wiring 752 electrically connected to the plug 765, a wiring 753 electrically connected to the plug 766, a wiring 754 electrically connected to the plug 767, and the like are provided over the insulator 726.

Furthermore, the wiring 751, the wiring 752, the wiring 753, the wiring 754, and the like are embedded in an insulator 727, and the respective top surfaces of the wiring 751, the wiring 752, the wiring 753, the wiring 754, the insulator 727, and the like are preferably planarized.

An insulator 728 is provided over the insulator 727. A plug 768 electrically connected to the wiring 751, a plug 769 electrically connected to the wiring 753, a plug 770 electrically connected to the wiring 754, and the like are provided in the insulator 728.

A wiring 755 electrically connected to the plug 768, an electrode 781 electrically connected to the plug 769, a wiring 756 electrically connected to the plug 770, and the like are provided over the insulator 728. Note that part of the electrode 781 functions as a wiring.

Furthermore, the wiring 755, the wiring 756, the electrode 781, and the like are embedded in an insulator 729, and the respective top surfaces of the wiring 755, the wiring 756, the electrode 781, the insulator 729, and the like are preferably planarized.

An insulator 782 is provided over and in contact with the electrode 781, and an electrode 783 is provided over and in contact with the insulator 782. The electrode 781, the insulator 782, and the electrode 783 form the capacitor 130. Note that part of the electrode 783 functions as a wiring.

An insulator 730 is provided over the insulator 729, and the capacitor 130 is embedded in the insulator 730. A plug 771 electrically connected to the wiring 755, a plug 772 electrically connected to the wiring 756, and the like are provided in the insulator 730.

A wiring 757 electrically connected to the plug 771, a wiring 758 electrically connected to the plug 772, and the like are provided over the insulator 730.

Furthermore, the wiring 757, the wiring 758, and the like are embedded in an insulator 741, and the respective top surfaces of the wiring 757, the wiring 758, the insulator 741, and the like are preferably planarized.

An insulator 742 is provided over the insulator 741. A plug 773 electrically connected to the wiring 758, and the like are provided in the insulator 742.

A wiring 759 electrically connected to the plug 773 is provided over the insulator 742.

Furthermore, the wiring 759 is embedded in an insulator 743, and the respective top surfaces of the wiring 759, the insulator 743, and the like are preferably planarized.

An insulator 744 is provided over the insulator 743.

In FIG. 7B, the wiring 757 corresponds to the wiring BL illustrated in FIG. 7A. In a similar manner, the wiring 752 corresponds to the wiring WL, the electrode 783 corresponds to the wiring CL, and the conductor 104a and the barrier film 105a corresponds to the wiring BG. Furthermore, a node including the gate electrode 715 of the transistor 200, the electrode 781 of the capacitor 130, and the conductor 109c of the transistor 100 corresponds to the node FN in FIG. 7A.

The semiconductor device of one embodiment of the present invention includes the transistor 200, the transistor 100 over the transistor 200, and the capacitor 130 positioned over the transistor 100. Since the transistors and the capacitor are stacked, the area occupied by the elements can be reduced. Furthermore, the barrier film 103 provided between the transistor 200 and the transistor 100 can inhibit diffusion of impurities such as water and hydrogen from an underlying layer to the transistor 100 side.

Although the example in which the capacitor 130 is provided over the transistor 100 is described in this embodiment, the capacitor 130 may be provided in another position. For example, the capacitor 130 may be provided between the transistor 200 and the transistor 100. The electrode of the capacitor 130 may be formed using a metal or a semiconductor material. As the semiconductor material, polycrystalline silicon to which an impurity is added is preferably used.

Note that part or the whole of this embodiment can be freely combined with, applied to, or replaced with part or the whole of another embodiment.

Embodiment 5

An oxide semiconductor that can be favorably used for a semiconductor of a semiconductor device of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electric characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an In—Ga—Zn-based oxide means an oxide containing In, Ga, and Zn as its main components and there is no particular limitation on the ratio of In, Ga, and Zn. The In—Ga—Zn-based oxide may contain another metal element in addition to In, Ga, and Zn.

Alternatively, a material represented by $In_{1+\alpha}M_{1-\alpha}O_3(ZnO)_m$ ($-1 \leq \alpha \leq 1$, $m > 0$, and m is not an integer) may be used as the oxide semiconductor. Note that M represents one or more metal elements selected from Ga, Fe, Mn, and Co, or the above-described element as a stabilizer. Alternatively, as the oxide semiconductor, a material represented by a chemical formula, $In_2SnO_5(ZnO)_n$ ($n > 0$, and n is an integer) may be used.

For example, In—Ga—Zn-based oxide having an atomic ratio of In:Ga:Zn=1:1:1, 1:3:2, 1:3:4, 1:3:6, 3:1:2, or 2:1:3, or an oxide whose composition is in the neighborhood of the above compositions may be used.

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancy increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1 \times 10^{17}/cm^3$, lower than or equal to $1 \times 10^{16}/cm^3$, lower than or equal to $1 \times 10^{15}/cm^3$, lower than or equal to $1 \times 10^{14}/cm^3$, or lower than or equal to $1 \times 10^{13}/cm^3$.

Thus, the transistor including an i-type or substantially i-type oxide semiconductor film can have extremely favorable off-state current characteristics. For example, the drain current at the time when the transistor including an oxide semiconductor film is in an off-state can be less than or equal to $1 \times 10^{-18}$ A, preferably less than or equal to $1 \times 10^{-21}$ A, further preferably less than or equal to $1 \times 10^{-24}$ A at room temperature (about 25° C.); or less than or equal to $1 \times 10^{-15}$ A, preferably less than or equal to $1 \times 10^{-18}$ A, further preferably less than or equal to $1 \times 10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 14A:
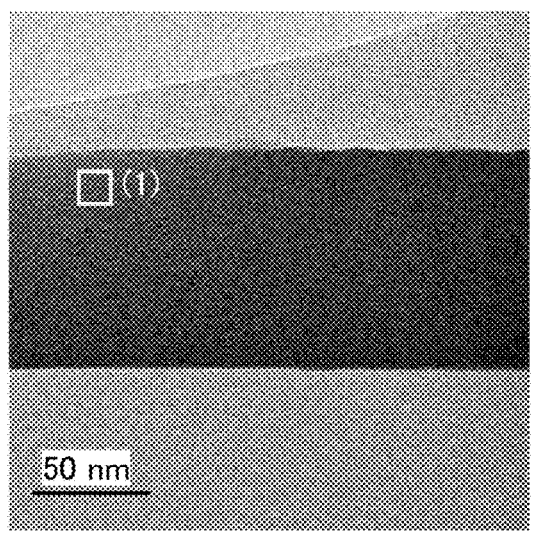
FIGS. 14A to 14D are Cs-corrected high-resolution TEM images of a cross section of a CAAC-OS and a cross-sectional schematic view of a CAAC-OS.

The CAAC-OS observed with a TEM is described below. FIG. 14A shows an example of a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 14B:
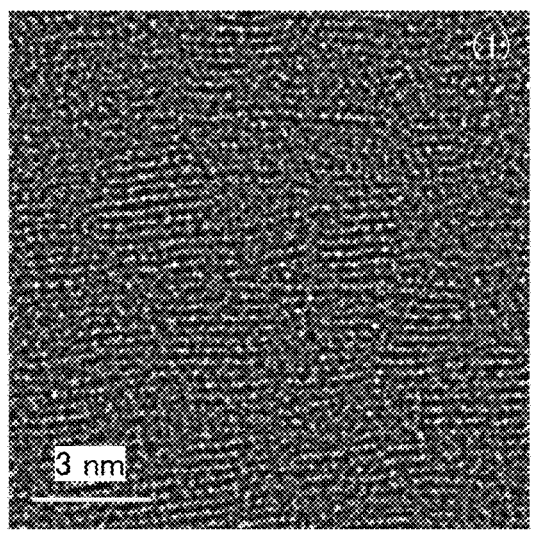

FIG. 14B is an enlarged Cs-corrected high-resolution TEM image of a region (1) in FIG. 14A. FIG. 14B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS, and is arranged parallel to the formation surface or the top surface of the CAAC-OS.

Figure 14C:
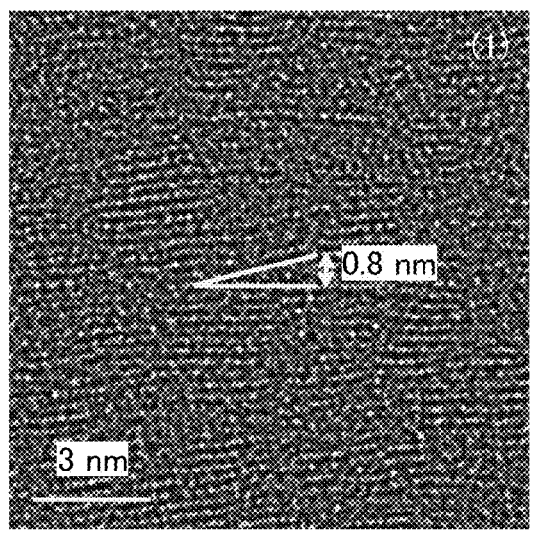

As shown in FIG. 14B, the CAAC-OS has a characteristic atomic arrangement. The characteristic atomic arrangement is denoted by an auxiliary line in FIG. 14C. FIGS. 14B and 14C prove that the size of a pellet is approximately 1 nm to 3 nm, and the size of a space caused by tilt of the pellets is approximately 0.8 nm. Therefore, the pellet can also be referred to as a nanocrystal (nc).

Figure 14D:
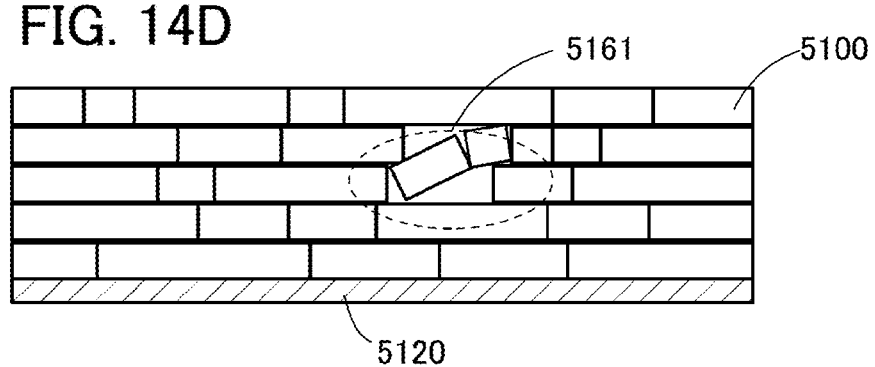

Here, according to the Cs-corrected high-resolution TEM images, the schematic arrangement of pellets 5100 of a CAAC-OS over a substrate 5120 is illustrated by such a structure in which bricks or blocks are stacked (see FIG. 14D). The part in which the pellets are tilted as observed in FIG. 14C corresponds to a region 5161 shown in FIG. 14D.

FIG. 15A shows a Cs-corrected high-resolution TEM image of a plane of the CAAC-OS observed from a direction substantially perpendicular to the sample surface. FIGS. 15B, 15C, and 15D are enlarged Cs-corrected high-resolution TEM images of regions (1), (2), and (3) in FIG. 15A, respectively. FIGS. 15B, 15C, and 15D indicate that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 16A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 16B, a peak is not clearly observed. In contrast, in the case of a single crystal oxide semiconductor of $InGaZnO_4$, when φ scan is performed with 2θ fixed at around 56°, as shown in FIG. 16C, six peaks which are derived from crystal planes equivalent to the (110) plane are observed. Accordingly, the structural analysis using XRD shows that the directions of a-axes and b-axes are different in the CAAC-OS.

Figure 17A:
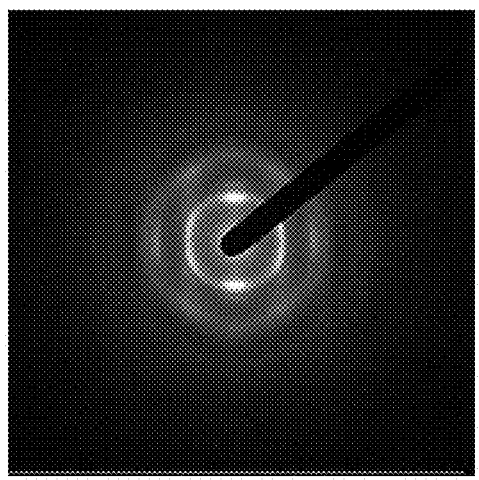
FIGS. 17A and 17B show electron diffraction patterns of a CAAC-OS.
Figure 17B:
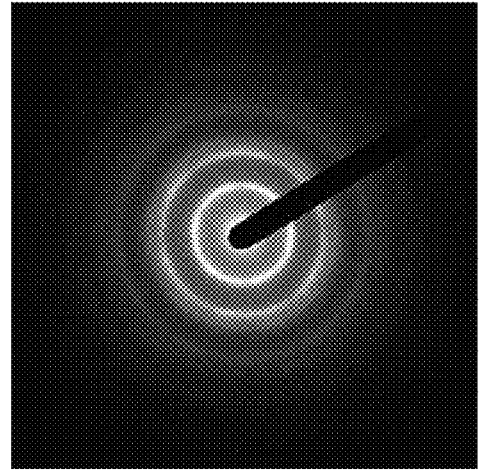

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 17A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 17B shows a diffraction pattern obtained in such a manner that an electron beam with a probe diameter of 300 nm is incident on the same sample in a direction perpendicular to the sample surface. As shown in FIG. 17B, a ring-like diffraction pattern is observed. Thus, the electron diffraction also indicates that the a-axes and b-axes of the pellets included in the CAAC-OS do not have regular alignment. The first ring in FIG. 17B is considered to be derived from the (010) plane, the (100) plane, and the like of the $InGaZnO_4$ crystal. The second ring in FIG. 17B is considered to be derived from the (110) plane and the like.

Moreover, the CAAC-OS is an oxide semiconductor having a low density of defect states. Defects in the oxide semiconductor are, for example, a defect due to impurity and oxygen vacancy. Therefore, the CAAC-OS can be regarded as an oxide semiconductor with a low impurity concentration, or an oxide semiconductor having a small amount of oxygen vacancy.

The impurity contained in the oxide semiconductor might serve as a carrier trap or serve as a carrier generation source. Furthermore, oxygen vacancy in the oxide semiconductor serves as a carrier trap or serves as a carrier generation source when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. A charge trapped by the carrier traps in the oxide semiconductor takes a long time to be released. The trapped charge may behave like a fixed charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.
<Microcrystalline Oxide Semiconductor>

Next, a microcrystalline oxide semiconductor is described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.
<Amorphous Oxide Semiconductor>

Next, an amorphous oxide semiconductor is described.

The amorphous oxide semiconductor is such an oxide semiconductor having disordered atomic arrangement and no crystal part. For example, the amorphous oxide semiconductor does not have a specific state as in quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.
<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (Sample A), an nc-OS (Sample B), and a CAAC-OS (Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In—O layers and six Ga—Zn—O layers are stacked in the c-axis direction. The spacing between these adjacent layers is equivalent to the lattice spacing on the (009) plane (also referred to as d value). The value is calculated to 0.29 nm from crystal structure analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 18:
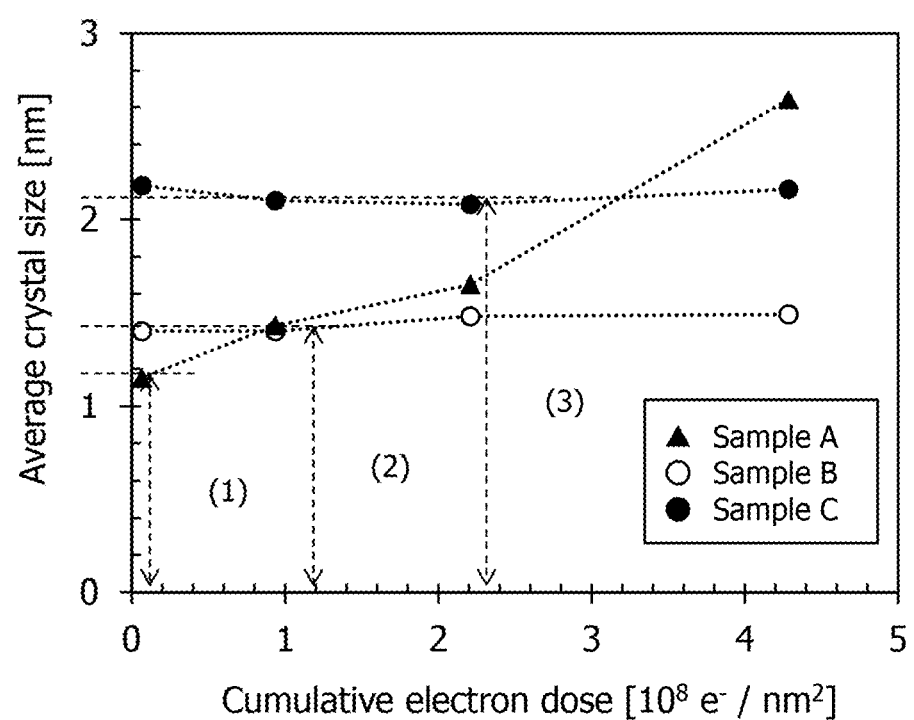
FIG. 18 shows a change of crystal parts of an In—Ga—Zn oxide owing to electron irradiation.

FIG. 18 shows change in the average size of crystal parts (at 22 points to 45 points) in each sample. Note that the crystal part size corresponds to the length of a lattice fringe. FIG. 18 indicates that the crystal part size in the a-like OS increases with an increase in the cumulative electron dose. Specifically, as shown by (1) in FIG. 18, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 18, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor layer.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 19A:
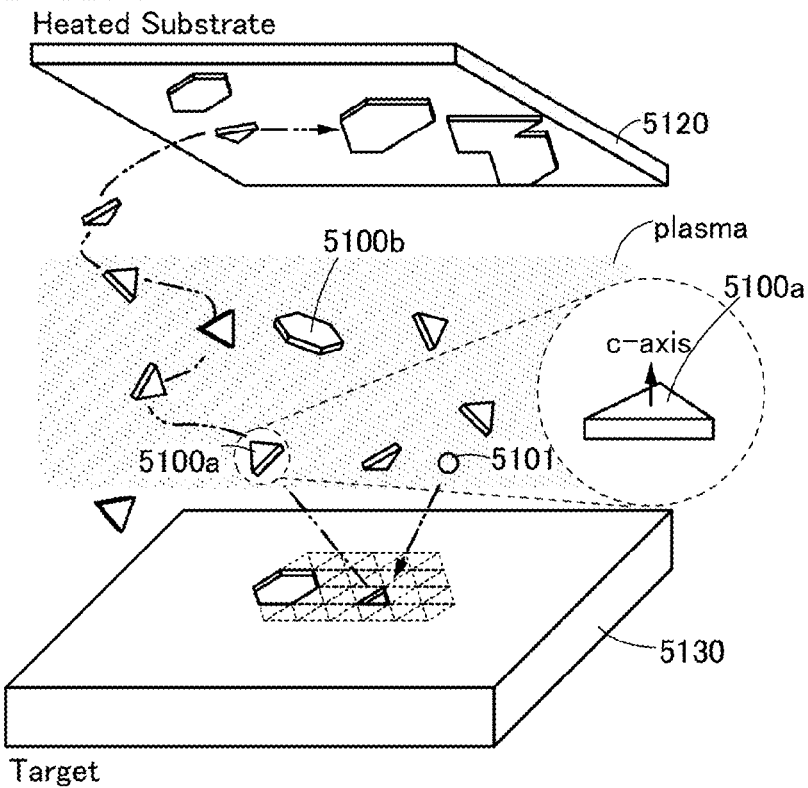
FIGS. 19A and 19B are schematic views showing deposition models of a CAAC-OS and an nc-OS.

FIG. 19A is a schematic view of the inside of a deposition chamber where a CAAC-OS is deposited by a sputtering method.

A target 5130 is attached to a backing plate. A plurality of magnets are provided to face the target 5130 with the backing plate positioned therebetween. The plurality of magnets generate a magnetic field. A sputtering method in which the disposition speed is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

Figure 20A:
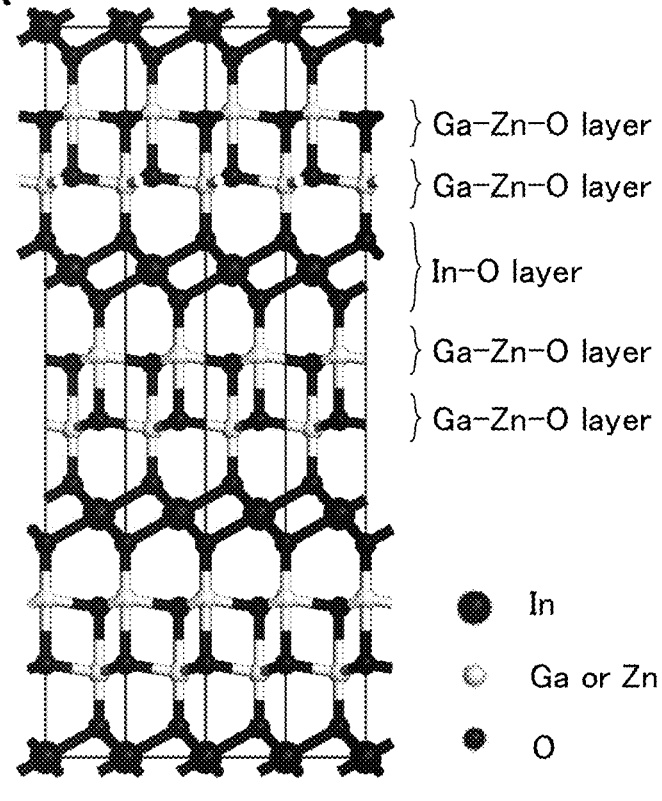
FIGS. 20A to 20C show an InGaZnO$_4$ crystal and a pellet.

Here, the target 5130 has a polycrystalline structure which includes a plurality of crystal grains and in which a cleavage plane exists in at least one crystal grain. FIG. 20A shows a structure of an InGaZnO$_4$ crystal included in the target 5130 as an example. Note that FIG. 20A shows a structure of the case where the InGaZnO$_4$ crystal is observed from a direction parallel to the b-axis when the c-axis is in an upward direction. FIG. 20A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 20B:
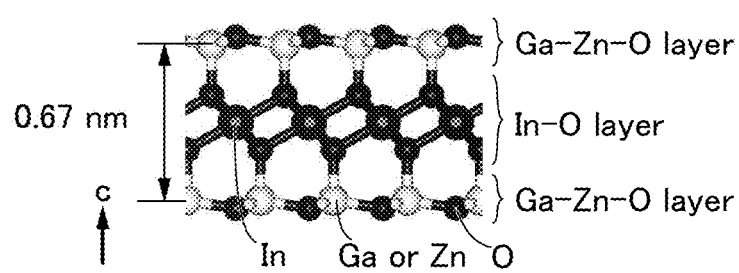
Figure 20C:
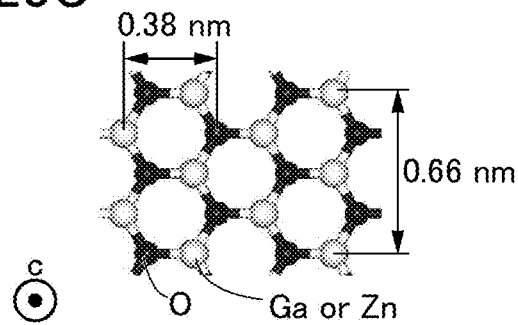

The thickness of the pellet 5100 is determined depending on the kind of deposition gas and the like. The thicknesses of the pellets 5100 are preferably uniform; the reasons thereof are described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 18. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 20B is separated. Note that FIG. 20C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, an oxygen atom positioned on its side surface may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 18 corresponds to the amount of growth in plasma. Here, in the case where the temperature of the substrate 5120 is at around room temperature, the pellet 5100 on the substrate 5120 hardly grows; thus, an nc-OS is formed (see FIG. 19B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 19B:
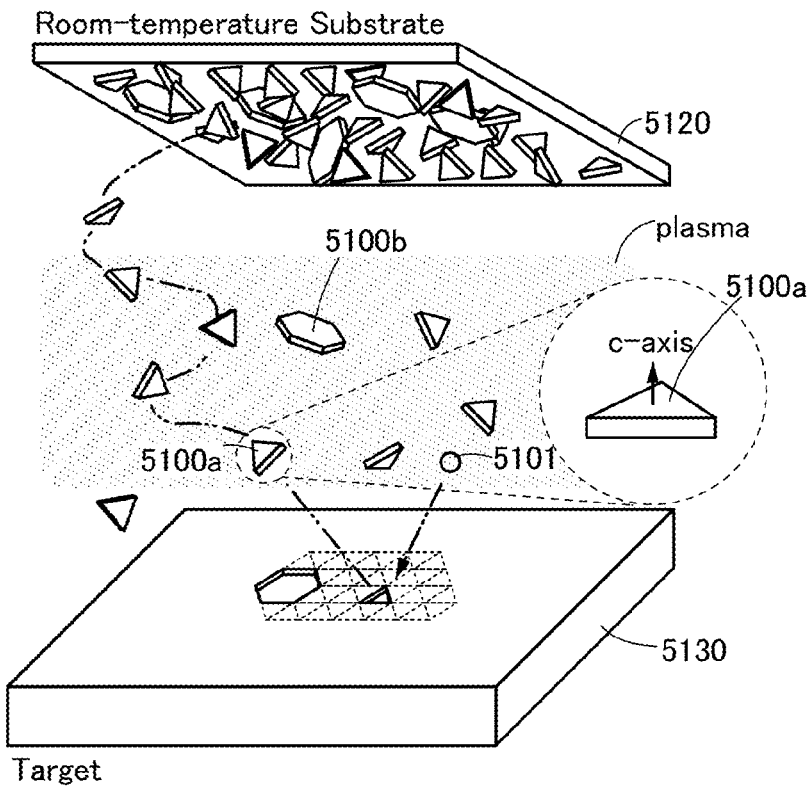

As shown in FIGS. 19A and 19B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 19A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where the flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS is filled in some cases; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 21A to 21D are cross-sectional schematic views.

Figure 21A:
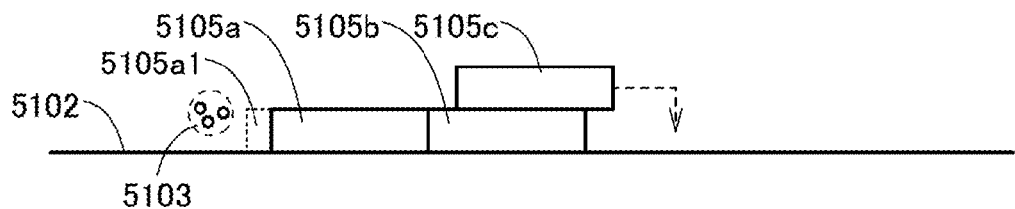
FIGS. 21A to 21D are schematic views illustrating a deposition model of a CAAC-OS.

As illustrated in FIG. 21A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 21B:
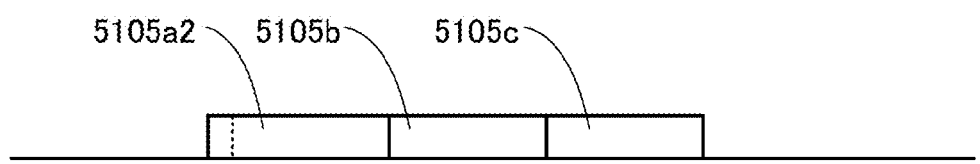

Then, as illustrated in FIG. 21B, the region 5105a1 grows to part of the pellet 5105a to form a pellet 5105a2. In addition, a side surface of the pellet 5105c is in contact with another side surface of the pellet 5105b.

Figure 21C:
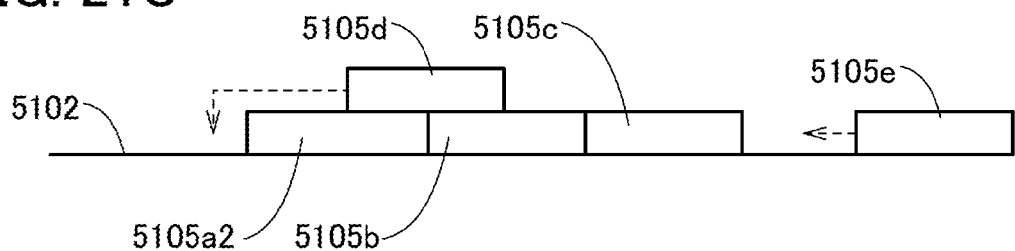

Next, as illustrated in FIG. 21C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 21D:
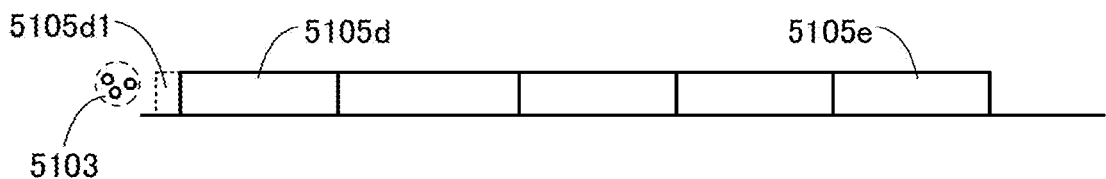

Then, as illustrated in FIG. 21D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 18 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. Therefore, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

It is considered that as shown in such a model, the pellets 5100 are deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the film formation surface has unevenness, a CAAC-OS with high crystallinity can be formed.

Since the CAAC-OS is deposited in accordance with such a model, the sputtered particle preferably has a pellet shape with a small thickness. Note that when the sputtered particles has a dice shape with a large thickness, planes facing the substrate 5120 vary, which may lead to formation of a film whose thickness or crystal alignment is not uniformed.

According to the deposition model described above, a CAAC-OS with high crystallinity can be formed even on a film formation surface with an amorphous structure.

At least part of this embodiment can be implemented in combination with any of the embodiments described in this specification as appropriate.

Embodiment 6

In this embodiment, an example of a circuit including the transistor of one embodiment of the present invention is described with reference to drawings.

Circuit Configuration Example

When a connection between transistors, wirings, or electrodes is changed from that described in the above embodiment, a variety of circuits can be formed. Examples of circuit configurations that can be achieved by using a semiconductor device of one embodiment of the present invention are shown below.
[CMOS Circuit]

Figure 22A:
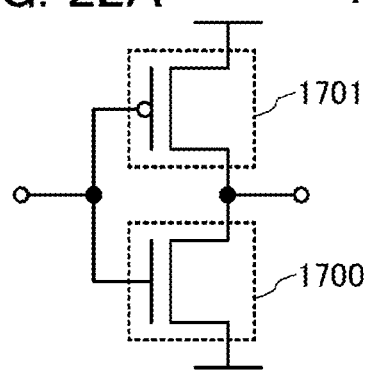
FIGS. 22A to 22D are each a circuit diagram illustrating an embodiment.

A circuit diagram in FIG. 22A shows a configuration of a so-called CMOS circuit in which a p-channel transistor 1701 and an n-channel transistor 1700 are connected to each other in series and in which gates of them are connected to each other. Note that transistors in which an oxide semiconductor is used as a semiconductor are denoted by "OS" in drawings.
[Analog Switch]

Figure 22B:
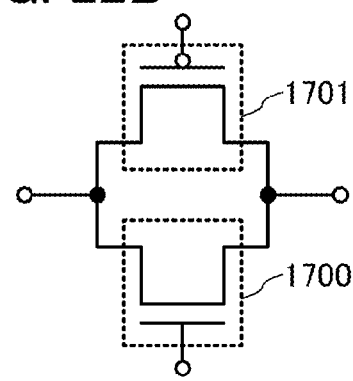

A circuit diagram in FIG. 22B shows a configuration in which sources of the transistors 1700 and 1701 are connected to each other and drains of the transistors 1700 and 1701 are connected to each other. With such a configuration, the transistors can function as a so-called analog switch.
[Example of Memory Device]

Figure 22C:
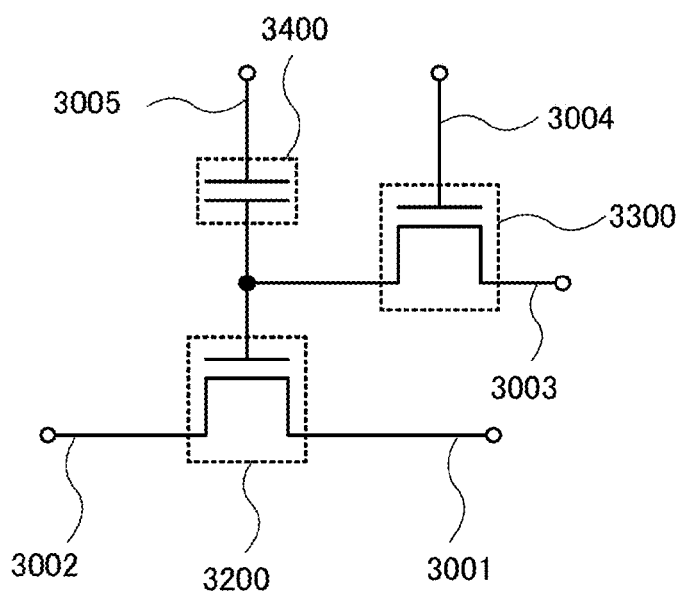

An example of a semiconductor device (memory device) that includes the transistor of one embodiment of the present invention, can retain stored data even when not powered, and has an unlimited number of write cycles is shown in FIG. 22C.

The semiconductor device illustrated in FIG. 22C includes a transistor 3200 using a first semiconductor material, a transistor 3300 in which an oxide semiconductor is used as a semiconductor, and a capacitor 3400. Note that the transistor described in the above embodiment can be used as the transistor 3300.

The transistor 3300 is a transistor in which a channel is formed in a semiconductor including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 22C, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to the gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 22C has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, only data of desired memory cells need to be read. The fifth wiring 3005 in the case where data is not read may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

Figure 22D:
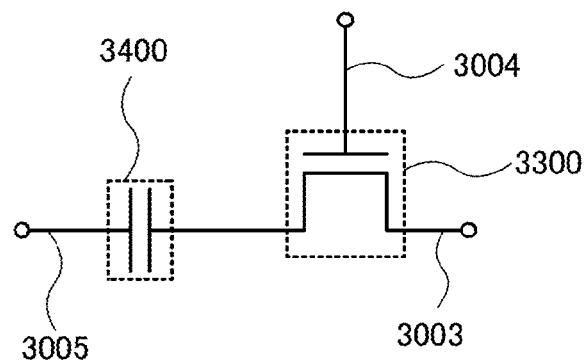

The semiconductor device illustrated in FIG. 22D is mainly different from the semiconductor device illustrated in FIG. 22C in that the transistor 3200 is not provided. Also in this case, writing and retaining operation of data can be performed in a manner similar to that of the semiconductor device illustrated in FIG. 22C.

Next, reading of data is described. When the transistor 3300 is turned on, the third wiring 3003 in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first electrode of the capacitor 3400 (or the charge accumulated in the capacitor 3400.

For example, the potential of the third wiring 3003 after the charge redistribution is $(C_B \times V_{B0} + C \times V)/(C_B + C)$, where V is the potential of the first electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first electrode of the capacitor 3400 is $V_1$ and $V_0$ ($V_1 > V_0$), the potential of the third wiring 3003 in the case of retaining the potential $V_1 (=(C_B \times V_{B0} + C \times V_1)/(C_B + C))$ is higher than the potential of the third wiring 3003 in the case of retaining the potential $V_0 (=(C_B \times V_{B0} + C \times V_0)/(C_B + C))$.

Then, by comparing the potential of the third wiring 3003 with a predetermined potential, data can be read.

In this case, a transistor including the first semiconductor material may be used for a driver circuit for driving a memory cell, and a transistor in which an oxide semiconductor is used as a semiconductor may be stacked over the driver circuit as the transistor 3300.

When including a transistor having a channel formation region formed including an oxide semiconductor and having an extremely small off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

At least part of this embodiment can be implemented in combination with any of the other embodiments described in this specification as appropriate.

Embodiment 7

In this embodiment, an RF device that includes the transistor described in the above embodiment or the memory device described in the above embodiment is described with reference to FIG. 23.

The RF device of this embodiment includes a memory circuit, stores necessary data in the memory circuit, and transmits and receives data to/from the outside by using contactless means, for example, wireless communication. With these features, the RF device can be used for an individual authentication system in which an object or the like is recognized by reading the individual information, for example. Note that the RF device is required to have extremely high reliability in order to be used for this purpose.

A configuration of the RF device is described with reference to FIG. 23. FIG. 23 is a block diagram illustrating a configuration example of an RF device.

Figure 23:
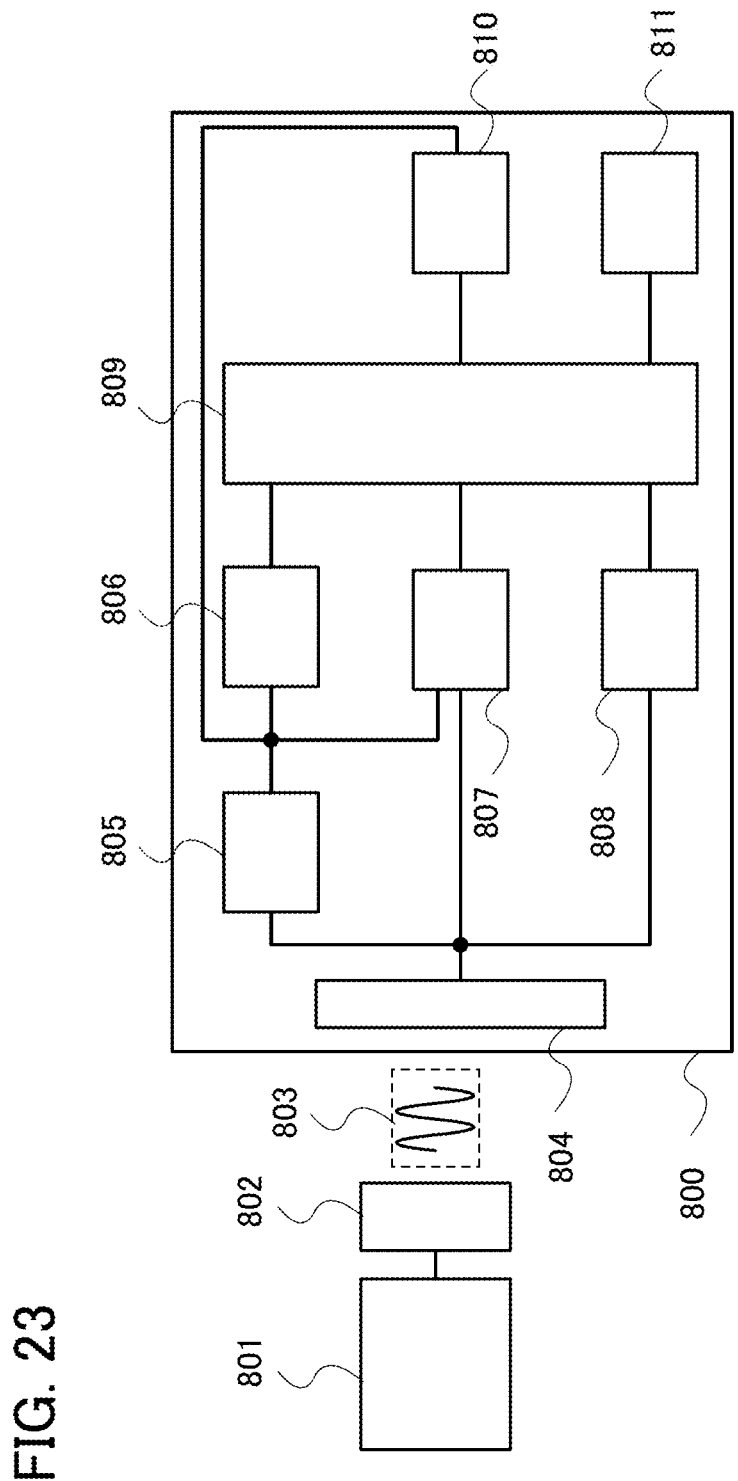
FIG. 23 illustrates a structure example of an RF device of an embodiment.

As shown in FIG. 23, an RF device 800 includes an antenna 804 that receives a radio signal 803 that is transmitted from an antenna 802 connected to a communication device 801 (also referred to as an interrogator, a reader/writer, or the like). The RF device 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF device 800 described in this embodiment.

Next, a configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF device. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF devices, it is possible to put identification numbers only to good products to be shipped. Thus, the identification numbers of the shipped products are in series and customer management corresponding to the shipped products is easily performed.

At least part of this embodiment can be implemented in combination with any of the other embodiments described in this specification as appropriate.

Embodiment 8

In this embodiment, a CPU in which at least the transistor described in any of the above embodiments can be used and the memory device described in the above embodiment is included is described.

Figure 24:
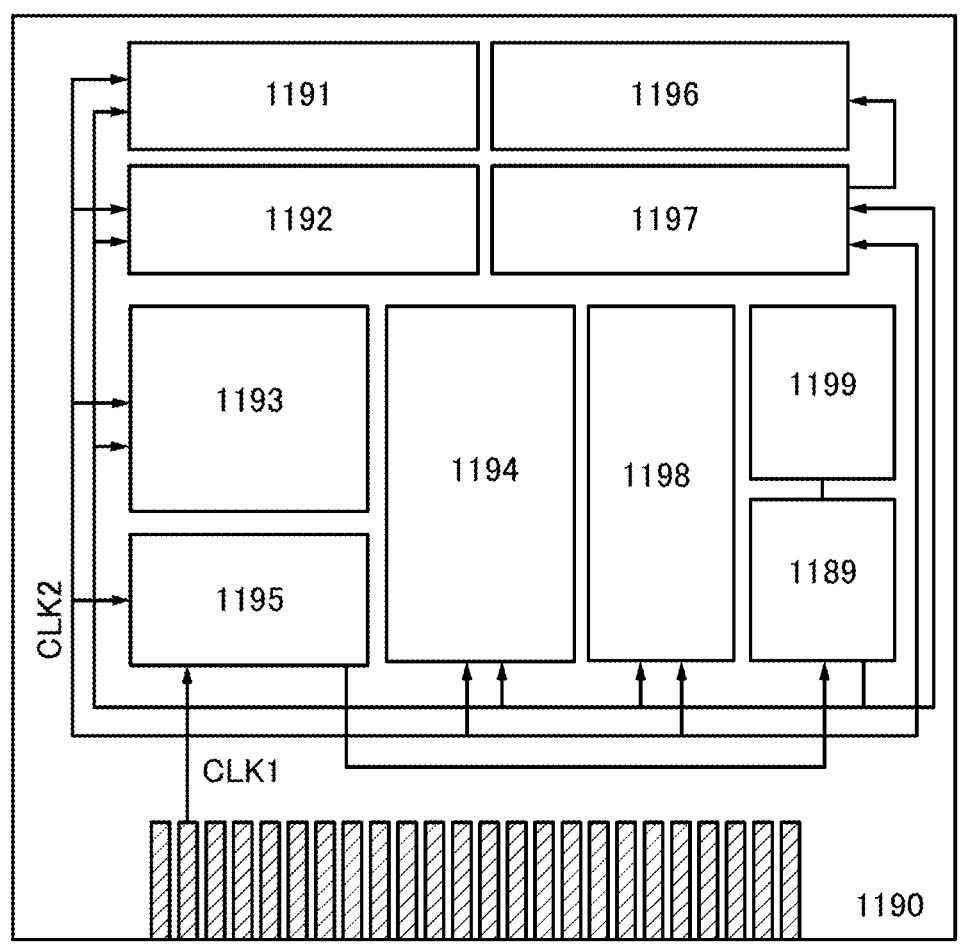
FIG. 24 illustrates a structure example of a CPU of an embodiment.

FIG. 24 is a block diagram illustrating a configuration example of a CPU at least partly including any of the transistors described in the above embodiments as a component.

The CPU illustrated in FIG. 24 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 24 is just an example in which the configuration is simplified, and an actual CPU may have a variety of configurations depending on the application. For example, the CPU may have the following configuration: a structure including the CPU illustrated in FIG. 24 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 24, a memory cell is provided in the register 1196. For the memory cell of the register 1196, any of the transistors described in the above embodiments can be used.

In the CPU illustrated in FIG. 24, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 25:
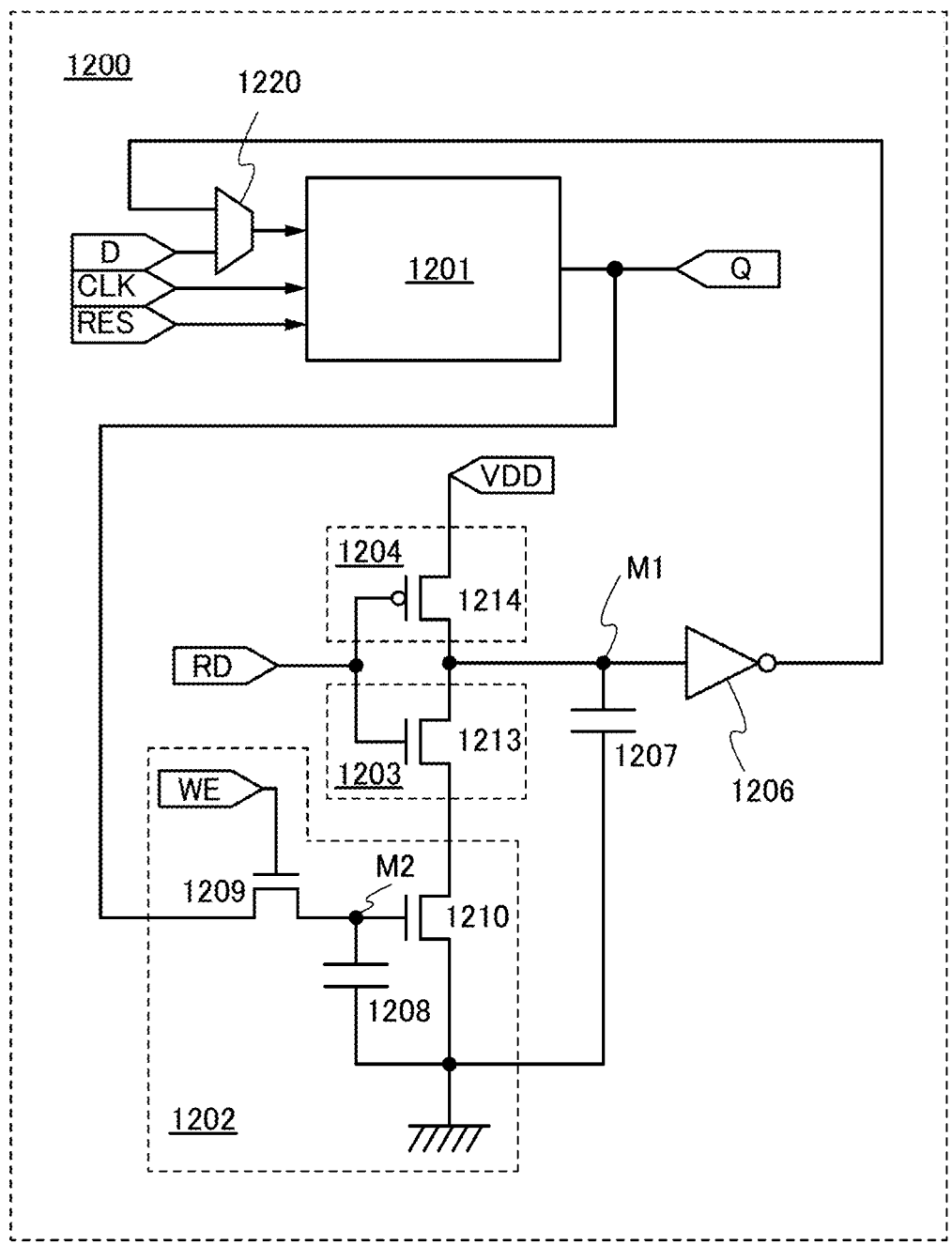
FIG. 25 is a circuit diagram of a memory element of an embodiment.

FIG. 25 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 25 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 25, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 25, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor layer can be used for all the transistors in the memory element 1200. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 25, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor layer is significantly smaller than that of a transistor in which a channel is formed in silicon having crystallinity. Thus, when the transistor is used as the transistor 1209, a signal retained in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

Embodiment 9

In this embodiment, a structure example of a display panel of one embodiment of the present invention is described.

Structure Example

Figure 26A:
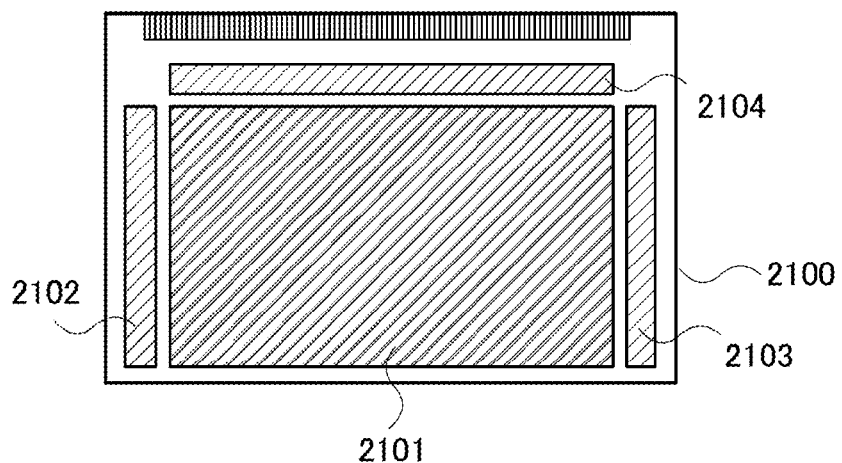
FIGS. 26A to 26C are circuit diagrams of display devices of an embodiment.
Figure 26B:
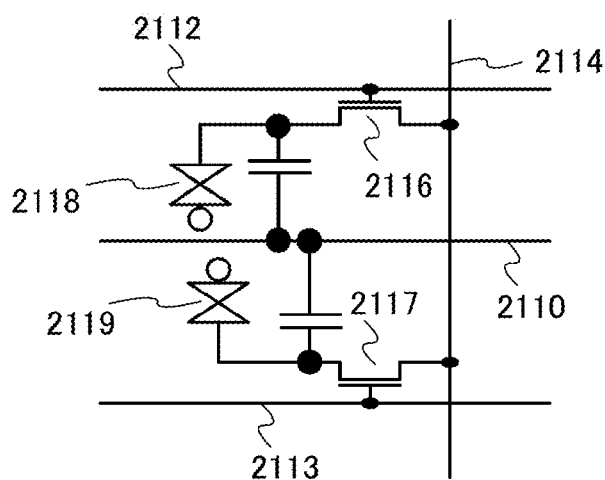
Figure 26C:
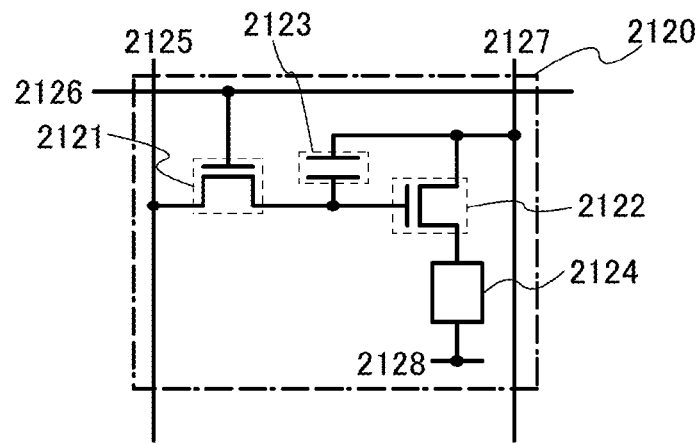

FIG. 26A is a top view of the display panel of one embodiment of the present invention. FIG. 26B is a circuit diagram illustrating a pixel circuit that can be used in the case where a liquid crystal element is used in a pixel in the display panel of one embodiment of the present invention. FIG. 26C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 26A illustrates an example of a block diagram of an active matrix display device. A pixel portion 2101, a first scan line driver circuit 2102, a second scan line driver circuit 2103, and a signal line driver circuit 2104 are formed over a substrate 2100 of the display device. In the pixel portion 2101, a plurality of signal lines extended from the signal line driver circuit 2104 are arranged and a plurality of scan lines extended from the first scan line driver circuit 2102 and the second scan line driver circuit 2103 are arranged. Note that pixels that include display elements are provided in a matrix in respective regions where the scan lines and the signal lines intersect with each other. The substrate 2100 of the display device is connected to a timing control circuit (also referred to as a controller or a controller IC) through a connection portion such as a flexible printed circuit (FPC).

In FIG. 26A, the first scan line driver circuit 2102, the second scan line driver circuit 2103, and the signal line driver circuit 2104 are formed over the substrate 2100 where the pixel portion 2101 is formed. Consequently, the number of components provided outside, such as a driver circuit, can be reduced, so that a reduction in cost can be achieved. Furthermore, if the driver circuit is provided outside the substrate 2100, wirings would need to be extended and the number of wiring connections would increase. When the driver circuit is provided over the substrate 2100, the number of wiring connections can be reduced. Consequently, an improvement in reliability or yield can be achieved.

[Liquid Crystal Panel]

FIG. 26B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 2112 of a transistor 2116 and a gate wiring 2113 of a transistor 2117 are separated so that different gate signals can be supplied thereto. In contrast, a source or drain electrode layer 2114 that functions as a data line is shared by the transistors 2116 and 2117. The transistor described in any of the above embodiments can be used as appropriate as each of the transistors 2116 and 2117. Thus, a highly reliable liquid crystal display panel can be provided.

The shapes of a first pixel electrode layer electrically connected to the transistor 2116 and a second pixel electrode layer electrically connected to the transistor 2117 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 2116 is connected to the gate wiring 2112, and a gate electrode of the transistor 2117 is connected to the gate wiring 2113. When different gate signals are supplied to the gate wiring 2112 and the gate wiring 2113, operation timings of the transistor 2116 and the transistor 2117 can be varied. As a result, alignment of liquid crystals can be controlled.

In addition, a storage capacitor may be formed using a capacitor wiring 2110, a gate insulating film functioning as a dielectric, and a capacitor electrode electrically connected to the first pixel electrode layer or the second pixel electrode layer.

The multi-domain pixel includes a first liquid crystal element 2118 and a second liquid crystal element 2119. The first liquid crystal element 2118 includes the first pixel electrode layer, a counter electrode layer, and a liquid crystal layer therebetween. The second liquid crystal element 2119 includes the second pixel electrode layer, a counter electrode layer, and a liquid crystal layer therebetween.

Note that a pixel circuit of the present invention is not limited to that shown in FIG. 26B. For example, a switch, a resistor, a capacitor, a transistor, a sensor, a logic circuit, or the like may be added to the pixel shown in FIG. 26B.

[Organic EL Panel]

FIG. 26C shows another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. On the basis of such a mechanism, this light-emitting element is referred to as a current-excitation light-emitting element.

FIG. 26C shows an example of a pixel circuit that can be used. In this example, one pixel includes two n-channel transistors. Note that a metal oxide film of one embodiment of the present invention can be used for channel formation regions of the n-channel transistors. Digital time grayscale driving can be employed for the pixel circuit.

The configuration of the applicable pixel circuit and operation of a pixel employing digital time grayscale driving are described.

A pixel 2120 includes a switching transistor 2121, a driver transistor 2122, a light-emitting element 2124, and a capacitor 2123. A gate electrode layer of the switching transistor 2121 is connected to a scan line 2126, a first electrode (one of a source electrode layer and a drain electrode layer) of the switching transistor 2121 is connected to a signal line 2125, and a second electrode (the other of the source electrode layer and the drain electrode layer) of the switching transistor 2121 is connected to a gate electrode layer of the driver transistor 2122. The gate electrode layer of the driver transistor 2122 is connected to a power supply line 2127 through the capacitor 2123, a first electrode of the driver transistor 2122 is connected to the power supply line 2127, and a second electrode of the driver transistor 2122 is connected to a first electrode (a pixel electrode) of the light-emitting element 2124. A second electrode of the light-emitting element 2124 corresponds to a common electrode 2128. The common electrode 2128 is electrically connected to a common potential line provided over the same substrate.

As the switching transistor 2121 and the driver transistor 2122, the transistor described in any of the above embodiments can be used as appropriate. In this manner, a highly reliable organic EL display panel can be provided.

The potential of the second electrode (the common electrode 2128) of the light-emitting element 2124 is set to be a low power supply potential. Note that the low power supply potential is lower than a high power supply potential supplied to the power supply line 2127. For example, the low power supply potential can be GND, 0V, or the like. The high power supply potential and the low power supply potential are set to be higher than or equal to the forward threshold voltage of the light-emitting element 2124, and the difference between the potentials is applied to the light-emitting element 2124, whereby current is supplied to the light-emitting element 2124, leading to light emission. The forward voltage of the light-emitting element 2124 refers to a voltage at which a desired luminance is obtained, and includes at least forward threshold voltage.

Note that gate capacitance of the driver transistor 2122 may be used as a substitute for the capacitor 2123, so that the capacitor 2123 can be omitted. The gate capacitance of the driver transistor 2122 may be formed between the channel formation region and the gate electrode layer.

Next, a signal input to the driver transistor 2122 is described. In the case of a voltage-input voltage driving method, a video signal for sufficiently turning on or off the driver transistor 2122 is input to the driver transistor 2122. In order for the driver transistor 2122 to operate in a linear region, voltage higher than the voltage of the power supply line 2127 is applied to the gate electrode layer of the driver transistor 2122. Note that voltage higher than or equal to voltage that is the sum of power supply line voltage and the threshold voltage $V_{th}$ of the driver transistor 2122 is applied to the signal line 2125.

In the case of performing analog grayscale driving, voltage greater than or equal to voltage that is the sum of the forward voltage of the light-emitting element 2124 and the threshold voltage $V_{th}$ of the driver transistor 2122 is applied to the gate electrode layer of the driver transistor 2122. A video signal by which the driver transistor 2122 is operated in a saturation region is input, so that current is supplied to the light-emitting element 2124. In order for the driver transistor 2122 to operate in a saturation region, the potential of the power supply line 2127 is set higher than the gate potential of the driver transistor 2122. When an analog video signal is used, it is possible to supply current to the light-emitting element 2124 in accordance with the video signal and perform analog grayscale driving.

Note that the configuration of the pixel circuit is not limited to that shown in FIG. 26C. For example, a switch, a resistor, a capacitor, a sensor, a transistor, a logic circuit, or the like may be added to the pixel circuit shown in FIG. 26C.

In the case where the transistor described in the above embodiments is used for the circuit shown in FIGS. 26A to 26C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the other embodiments described in this specification as appropriate.

Embodiment 10

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images. Other examples of electronic appliances that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 27A to 27F illustrate specific examples of these electronic appliances.

Figure 27A:
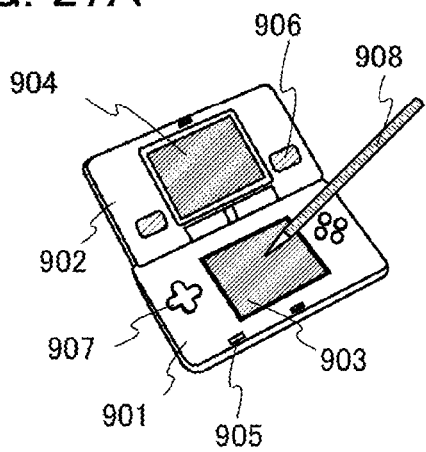
FIGS. 27A to 27F illustrate electronic appliances of an embodiment.

FIG. 27A illustrates a portable game machine, which includes a housing 901, a housing 902, a display portion 903, a display portion 904, a microphone 905, a speaker 906, an operation key 907, a stylus 908, and the like. Although the portable game machine in FIG. 27A has the two display portions 903 and 904, the number of display portions included in a portable game machine is not limited to this.

Figure 27B:
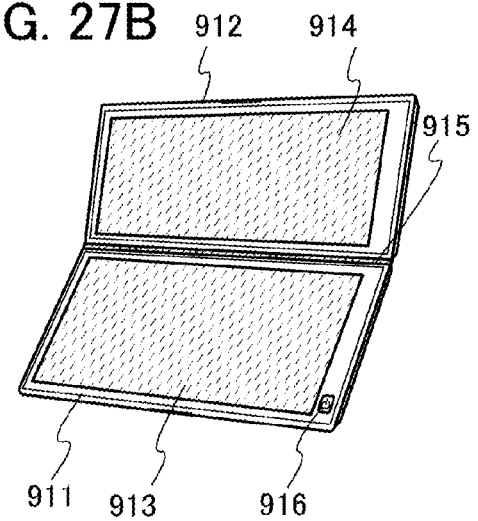

FIG. 27B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 27C:
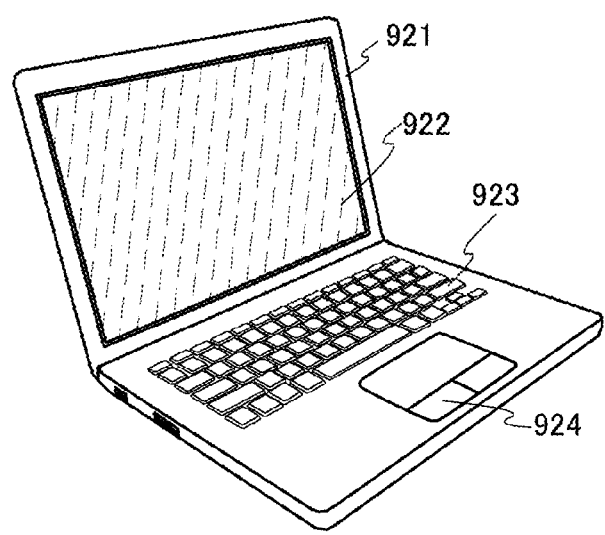

FIG. 27C illustrates a laptop personal computer, which includes a housing 921, a display portion 922, a keyboard 923, a pointing device 924, and the like.

Figure 27D:
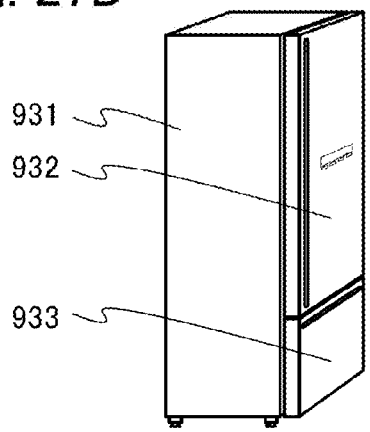

FIG. 27D illustrates an electric refrigerator-freezer, which includes a housing 931, a refrigerator door 932, a freezer door 933, and the like.

Figure 27E:
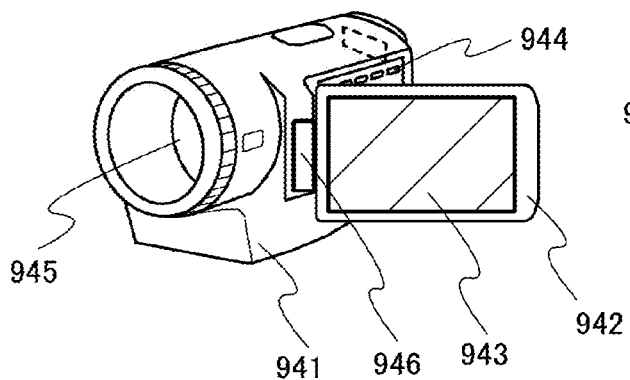

FIG. 27E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 27F:
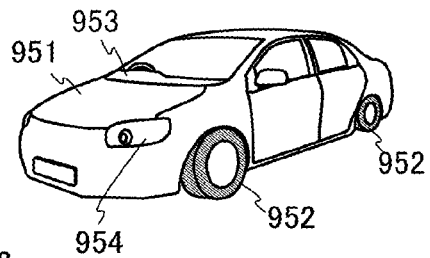
Figure 28A:
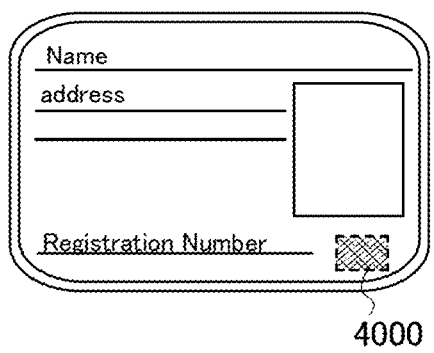
FIGS. 28A to 28F each illustrate an application example of an RF device of an embodiment.
Figure 28B:
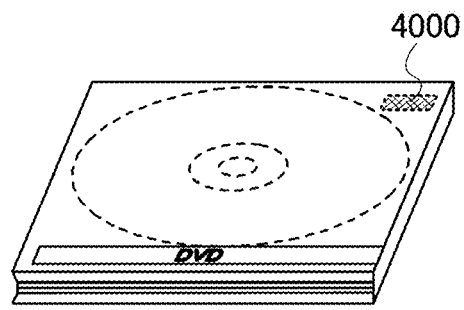
Figure 28C:
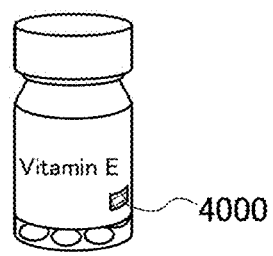
Figure 28D:
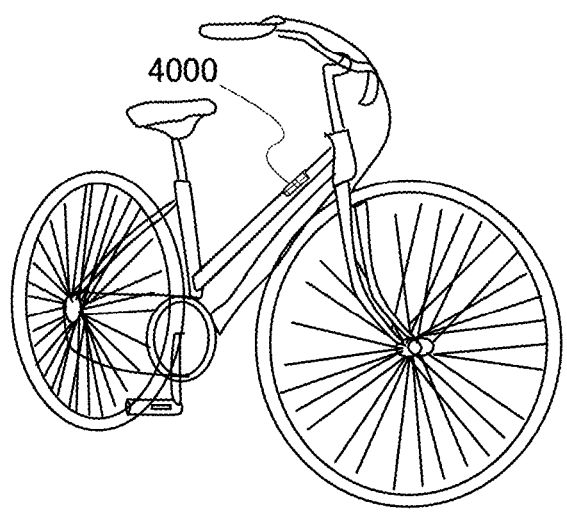
Figure 28E:
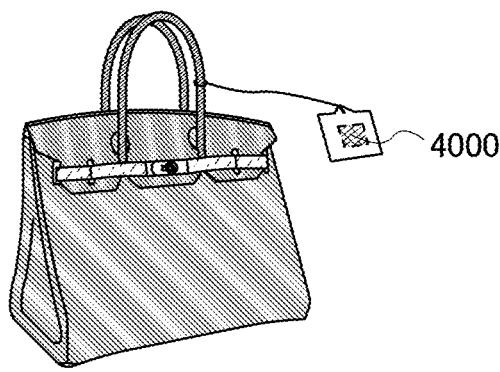
Figure 28F:
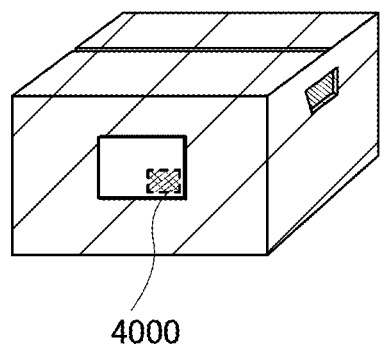

FIG. 27F illustrates a passenger car, which includes a car body 951, wheels 952, a dashboard 953, lights 954, and the like.

At least part of this embodiment can be implemented in combination with any of the other embodiments described in this specification as appropriate.

Embodiment 11

In this embodiment, application examples of an RF device of one embodiment of the present invention are described with reference to FIGS. 28A to 28F. The RF device is widely used and can be provided for, for example, products such as bills, coins, securities, bearer bonds, documents (e.g., driver's licenses or residence cards, see FIG. 28A), packaging containers (e.g., wrapping paper or bottles, see FIG. 28C), recording media (e.g., DVDs or video tapes, see FIG. 28B), vehicles (e.g., bicycles, see FIG. 28D), personal belongings (e.g., bags or glasses), foods, plants, animals, human bodies, clothing, household goods, medical supplies such as medicine and chemicals, and electronic appliances (e.g., liquid crystal display devices, EL display devices, television sets, or cellular phones), or tags on products (see FIGS. 28E and 28F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic appliances, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF device can be preferably used for application in which data is not frequently written or read.

At least part of this embodiment can be implemented in combination with any of the other embodiments described in this specification as appropriate.

Embodiment 12

In this embodiment, an example of a method for forming a stack including a transistor applicable to the stack 10 and an example of the structure of the stack are described with reference to FIGS. 30A to 30C, FIGS. 31A to 31C, FIGS. 32A and 32B, FIGS. 33A and 33B, and FIGS. 34A and 34B. Note that in any of the above drawings, a cross section a1-a2 is a cross section including the transistor, and a cross section b1-b2 illustrates a cross section of a wiring portion.

An insulator 2502 is formed over an insulator 2501. The insulator 2501 may be formed using a material, a deposition method, and the like similar to those of the insulator 101 described in Embodiment 2. The insulator 2502 may be formed using a material and a deposition method similar to those of the insulator 2402 described in Embodiment 2 (FIG. 30A).

Next, an opening or groove is formed in the insulator 2502. To form the opening in the insulator 2502, it is preferable to select a combination of materials with which the etching selectivity of the insulator 2502 with respect to the insulator 2501 is high.

The opening or groove in the insulator 2502 can be formed by a photolithography method or the like. A resist mask is formed over the insulator 2502 and an unnecessary portion of the insulator 2502 is removed. Then, the resist mask is removed; thus, the opening or groove can be formed in the insulator 2502.

As a method such as a photolithography method for processing the film, the method described in Embodiment 2 can be used.

Next, a barrier film 2503 is provided over the insulator 2502 in which the opening or groove is formed. An approximately 50-nm-thick aluminum oxide is preferably used as the barrier film 2503 (FIG. 30B).

The barrier film 2503 has a function of inhibiting diffusion of water, hydrogen, and the like from the layers under the barrier film 2503. Note that the barrier film 2503 may have an opening or a plug for electrically connecting an electrode or a wiring provided over the barrier film 2503 to an electrode or a wiring provided under the barrier film 2503.

The barrier film 2503 can be formed using a material, a deposition method, and the like similar to those of the barrier film 103 described in Embodiment 2.

Next, a conductor 2504 is provided over the barrier film 2503 (FIG. 30C).

The conductor 2504 can be formed using a material, a deposition method, and the like similar to those of the conductor 104 described in Embodiment 2.

Note that the conductor 2504 may be planarized by a CMP method or the like.

At this time, the conductor 2504 may be polished by a CMP method until the level of the top surface of the barrier film 2503 over a region of the insulator 2502 in which the opening or groove is not provided is the same as that of the top surface of the conductor 2504, or polishing may be stopped in the middle of the processing.

Next, the conductor 2504 formed in the opening or groove of the insulator 2502 with the barrier film 2503 positioned therebetween is etched to form a conductor 2504a. Here, it is preferable that the level of the top surface of the conductor 2504a be lower than that of the top surface of the barrier film 2503 over the region of the insulator 2502 in which the opening or groove is not provided, in particular, be lower than it by approximately 50 nm.

Figure 31A:
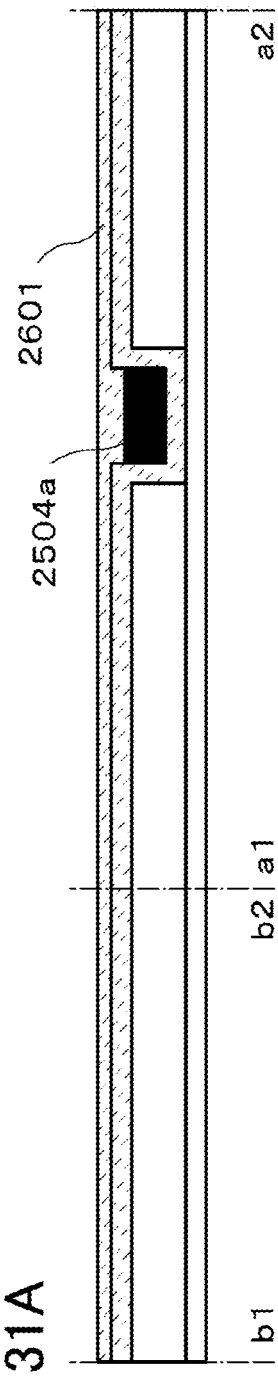
FIGS. 31A to 31C illustrate an example of a method for manufacturing a semiconductor device of an embodiment.

Next, a barrier film 2601 is provided over the barrier film 2503 and the conductor 2504a (FIG. 31A). Note that after the barrier film 2601 is deposited, the surface of the barrier film 2601 may be planarized by a CMP method. Although the example in which the barrier film 2601 is provided is described in this embodiment, the barrier film 2601 is not necessarily provided depending on circumstances.

The barrier film 2601 can be formed using a material, a deposition method, and the like similar to those of the barrier film 103 and the barrier film 105 described in Embodiment 2.

Next, an insulator 2602 having a thickness of approximately 100 nm is provided.

The insulator 2602 can be formed using a material, a deposition method, and the like similar to those of the insulator 106 described in Embodiment 2. Depending on circumstances, the insulator 2602 may be planarized by a CMP method.

Next, a semiconductor 2603 and a semiconductor 2604 are formed.

The semiconductor 2603 can be formed using a material, a deposition method, and the like similar to those of the semiconductor 107 described in Embodiment 2. The semiconductor 2604 can be formed using a material, a deposition method, and the like similar to those of the semiconductor 108 described in Embodiment 2.

Then, a conductor 2605 is provided. As the conductor 2605, an approximately 100-nm-thick tungsten is preferably used. The conductor 2605 can be deposited by a sputtering method.

The conductor 2605 can be formed using a material, a deposition method, and the like similar to those of the conductor 109 described in Embodiment 2.

Figure 31B:
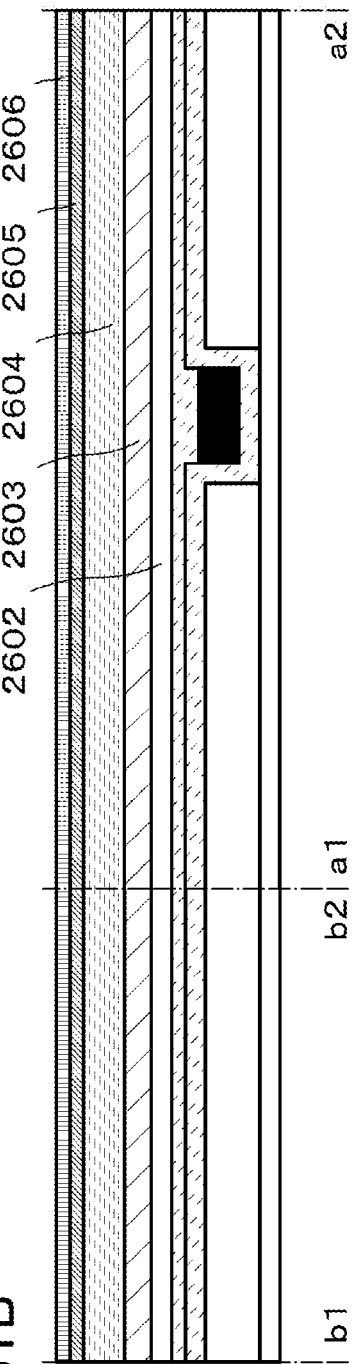

Next, an insulator 2606 is formed over the conductor 2605. The insulator 2606 can be formed with a single layer or stacked layers using, for example, silicon oxide, silicon oxynitride, silicon nitride oxide, silicon nitride, aluminum oxide, aluminum oxynitride, aluminum nitride oxide, or aluminum nitride (FIG. 31B).

Figure 31C:
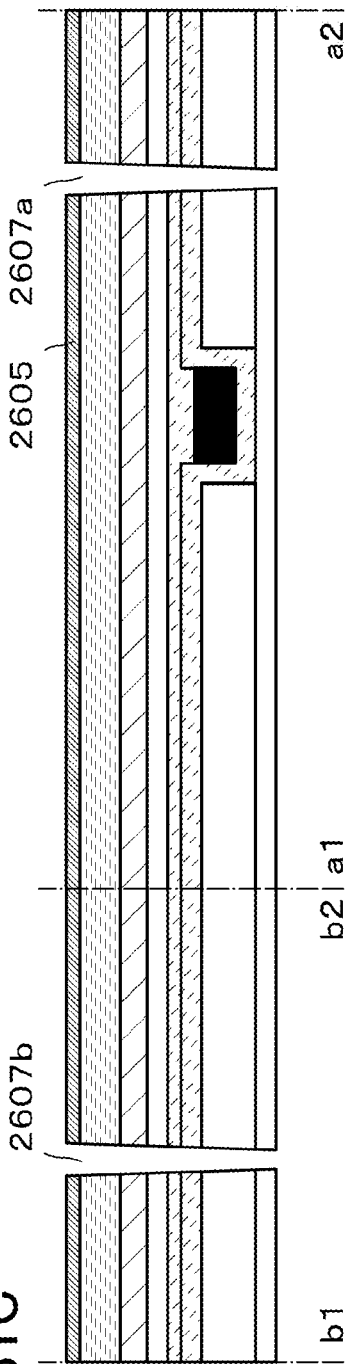

Then, openings are formed in the insulator 2606, the conductor 2605, the semiconductor 2604, the semiconductor 2603, the insulator 2602, the barrier film 2601, the barrier film 2503, the insulator 2502, the insulator 2501, and the like. A photolithography method can be used for forming the openings. A resist mask is formed over the insulator 2606, and an unnecessary portion of each of the insulator 2606 and the conductor 2605 is removed. After that, the resist mask and the like are removed, and openings are formed in the semiconductor 2604, the semiconductor 2603, the insulator 2602, the barrier film 2601, the barrier film 2503, the insulator 2502, the insulator 2501, and the like using the conductor 2605 as a mask. In this manner, openings 2607*a* and 2607*b* are formed (FIG. 31C).

When the insulator 2606 is provided over the conductor 2605, the conductor 2605 can be inhibited from being etched at the time of etching of the barrier films 2601 and 2503, the insulators 2502 and 2501, and the like, which prevents widening of the openings formed in the conductor 2605.

Alternatively, the openings 2607*a* and 2607*b* may be formed in the following manner: the insulator 2606 is not formed, the resist mask is formed over the conductor 2605, and then the openings 2607*a* and 2607*b* are formed.

Alternatively, an anti-reflective film or an adhesion-improving film may be formed over the insulator 2606, a resist mask may be formed thereover, and then the openings 2607*a* and 2607*b* may be formed. Alternatively, an anti-reflective film or an adhesion-improving film may be formed over the conductor 2605, a resist mask may be formed thereover, and then the openings 2607*a* and 2607*b* may be formed.

The anti-reflective film has a function of inhibiting light used for light exposure of the resist mask from being reflected by the conductor 2605. Inhibiting the light reflection can improve processing accuracy of the resist mask, which enables further minute processing.

The adhesion-improving film improves adhesion between the conductor 2605 and the resist mask or between the insulator 2606 and the resist mask, which enables further minute processing.

Next, a conductor 2701 is formed in the openings 2607*a* and 2607*b* and over the conductor 2605 (FIG. 32A).

The conductor 2701 can be formed using a material, a deposition method, and the like similar to those of the conductor 111 and the conductor 112 described in Embodiment 2.

Then, the conductor 2701 may be planarized by a CMP method or the like. Alternatively, the surface of the conductor 2701 may be etched by wet etching or the like.

Next, a resist mask is formed over the conductor 2701. An unnecessary portion of the conductor 2701 is removed, whereby conductors 2701*a*, 2701*b*, and 2701*c* are formed. After that, the resist mask is removed (FIG. 32B).

Figure 33A:
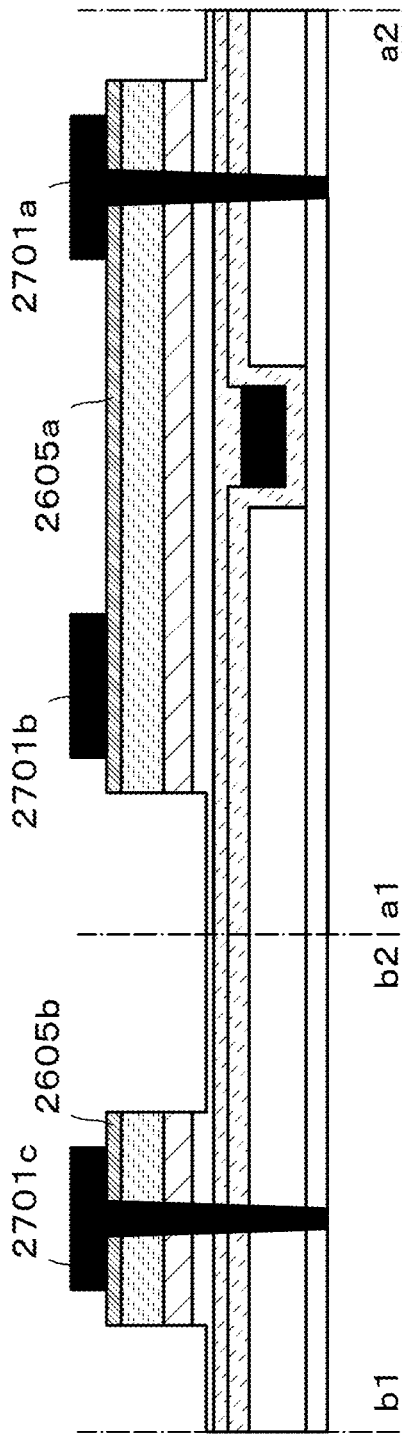
FIGS. 33A and 33B illustrate an example of a method for manufacturing a semiconductor device of an embodiment.

Next, a resist mask is formed over the conductors 2605, 2701*a*, 2701*b*, and 2701*c*. An unnecessary portion of each of the conductor 2605, the semiconductor 2604, and the semiconductor 2603 is removed, whereby conductors 2605*a* and 2605*b* are obtained. At this time, part of the insulator 2602 might be removed. Therefore, it is preferable to form the insulator 2602 thick in advance in consideration of the depth of a portion to be etched (FIG. 33A).

Figure 33B:
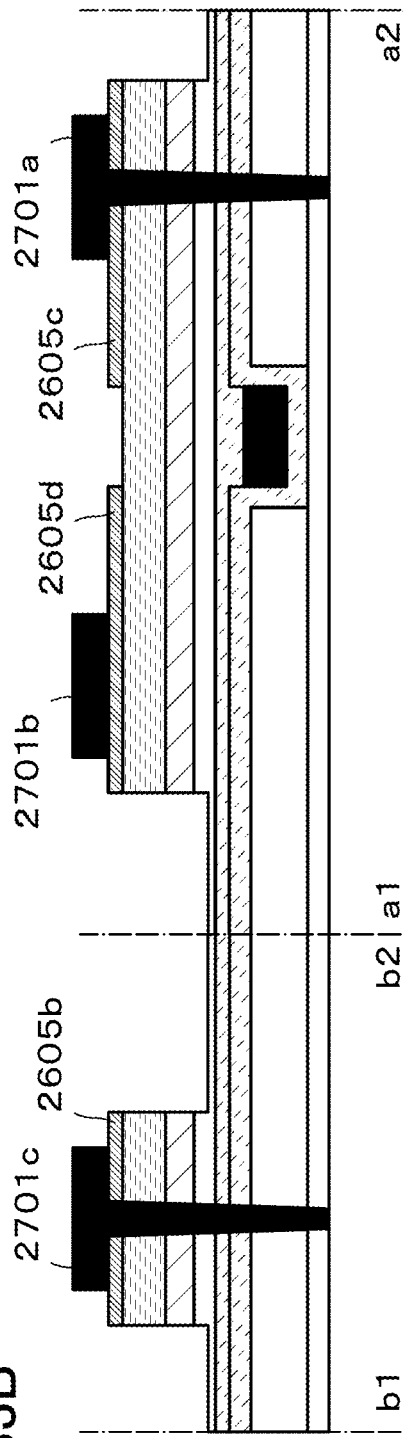

Next, a resist mask is formed over the conductor 2605*a*, and an unnecessary portion of the conductor 2605*a* is removed to obtain conductors 2605*c* and 2605*d* (FIG. 33B).

Next, a semiconductor, an insulator, and a conductor are deposited in this order. After that, a resist mask is formed over the conductor, and an unnecessary portion of the conductor is removed. Then, the resist mask is removed to obtain a conductor 2903*a*. Subsequently, an unnecessary portion of each of the insulator and the semiconductor is removed to obtain an insulator 2902*a* and a semiconductor 2901*a*. The insulator 2902*a* and the semiconductor 2901*a* may be obtained in such a manner that the resist mask used for obtaining the conductor 2903*a* is left and an unnecessary portion of each of the insulator and the semiconductor is removed (FIG. 34A).

Although the example in which the insulator 2902*a* and the semiconductor 2901*a* are obtained by removal of unnecessary portions of a semiconductor and an insulator is described in this embodiment, the unnecessary portions are not necessarily removed.

The semiconductor 2901*a* can be formed using a material and a deposition method similar to those of the semiconductor 113 described in Embodiment 2. Note that the semiconductor 2901*a* may function as part of the gate insulating film.

Next, a barrier film 2904 is provided. The barrier film 2904 can be formed using a material and a deposition method similar to those of the barrier film 103 described in Embodiment 2 (FIG. 34B).

In this manner, part of the stack 10 including a transistor is formed.

Note that part or the whole of this embodiment can be freely combined with, applied to, or replaced with part or the whole of another embodiment.

Embodiment 13

Figure 35:
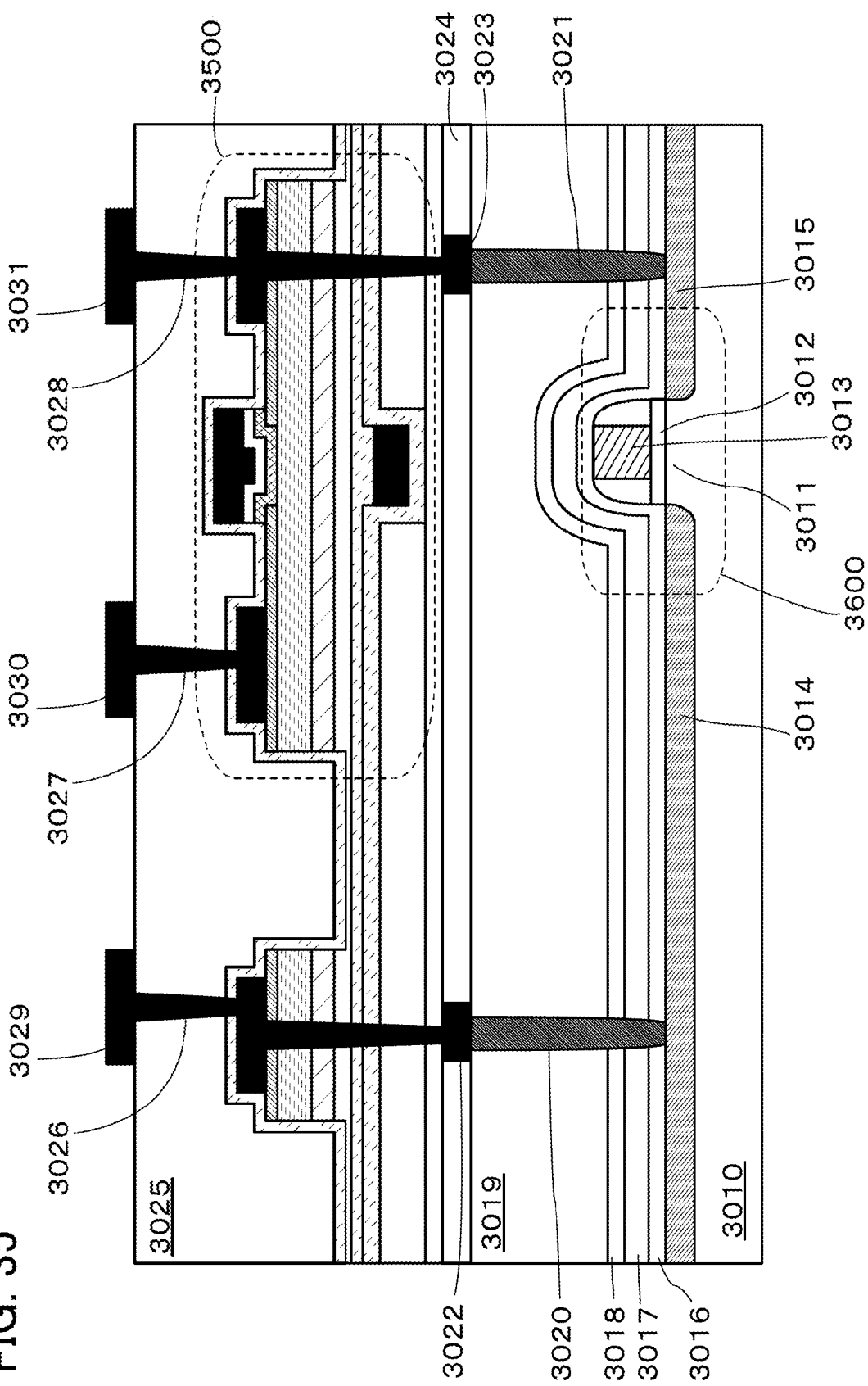
FIG. 35 illustrates a structure example of a semiconductor device of an embodiment.

FIG. 35 illustrates an example of a semiconductor device of one embodiment of the present invention. In this embodiment, one mode of the stacked-layer structure illustrated in FIG. 2 is described. An example in which a single crystal silicon semiconductor is used as the stack 20 and the stack 10 is stacked over the stack 20 is described in this embodiment.

The semiconductor device includes a transistor 3600 and a transistor 3500. The transistor 3500 is provided over the transistor 3600, and a barrier film is provided between a semiconductor film of the transistor 3500 and the transistor 3600.

The transistor 3600 includes a semiconductor 3011 formed of part of a semiconductor substrate 3010, an insulator 3012, a conductor 3013, a low-resistance region 3014, and a low-resistance region 3015. The insulator 3012 includes a region functioning as a gate insulating film of the transistor. The low-resistance region 3014 and the low-resistance region 3015 include regions functioning as a source region and a drain region.

The transistor 3600 may be either a p-channel transistor or an n-channel transistor, and an appropriate transistor may be used depending on the circuit configuration or the driving method.

A region of the semiconductor 3011 where a channel is formed or the vicinity of the region, the low-resistance region 3014, the low-resistance region 3015, and the like can be formed using materials and formation methods similar to those of the semiconductor 712, the low-resistance region 713a, and the low-resistance region 713b described in Embodiment 4.

Here, a structure including the transistor 3600 corresponds to the stack 20 in FIG. 2.

Here, the transistor 180 illustrated in FIG. 8 may be used instead of the transistor 3600.

An insulator 3016, an insulator 3017, an insulator 3018, and an insulator 3019 are stacked in this order to cover the conductor 3013. The insulator 3016 can be formed using a material and a formation method similar to those of the insulator 721 described in Embodiment 4. The insulator 3017 can be formed using a material and a formation method similar to those of the insulator 722 described in Embodiment 4. The insulator 3018 can be formed using a material and a formation method similar to those of the insulator 723 described in Embodiment 4. The insulator 3019 can be formed using a material and a formation method similar to those of the insulator 724 described in Embodiment 4.

A plug 3020, a plug 3021, and the like that are electrically connected to the low-resistance region 3014, the low-resistance region 3015, or the like may be embedded in the insulator 3016, the insulator 3017, the insulator 3018, and the insulator 3019. A plug electrically connected to the conductor 3013 may be formed as needed.

A wiring 3022, a wiring 3023, and the like are provided over the insulator 3019.

The wiring 3022 is electrically connected to the plug 3020. The wiring 3023 is electrically connected to the plug 3021.

A material and a formation method similar to those of the wiring 731, the wiring 732, and the wiring 733 described in Embodiment 4 can be used for the wiring 3022 and the wiring 3023.

An insulator 3024 is provided over the wiring 3022 and the wiring 3023.

The wiring 3022, the wiring 3023, and the like may be formed in the following manner: the insulator 3024 is formed over the insulator 3019, openings or grooves are formed in the insulator 3024, a conductor is deposited and subjected to CMP treatment or the like, and the conductor left in the openings or grooves formed in the insulator 3024 is used as the wiring 3022 and the wiring 3023.

A dual damascene method or the like may be used for forming the plug 3020, the plug 3021, the wiring 3022, the wiring 3023, or the like.

The stack 10 is formed over the stack 20. The stack 10 includes the transistor 3500. A structure of FIG. 34B or the like can be used as an example of part or all of the stack 10.

In this embodiment, the stack illustrated in FIG. 34B is applied to part of the stack 10. An insulator 3025 is provided over the barrier film 2904.

A plug 3026, a plug 3027, and a plug 3028 that are electrically connected to the conductors 2701a, 2701b, and 2701c are provided in the barrier film 2904 and the insulator 3025.

A wiring 3029, a wiring 3030, and a wiring 3031 that are electrically connected to the plug 3026, the plug 3027, and the plug 3028 are provided over the insulator 3025.

Since the stack including the transistor 3500 is provided over the stack including the transistor 3600, the area of the semiconductor device of one embodiment of the present invention can be small. Furthermore, the integration degree of semiconductor elements such as transistors can be improved. Furthermore, the barrier film provided between the transistor 3600 and the transistor 3500 can suppress diffusion of impurities such as water and hydrogen from an underlying layer to the transistor 3500 side.

When the transistor 3600 is a p-channel transistor and the transistor 3500 is an n-channel transistor in this embodiment, a CMOS inverter circuit can be obtained. A structure in which transistors that form a unit circuit are stacked can increase the degree of freedom of the layout and the integration degree.

Note that part or the whole of this embodiment can be freely combined with, applied to, or replaced with part or the whole of another embodiment.

Embodiment 14

Figure 36:
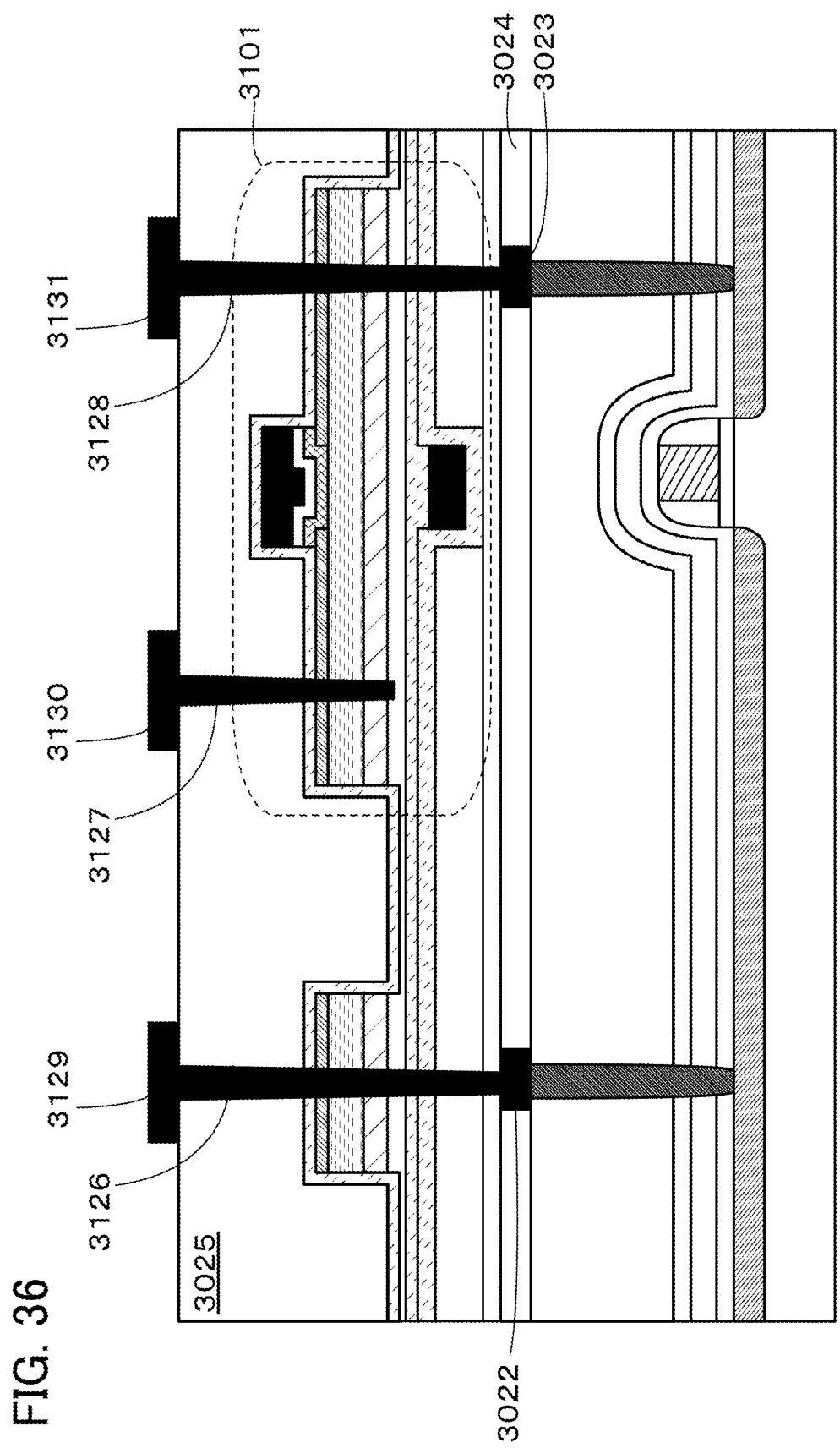
FIG. 36 illustrates a structure example of a semiconductor device of an embodiment.

FIG. 36 illustrates an example of a semiconductor device of one embodiment of the present invention. In this embodiment, one mode of the stacked-layer structure illustrated in FIG. 2 is described. An example in which a single crystal silicon semiconductor is used as part of the stack 20 and the stack 10 is stacked over the stack 20 is described in this embodiment.

A stack similar to the stack 20 described in Embodiment 13 can be used as the stack 20.

The stack 10 is formed over the stack 20. The stack 10 includes a transistor 3101.

In this embodiment, an example in which the stack of FIG. 34B which is partly changed is used as part of the stack 10 is described. Specifically, a structure without the conductors 2701a, 2701b, and 2701c in FIG. 34B is used.

The insulator 3025 is provided over the barrier film 2904. A plug 3126 electrically connected to the wiring 3022 and a plug 3128 electrically connected to the wiring 3023 are formed in the barrier film 2904 and the insulator 3025. Furthermore, a plug 3127 electrically connected to the conductor 2605d is formed.

A wiring 3129, a wiring 3130, and a wiring 3131 that are electrically connected to the plug 3126, the plug 3127, and the plug 3128 are provided over the insulator 3025.

Since the stack including the transistor 3101 is provided over the stack including the transistor 3600, the area of the semiconductor device of one embodiment of the present invention can be small. Furthermore, the integration degree of semiconductor elements such as transistors can be improved. Furthermore, the barrier film provided between the transistor 3600 and the transistor 3101 can suppress diffusion of impurities such as water and hydrogen from an underlying layer to the transistor 3101 side.

When the transistor 3600 is a p-channel transistor and the transistor 3101 is an n-channel transistor in this embodiment, a CMOS inverter circuit can be obtained. A structure in which transistors that form a unit circuit are stacked can increase the degree of freedom of the layout and the integration degree.

Note that part or the whole of this embodiment can be freely combined with, applied to, or replaced with part or the whole of another embodiment.

Embodiment 15

Figure 37:
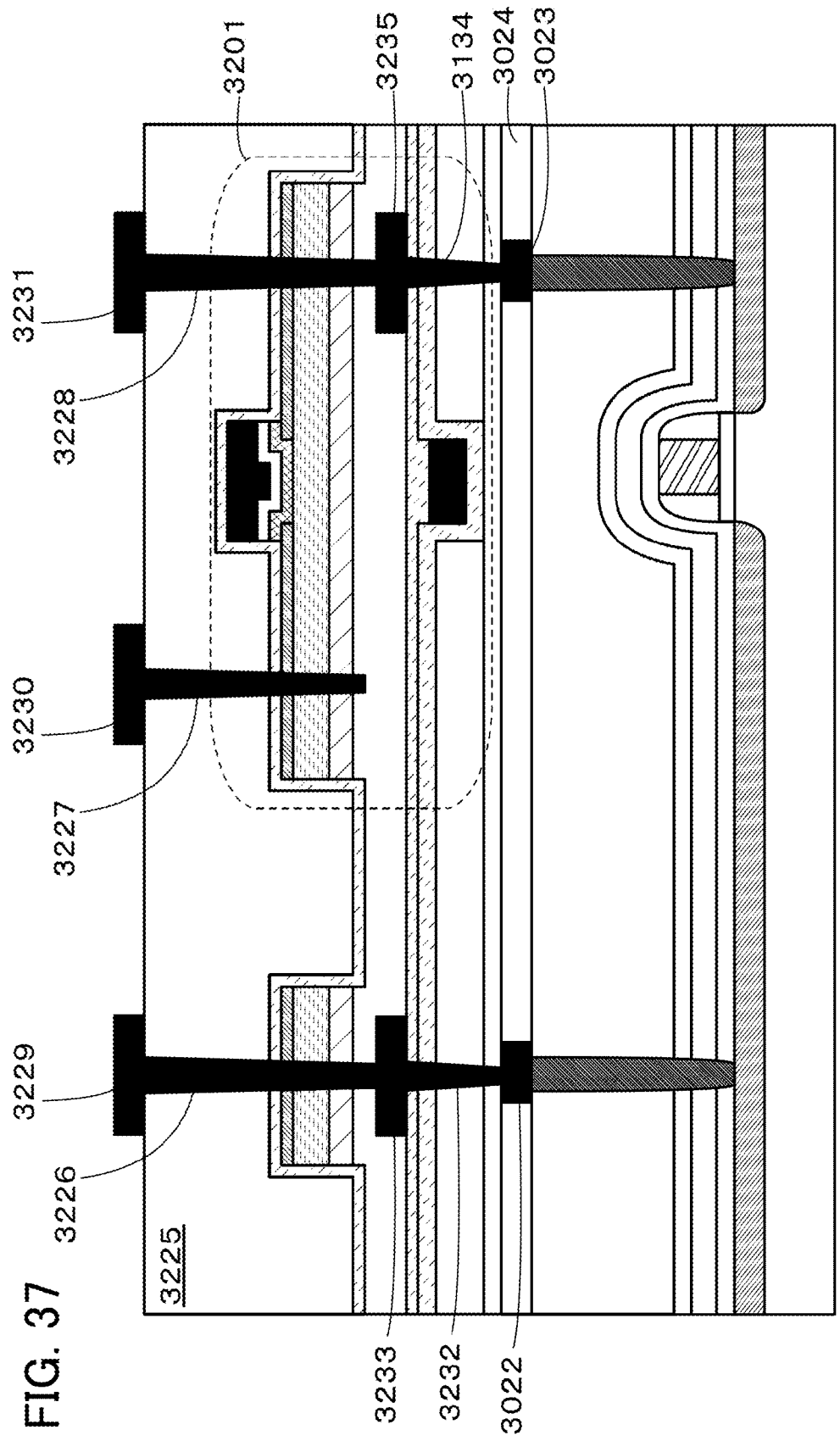
FIG. 37 illustrates a structure example of a semiconductor device of an embodiment.

FIG. 37 illustrates an example of a semiconductor device of one embodiment of the present invention. In this embodiment, one mode of the stacked-layer structure illustrated in FIG. 2 is described. An example in which a single crystal silicon semiconductor is used as the stack 20 and the stack 10 is stacked over the stack 20 is described in this embodiment.

A stack similar to the stack 20 described in Embodiment 13 can be used as the stack 20.

The stack 10 is formed over the stack 20. The stack 10 includes a transistor 3201.

In this embodiment, an example in which the stack of FIG. 34B which is partly changed is used as part of the stack 10 is described. Specifically, a structure formed in the following manner is used: the barrier film 2601 is formed; and a plug 3232 and a wiring 3233 which are electrically connected to the wiring 3022, and a plug 3134 and a wiring 3235 which are electrically connected to the wiring 3023 are formed, but the conductors 2701a, 2701b, and 2701c in FIG. 34B are not formed.

An insulator 3225 is provided over the barrier film 2904. A plug 3226 electrically connected to the wiring 3233 and a plug 3228 electrically connected to the wiring 3235 are formed in the barrier film 2904 and the insulator 3225. Furthermore, a plug 3227 electrically connected to the conductor 2605d is formed.

A wiring 3229, a wiring 3230, and a wiring 3231 that are electrically connected to the plug 3226, the plug 3227, and the plug 3228 are provided over the insulator 3225.

Since the stack including the transistor 3201 is provided over the stack including the transistor 3600, the area of the semiconductor device of one embodiment of the present invention can be small. Furthermore, the integration degree of semiconductor elements such as transistors can be improved. Furthermore, the barrier film provided between the transistor 3600 and the transistor 3201 can suppress diffusion of impurities such as water and hydrogen from an underlying layer to the transistor 3201 side.

When the transistor 3600 is a p-channel transistor and the transistor 3201 is an n-channel transistor in this embodiment, a CMOS inverter circuit can be obtained. A structure in which transistors that form a unit circuit are stacked can increase the degree of freedom of the layout and the integration degree.

Note that part or the whole of this embodiment can be freely combined with, applied to, or replaced with part or the whole of another embodiment.

EXPLANATION OF REFERENCE

10: stack, 20: stack, 30: stack, 100: transistor, 101: insulator, 102: insulator, 103: barrier film, 104: conductor, 104a: conductor, 105: barrier film, 105a: barrier film, 106: insulator, 107: semiconductor, 107a: semiconductor, 108: semiconductor, 108a: semiconductor, 109: conductor, 109a: conductor, 109b: conductor, 109c: conductor, 110: opening, 111: conductor, 111a: conductor, 111b: conductor, 111c: conductor, 112: conductor, 112a: conductor, 112b: conductor, 113: semiconductor, 114: insulator, 115: conductor, 116: barrier film, 120a: plug, 120b: plug, 130: capacitor, 180: transistor, 200: transistor, 708: insulator, 711: semiconductor substrate, 712: semiconductor, 713a: low-resistance region, 713b: low-resistance region, 714: gate insulating film, 715: gate electrode, 721: insulator, 722: insulator, 723: insulator, 724: insulator, 725: insulator, 726: insulator, 727: insulator, 728: insulator, 729: insulator, 730: insulator, 731: wiring, 732: wiring, 733: wiring, 741: insulator, 742: insulator, 743: insulator, 744: insulator, 751: wiring, 752: wiring, 753: wiring, 754: wiring, 755: wiring, 756: wiring, 757: wiring, 758: wiring, 759: wiring, 761: plug, 762: plug, 763: plug, 764: plug, 765: plug, 766: plug, 767: plug, 768: plug, 769: plug, 770: plug, 771: plug, 772: plug, 773: plug, 781: electrode, 782: insulator, 783: electrode, 800: RF device, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 812: semiconductor, 814: gate insulating film, 815: gate electrode, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for a refrigerator, 933: door for a freezer, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 1700: transistor, 1701: transistor, 2100: substrate, 2101: pixel portion, 2102: scan line driver circuit, 2103: scan line driver circuit, 2104: signal line driver circuit, 2110: capacitor wiring, 2112: gate wiring, 2113: gate wiring, 2114: drain electrode layer, 2116: transistor, 2117: transistor, 2118: liquid crystal element, 2119: liquid crystal element, 2120: pixel, 2121: switching transistor, 2122: driver transistor, 2123: capacitor, 2124: light-emitting element, 2125: signal line, 2126: scan line, 2127: power supply line, 2128: common electrode, 2402: insulator, 2501: insulator, 2502: insulator, 2503: barrier film, 2504: conductor, 2504a: conductor, 2601: barrier film, 2602: insulator, 2603: semiconductor, 2604: semiconductor, 2605: conductor, 2605a: conductor, 2605b: conductor, 2605c: conductor, 2605d: conductor, 2606: insulator, 2607a: opening, 2607b: opening, 2701: conductor, 2701a: conductor, 2701b: conductor, 2701c: conductor, 2901a: semiconductor, 2902a: insulator, 2903a: conductor, 2904: barrier film, 3001: wiring, 3002: wiring, 3003: wiring, 3004: wiring, 3005: wiring, 3010: semiconductor substrate, 3011: semiconductor, 3012: insulator, 3013: conductor, 3014: low-resistance region, 3015: low-resistance region, 3016: insulator, 3017: insulator, 3018: insulator, 3019: insulator, 3020: plug, 3021: plug, 3022: wiring, 3023: wiring, 3024: insulator, 3025: insulator, 3026: plug, 3027: plug, 3028: plug, 3029: wiring, 3030: wiring, 3031: wiring, 3101: transistor, 3126: plug, 3127: plug, 3128: plug, 3129: wiring, 3130: wiring, 3131: wiring, 3134: plug, 3200: transistor, 3201: transistor, 3225: insulator, 3226: plug, 3227: plug, 3228: plug, 3229: wiring, 3230: wiring, 3231: wiring, 3232: plug, 3233: wiring, 3235: wiring, 3300: transistor, 3400: capacitor, 3500: transistor, 3600: transistor, 4000: RF device, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region.

This application is based on Japanese Patent Application serial no. 2013-269701 filed with Japan Patent Office on Dec. 26, 2013, the entire contents of which are hereby incorporated by reference.

The invention claimed is:

1. A semiconductor device comprising:
a first transistor;
a barrier film over the first transistor; and
a second transistor comprising:
   a first electrode in contact with the barrier film;
   an oxide semiconductor layer over the first electrode;
   a source electrode or a drain electrode connected to the oxide semiconductor layer; and
   a second electrode over the first electrode,
wherein the source electrode or the drain electrode is electrically connected to a gate electrode of the first transistor,
wherein the source electrode or the drain electrode is in an opening which penetrates the oxide semiconductor layer, and
wherein the first electrode is surrounded by the barrier film.

2. The semiconductor device according to claim 1, wherein the opening penetrates the barrier film.

3. The semiconductor device according to claim 1, wherein the barrier film comprises a first film in contact with side surfaces and a bottom surface of the first electrode and a second film in contact with a top surface of the first electrode.

4. The semiconductor device according to claim 1, wherein the barrier film comprises aluminum oxide.

5. The semiconductor device according to claim 1, further comprising an insulating layer containing excess oxygen between the barrier film and the oxide semiconductor layer.

6. The semiconductor device according to claim 1, wherein the first transistor comprises a silicon semiconductor.

7. A semiconductor device comprising:
a first transistor;
a first barrier film over the first transistor;
a second transistor comprising:
   a first electrode in contact with the first barrier film;
   an oxide semiconductor layer over the first electrode;
   a source electrode or a drain electrode connected to the oxide semiconductor layer; and
   a second electrode over the first electrode; and
a second barrier film over and in contact with the second electrode and the oxide semiconductor layer,
wherein the source electrode or the drain electrode is electrically connected to a gate electrode of the first transistor,
wherein the source electrode or the drain electrode is in an opening which penetrates the oxide semiconductor layer, and
wherein the first electrode is surrounded by the first barrier film.

8. The semiconductor device according to claim 7, wherein the opening penetrates the first barrier film.

9. The semiconductor device according to claim 7, wherein the first barrier film comprises a first film in contact with side surfaces and a bottom surface of the first electrode and a second film in contact with a top surface of the first electrode.

10. The semiconductor device according to claim 7, wherein the first barrier film and the second barrier film comprise aluminum oxide.

11. The semiconductor device according to claim 7, further comprising an insulating layer containing excess oxygen between the first barrier film and the oxide semiconductor layer.

12. The semiconductor device according to claim 7, wherein the first transistor comprises a silicon semiconductor.

13. A semiconductor device comprising:
a first transistor;
a first barrier film over the first transistor;
a second transistor comprising:
   a first electrode in contact with the first barrier film;
   an oxide semiconductor layer over the first electrode;
   a source electrode or a drain electrode connected to the oxide semiconductor layer; and
   a second electrode over the first electrode;
a second barrier film over and in contact with the second electrode and the oxide semiconductor layer; and
a capacitor over the second barrier film,
wherein the source electrode or the drain electrode is electrically connected to a gate electrode of the first transistor,
wherein the source electrode or the drain electrode is in an opening which penetrates the oxide semiconductor layer, and
wherein the first electrode is surrounded by the first barrier film.

14. The semiconductor device according to claim 13, wherein the opening penetrates the first barrier film.

15. The semiconductor device according to claim 13, wherein the first barrier film comprises a first film in contact with side surfaces and a bottom surface of the first electrode and a second film in contact with a top surface of the first electrode.

16. The semiconductor device according to claim 13, wherein the first barrier film and the second barrier film comprise aluminum oxide.

17. The semiconductor device according to claim 13, further comprising an insulating layer containing excess oxygen between the first barrier film and the oxide semiconductor layer.

18. The semiconductor device according to claim 13, wherein the first transistor comprises a silicon semiconductor.

* * * * *